United States Patent
Holm et al.

(10) Patent No.: US 6,965,128 B2
(45) Date of Patent: Nov. 15, 2005

(54) STRUCTURE AND METHOD FOR FABRICATING SEMICONDUCTOR MICRORESONATOR DEVICES

(75) Inventors: Paige M. Holm, Phoenix, AZ (US); Barbara Foley Barenburg, Gilbert, AZ (US); Joyce K. Yamamoto, Chandler, AZ (US); Fred V. Richard, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 205 days.

(21) Appl. No.: 10/356,549

(22) Filed: Feb. 3, 2003

(65) Prior Publication Data

US 2004/0150043 A1 Aug. 5, 2004

(51) Int. Cl.⁷ ............................................. H01L 33/00
(52) U.S. Cl. ...................... 257/103; 257/184; 257/189; 385/4; 385/11; 385/15
(58) Field of Search ................................. 257/103, 184, 257/189; 385/4, 11, 15

(56) References Cited

U.S. PATENT DOCUMENTS

| | | |
|---|---|---|
| 3,617,951 A | 11/1971 | Anderson |
| 3,670,213 A | 6/1972 | Nakawaga et al. |
| 3,758,199 A | 9/1973 | Thaxter |
| 3,766,370 A | 10/1973 | Walther |
| 3,802,967 A | 4/1974 | Ladany et al. |
| 3,818,451 A | 6/1974 | Coleman |

(Continued)

FOREIGN PATENT DOCUMENTS

| | | |
|---|---|---|
| DE | 196 07 107 | 8/1997 |
| DE | 197 12 496 | 10/1997 |
| DE | 198 29 609 | 1/2000 |
| DE | 100 17 137 | 10/2000 |
| EP | 0 247 722 | 12/1987 |

(Continued)

OTHER PUBLICATIONS

Yi W. et al; "Mechanism of cleaning Si (100) surface using Sr and SrO for the growth of crystalline SrTiO/sub 2/films" Journal of Vacuum Science & Technology, vol. 20, No. 4, Jul. 2002, (Jul. 2002) pp. 1402–1405.

Xiaming Hu et al; "Sr/Si template formation for the epitaxial growth of SrTiO/sub 3/on silicon" Materials Research Society Proceedings, vol. 716, 2002, pp. 261–266.

(Continued)

*Primary Examiner*—David Nelms
*Assistant Examiner*—Dao H. Nguyen
(74) *Attorney, Agent, or Firm*—Oblon, Spivak, McClelland, Maier & Neustadt, P.C.

(57) ABSTRACT

High quality epitaxial layers of monocrystalline materials (26) can be grown overlying monocrystalline substrates (22) such as large silicon wafers by forming a compliant substrate for growing the monocrystalline layers. An accommodating buffer layer (24) comprises a layer of monocrystalline oxide spaced apart from a silicon wafer by an amorphous interface layer (28) of silicon oxide. The amorphous interface layer dissipates strain and permits the growth of a high quality monocrystalline oxide accommodating buffer layer. Any lattice mismatch between the accommodating buffer layer and the underlying silicon substrate is taken care of by the amorphous interface layer. In addition, formation of a compliant substrate may include utilizing surfactant enhanced epitaxy and epitaxial growth of single crystal silicon onto single crystal oxide materials. A microresonator device is formed overlying the monocrystalline substrate. Portions or an entirety of the microresonator device can also overly the accommodating buffer layer, or the monocrystalline material layer.

16 Claims, 21 Drawing Sheets

U.S. PATENT DOCUMENTS

| | | |
|---|---|---|
| 3,914,137 A | 10/1975 | Huffman et al. |
| 3,935,031 A | 1/1976 | Adler |
| 4,006,989 A | 2/1977 | Andringa |
| 4,084,130 A | 4/1978 | Holton |
| 4,120,588 A | 10/1978 | Chaum |
| 4,146,297 A | 3/1979 | Alferness et al. |
| 4,174,422 A | 11/1979 | Matthews et al. |
| 4,174,504 A | 11/1979 | Chenausky et al. |
| 4,177,094 A | 12/1979 | Kroon |
| 4,242,595 A | 12/1980 | Lehovec |
| 4,284,329 A | 8/1981 | Smith et al. |
| 4,289,920 A | 9/1981 | Hovel |
| 4,297,656 A | 10/1981 | Pan |
| 4,298,247 A | 11/1981 | Michelet et al. |
| 4,378,259 A | 3/1983 | Hasegawa et al. |
| 4,392,297 A | 7/1983 | Little |
| 4,398,342 A | 8/1983 | Pitt et al. |
| 4,404,265 A | 9/1983 | Manasevit |
| 4,424,589 A | 1/1984 | Thomas et al. |
| 4,439,014 A | 3/1984 | Stacy et al. |
| 4,442,590 A | 4/1984 | Stockton et al. |
| 4,447,116 A | 5/1984 | King et al. |
| 4,452,720 A | 6/1984 | Harada et al. |
| 4,459,325 A | 7/1984 | Nozawa et al. |
| 4,482,422 A | 11/1984 | McGinn et al. |
| 4,482,906 A | 11/1984 | Hovel et al. |
| 4,484,332 A | 11/1984 | Hawrylo |
| 4,503,540 A | 3/1985 | Nakashima et al. |
| 4,523,211 A | 6/1985 | Morimoto et al. |
| 4,525,871 A | 6/1985 | Foyt et al. |
| 4,594,000 A | 6/1986 | Falk et al. |
| 4,626,878 A | 12/1986 | Kuwano et al. |
| 4,629,821 A | 12/1986 | Bronstein-Bonte et al. |
| 4,661,176 A | 4/1987 | Manasevit |
| 4,667,088 A | 5/1987 | Kramer |
| 4,667,212 A | 5/1987 | Nakamura |
| 4,681,982 A | 7/1987 | Yoshida |
| 4,695,120 A | 9/1987 | Holder |
| 4,723,321 A | 2/1988 | Saleh |
| 4,748,485 A | 5/1988 | Vasudev |
| 4,756,007 A | 7/1988 | Qureshi et al. |
| 4,772,929 A | 9/1988 | Manchester et al. |
| 4,773,063 A | 9/1988 | Hunsperger et al. |
| 4,774,205 A | 9/1988 | Choi et al. |
| 4,777,613 A | 10/1988 | Shahan et al. |
| 4,793,872 A | 12/1988 | Meunier et al. |
| 4,801,184 A | 1/1989 | Revelli |
| 4,802,182 A | 1/1989 | Thornton et al. |
| 4,804,866 A | 2/1989 | Akiyama |
| 4,815,084 A | 3/1989 | Scifres et al. |
| 4,841,775 A | 6/1989 | Ikeda et al. |
| 4,843,609 A | 6/1989 | Ohya et al. |
| 4,845,044 A | 7/1989 | Ariyoshi et al. |
| 4,846,926 A | 7/1989 | Kay et al. |
| 4,855,249 A | 8/1989 | Akasaki et al. |
| 4,866,489 A | 9/1989 | Yokogawa et al. |
| 4,868,376 A | 9/1989 | Lessin et al. |
| 4,872,046 A | 10/1989 | Morkoc et al. |
| 4,876,208 A | 10/1989 | Gustafson et al. |
| 4,876,218 A | 10/1989 | Pessa et al. |
| 4,876,219 A | 10/1989 | Eshita et al. |
| 4,882,300 A | 11/1989 | Inoue et al. |
| 4,885,376 A | 12/1989 | Verkade |
| 4,888,202 A | 12/1989 | Murakami et al. |
| 4,889,402 A | 12/1989 | Reinhart |
| 4,891,091 A | 1/1990 | Shastry |
| 4,896,194 A | 1/1990 | Suzuki |
| 4,901,133 A | 2/1990 | Curran et al. |
| 4,910,164 A | 3/1990 | Shichijo |
| 4,912,087 A | 3/1990 | Aslam et al. |
| 4,928,154 A | 5/1990 | Umeno et al. |
| 4,934,777 A | 6/1990 | Jou et al. |
| 4,952,420 A | 8/1990 | Walters |
| 4,959,702 A | 9/1990 | Moyer et al. |
| 4,963,508 A | 10/1990 | Umeno et al. |
| 4,963,949 A | 10/1990 | Wanlass et al. |
| 4,965,649 A | 10/1990 | Zanio et al. |
| 4,981,714 A | 1/1991 | Ohno et al. |
| 4,984,043 A | 1/1991 | Vinal |
| 4,999,842 A | 3/1991 | Huang et al. |
| 5,018,816 A | 5/1991 | Murray et al. |
| 5,028,563 A | 7/1991 | Feit et al. |
| 5,028,976 A | 7/1991 | Ozaki et al. |
| 5,051,790 A | 9/1991 | Hammer |
| 5,053,835 A | 10/1991 | Horikawa et al. |
| 5,055,445 A | 10/1991 | Belt et al. |
| 5,055,835 A | 10/1991 | Sutton |
| 5,057,694 A | 10/1991 | Idaka et al. |
| 5,060,031 A | 10/1991 | Abrokwah et al. |
| 5,063,081 A | 11/1991 | Cozzette et al. |
| 5,063,166 A | 11/1991 | Mooney et al. |
| 5,064,781 A | 11/1991 | Cambou et al. |
| 5,067,809 A | 11/1991 | Tsubota |
| 5,073,981 A | 12/1991 | Giles et al. |
| 5,075,743 A | 12/1991 | Behfar-Rad |
| 5,081,062 A | 1/1992 | Vasudev et al. |
| 5,081,519 A | 1/1992 | Nishimura et al. |
| 5,087,829 A | 2/1992 | Ishibashi et al. |
| 5,103,494 A | 4/1992 | Mozer |
| 5,116,461 A | 5/1992 | Lebby et al. |
| 5,119,448 A | 6/1992 | Schaefer et al. |
| 5,122,679 A | 6/1992 | Ishii et al. |
| 5,122,852 A | 6/1992 | Chan et al. |
| 5,127,067 A | 6/1992 | Delcoco et al. |
| 5,130,762 A | 7/1992 | Kulick |
| 5,132,648 A | 7/1992 | Trinh et al. |
| 5,140,387 A | 8/1992 | Okazaki et al. |
| 5,140,651 A | 8/1992 | Soref et al. |
| 5,141,894 A | 8/1992 | Bisaro et al. |
| 5,143,854 A | 9/1992 | Pirrung et al. |
| 5,144,409 A | 9/1992 | Ma |
| 5,148,504 A | 9/1992 | Levi et al. |
| 5,155,658 A | 10/1992 | Inam et al. |
| 5,159,413 A | 10/1992 | Calviello et al. |
| 5,163,118 A | 11/1992 | Lorenzo et al. |
| 5,166,761 A | 11/1992 | Olson et al. |
| 5,173,474 A | 12/1992 | Connell et al. |
| 5,173,835 A | 12/1992 | Cornett et al. |
| 5,181,085 A | 1/1993 | Moon et al. |
| 5,185,589 A | 2/1993 | Krishnaswamy et al. |
| 5,188,976 A | 2/1993 | Kume et al. |
| 5,191,625 A | 3/1993 | Gustavsson |
| 5,194,397 A | 3/1993 | Cook et al. |
| 5,194,917 A | 3/1993 | Regener |
| 5,198,269 A | 3/1993 | Swartz et al. |
| 5,208,182 A | 5/1993 | Narayan et al. |
| 5,210,763 A | 5/1993 | Lewis et al. |
| 5,216,359 A | 6/1993 | Makki et al. |
| 5,216,729 A | 6/1993 | Berger et al. |
| 5,221,367 A | 6/1993 | Chisholm et al. |
| 5,225,031 A | 7/1993 | McKee et al. |
| 5,227,196 A | 7/1993 | Itoh |
| 5,238,877 A | 8/1993 | Russell |
| 5,244,818 A | 9/1993 | Jokers et al. |
| 5,248,564 A * | 9/1993 | Ramesh ............... 428/688 |
| 5,260,394 A | 11/1993 | Tazaki et al. |
| 5,262,659 A | 11/1993 | Grudkowski et al. |
| 5,266,355 A | 11/1993 | Wernberg et al. |
| 5,268,327 A | 12/1993 | Vernon |
| 5,270,298 A | 12/1993 | Ramesh |
| 5,280,013 A | 1/1994 | Newman et al. |

| | | | | | |
|---|---|---|---|---|---|
| 5,281,834 A | 1/1994 | Cambou et al. | 5,511,238 A | 4/1996 | Bayraktaroglu |
| 5,283,462 A | 2/1994 | Stengel | 5,512,773 A | 4/1996 | Wolf et al. |
| 5,286,985 A | 2/1994 | Taddiken | 5,514,484 A | 5/1996 | Nashimoto |
| 5,293,050 A | 3/1994 | Chapple-Sokol et al. | 5,514,904 A | 5/1996 | Onga et al. |
| 5,306,649 A | 4/1994 | Hebert | 5,515,047 A | 5/1996 | Yamakido et al. |
| 5,309,464 A * | 5/1994 | Ko ............................ 372/43 | 5,515,810 A | 5/1996 | Yamashita et al. |
| 5,310,707 A | 5/1994 | Oishi et al. | 5,516,725 A | 5/1996 | Chang et al. |
| 5,312,765 A | 5/1994 | Kanber | 5,519,235 A | 5/1996 | Ramesh |
| 5,313,058 A | 5/1994 | Friederich et al. | 5,523,602 A | 6/1996 | Horiuchi et al. |
| 5,314,547 A | 5/1994 | Heremans et al. | 5,528,057 A | 6/1996 | Yanagase et al. |
| 5,315,128 A | 5/1994 | Hunt et al. | 5,528,067 A | 6/1996 | Farb |
| 5,323,023 A | 6/1994 | Fork | 5,528,209 A | 6/1996 | Macdonald et al. |
| 5,326,721 A | 7/1994 | Summerfelt | 5,528,414 A | 6/1996 | Oakley |
| 5,334,556 A | 8/1994 | Guldi | 5,530,235 A | 6/1996 | Stefik et al. |
| 5,352,926 A | 10/1994 | Andrews | 5,538,941 A | 7/1996 | Findikoglu et al. |
| 5,356,509 A | 10/1994 | Terranova et al. | 5,540,785 A | 7/1996 | Dennard et al. |
| 5,356,831 A | 10/1994 | Calviello et al. | 5,541,422 A | 7/1996 | Wolf et al. |
| 5,357,122 A | 10/1994 | Okubora et al. | 5,548,141 A | 8/1996 | Morris et al. |
| 5,358,925 A | 10/1994 | Neville Connell et al. | 5,549,977 A | 8/1996 | Jin et al. |
| 5,362,972 A | 11/1994 | Yazawa et al. | 5,551,238 A | 9/1996 | Prueitt |
| 5,362,998 A | 11/1994 | Iwamura et al. | 5,552,547 A | 9/1996 | Shi |
| 5,365,477 A | 11/1994 | Cooper, Jr. et al. | 5,553,089 A | 9/1996 | Seki et al. |
| 5,371,621 A | 12/1994 | Stevens | 5,556,463 A | 9/1996 | Guenzer |
| 5,371,734 A | 12/1994 | Fischer | 5,559,368 A | 9/1996 | Hu et al. |
| 5,372,992 A | 12/1994 | Itozaki et al. | 5,561,305 A | 10/1996 | Smith |
| 5,373,166 A | 12/1994 | Buchan et al. | 5,569,953 A | 10/1996 | Kikkawa et al. |
| 5,387,811 A | 2/1995 | Saigoh | 5,570,226 A | 10/1996 | Ota |
| 5,391,515 A | 2/1995 | Kao et al. | 5,572,052 A | 11/1996 | Kashihara et al. |
| 5,393,352 A | 2/1995 | Summerfelt | 5,574,296 A | 11/1996 | Park et al. |
| 5,394,489 A | 2/1995 | Koch | 5,574,589 A | 11/1996 | Feuer et al. |
| 5,395,663 A | 3/1995 | Tabata et al. | 5,574,744 A | 11/1996 | Gaw et al. |
| 5,397,428 A | 3/1995 | Stoner et al. | 5,576,879 A | 11/1996 | Nashimoto |
| 5,399,898 A | 3/1995 | Rostoker | 5,578,162 A | 11/1996 | D'Asaro et al. |
| 5,404,581 A | 4/1995 | Honjo | 5,585,167 A | 12/1996 | Satoh et al. |
| 5,405,802 A | 4/1995 | Yamagata et al. | 5,585,288 A | 12/1996 | Davis et al. |
| 5,406,202 A | 4/1995 | Mehrgardt et al. | 5,588,995 A | 12/1996 | Sheldon |
| 5,410,622 A | 4/1995 | Okada et al. | 5,589,284 A | 12/1996 | Summerfelt et al. |
| 5,418,216 A | 5/1995 | Fork | 5,596,205 A | 1/1997 | Reedy et al. |
| 5,418,389 A | 5/1995 | Watanabe | 5,596,214 A | 1/1997 | Endo |
| 5,420,102 A | 5/1995 | Harshavardhan et al. | 5,602,418 A | 2/1997 | Imai et al. |
| 5,427,988 A | 6/1995 | Sengupta et al. | 5,603,764 A | 2/1997 | Matsuda et al. |
| 5,430,397 A | 7/1995 | Itoh et al. | 5,606,184 A | 2/1997 | Abrokwah et al. |
| 5,436,759 A | 7/1995 | Dijaii et al. | 5,608,046 A | 3/1997 | Cook et al. |
| 5,438,584 A | 8/1995 | Paoli et al. | 5,610,744 A | 3/1997 | Ho et al. |
| 5,441,577 A | 8/1995 | Sasaki et al. | 5,614,739 A | 3/1997 | Abrokwah et al. |
| 5,442,191 A | 8/1995 | Ma | 5,619,051 A | 4/1997 | Endo |
| 5,442,561 A | 8/1995 | Yoshizawa et al. | 5,621,227 A | 4/1997 | Joshi |
| 5,444,016 A | 8/1995 | Abrokwah et al. | 5,623,439 A | 4/1997 | Gotoh et al. |
| 5,446,719 A | 8/1995 | Yoshida et al. | 5,623,552 A | 4/1997 | Lane |
| 5,450,812 A | 9/1995 | McKee et al. | 5,629,534 A | 5/1997 | Inuzuka et al. |
| 5,452,118 A | 9/1995 | Maruska | 5,633,724 A | 5/1997 | King et al. |
| 5,453,727 A | 9/1995 | Shibasaki et al. | 5,635,433 A | 6/1997 | Sengupta |
| 5,466,631 A | 11/1995 | Ichikawa et al. | 5,635,453 A | 6/1997 | Pique et al. |
| 5,473,047 A | 12/1995 | Shi | 5,640,267 A | 6/1997 | May et al. |
| 5,473,171 A | 12/1995 | Summerfelt | 5,642,371 A | 6/1997 | Tohyama et al. |
| 5,477,363 A | 12/1995 | Matsuda | 5,650,646 A | 7/1997 | Summerfelt |
| 5,478,653 A | 12/1995 | Guenzer | 5,656,382 A | 8/1997 | Nashimoto |
| 5,479,033 A | 12/1995 | Baca et al. | 5,659,180 A | 8/1997 | Shen et al. |
| 5,479,317 A | 12/1995 | Ramesh | 5,661,112 A | 8/1997 | Hatta et al. |
| 5,480,829 A | 1/1996 | Abrokwah et al. | 5,666,376 A | 9/1997 | Cheng |
| 5,481,102 A | 1/1996 | Hazelrigg, Jr. | 5,667,586 A | 9/1997 | Ek et al. |
| 5,482,003 A | 1/1996 | McKee et al. | 5,668,048 A | 9/1997 | Kondo et al. |
| 5,484,664 A | 1/1996 | Kitahara et al. | 5,670,798 A | 9/1997 | Schetzina |
| 5,486,406 A | 1/1996 | Shi | 5,670,800 A | 9/1997 | Nakao et al. |
| 5,491,461 A | 2/1996 | Partin et al. | 5,674,366 A | 10/1997 | Hayashi et al. |
| 5,492,859 A | 2/1996 | Sakaguchi et al. | 5,674,813 A | 10/1997 | Nakamura et al. |
| 5,494,711 A | 2/1996 | Takeda et al. | 5,679,947 A | 10/1997 | Doi et al. |
| 5,504,035 A | 4/1996 | Rostoker et al. | 5,679,965 A | 10/1997 | Schetzina |
| 5,504,183 A | 4/1996 | Shi | 5,682,046 A | 10/1997 | Takahashi et al. |
| 5,508,554 A | 4/1996 | Takatani et al. | 5,684,302 A | 11/1997 | Wersing et al. |
| 5,510,665 A | 4/1996 | Conley | 5,686,741 A | 11/1997 | Ohori et al. |

| | | | | | |
|---|---|---|---|---|---|
| 5,689,123 A | 11/1997 | Major et al. | 5,883,996 A | 3/1999 | Knapp et al. |
| 5,693,140 A | 12/1997 | McKee et al. | 5,886,867 A | 3/1999 | Chivukula et al. |
| 5,696,392 A | 12/1997 | Char et al. | 5,888,296 A | 3/1999 | Ooms et al. |
| 5,719,417 A | 2/1998 | Roeder et al. | 5,889,296 A | 3/1999 | Imamura et al. |
| 5,725,641 A | 3/1998 | MacLeod | 5,896,476 A | 4/1999 | Wisseman et al. |
| 5,729,394 A | 3/1998 | Sevier et al. | 5,905,571 A | 5/1999 | Butler et al. |
| 5,729,641 A | 3/1998 | Chandonnet et al. | 5,907,792 A | 5/1999 | Droopad et al. |
| 5,731,220 A | 3/1998 | Tsu et al. | 5,912,068 A | 6/1999 | Jia |
| 5,733,641 A | 3/1998 | Fork et al. | 5,919,515 A | 7/1999 | Yano et al. |
| 5,734,672 A | 3/1998 | McMinn et al. | 5,919,522 A | 7/1999 | Baum et al. |
| 5,735,949 A | 4/1998 | Mantl et al. | 5,926,493 A | 7/1999 | O'Brien et al. |
| 5,741,724 A | 4/1998 | Ramdani et al. | 5,926,496 A | 7/1999 | Ho et al. |
| 5,745,631 A | 4/1998 | Reinker | 5,937,115 A | 8/1999 | Domash |
| 5,753,300 A | 5/1998 | Wessels et al. | 5,937,274 A | 8/1999 | Kondow et al. |
| 5,753,928 A | 5/1998 | Krause | 5,937,285 A | 8/1999 | Abrokwah et al. |
| 5,753,934 A | 5/1998 | Yano et al. | 5,948,161 A | 9/1999 | Kizuki |
| 5,754,319 A | 5/1998 | Van De Voorde et al. | 5,953,468 A | 9/1999 | Finnila et al. |
| 5,754,714 A | 5/1998 | Suzuki et al. | 5,955,591 A | 9/1999 | Imbach et al. |
| 5,760,426 A | 6/1998 | Marx et al. | 5,959,308 A | 9/1999 | Shichijo et al. |
| 5,760,427 A | 6/1998 | Onda | 5,959,879 A | 9/1999 | Koo |
| 5,760,740 A | 6/1998 | Blodgett | 5,962,069 A | 10/1999 | Schindler et al. |
| 5,764,676 A | 6/1998 | Paoli et al. | 5,963,291 A | 10/1999 | Wu et al. |
| 5,767,543 A | 6/1998 | Ooms et al. | 5,966,323 A | 10/1999 | Chen et al. |
| 5,770,887 A | 6/1998 | Tadatomo et al. | 5,976,953 A | 11/1999 | Zavracky et al. |
| 5,772,758 A | 6/1998 | Collins et al. | 5,977,567 A | 11/1999 | Verdiell |
| 5,776,359 A | 7/1998 | Schultz et al. | 5,981,400 A | 11/1999 | Lo |
| 5,776,621 A | 7/1998 | Nashimoto | 5,981,976 A | 11/1999 | Murasato |
| 5,777,350 A | 7/1998 | Nakamura et al. | 5,981,980 A | 11/1999 | Miyajima et al. |
| 5,777,762 A | 7/1998 | Yamamoto | 5,984,190 A | 11/1999 | Nevill |
| 5,778,018 A | 7/1998 | Yoshikawa et al. | 5,985,404 A | 11/1999 | Yano et al. |
| 5,778,116 A | 7/1998 | Tomich | 5,986,301 A | 11/1999 | Fukushima et al. |
| 5,780,311 A | 7/1998 | Beasom et al. | 5,987,011 A | 11/1999 | Toh |
| 5,789,733 A | 8/1998 | Jachimowicz et al. | 5,987,196 A | 11/1999 | Noble |
| 5,789,845 A | 8/1998 | Wadaka et al. | 5,990,495 A | 11/1999 | Ohba |
| 5,790,583 A | 8/1998 | Ho | 5,995,359 A | 11/1999 | Klee et al. |
| 5,792,569 A | 8/1998 | Sun et al. | 5,995,528 A | 11/1999 | Fukunaga et al. |
| 5,792,679 A | 8/1998 | Nakato | 5,997,638 A | 12/1999 | Copel et al. |
| 5,796,648 A | 8/1998 | Kawakubo et al. | 5,998,781 A | 12/1999 | Vawter et al. |
| 5,801,072 A | 9/1998 | Barber | 5,998,819 A | 12/1999 | Yokoyama et al. |
| 5,801,105 A | 9/1998 | Yano et al. | 6,002,375 A | 12/1999 | Corman et al. |
| 5,807,440 A | 9/1998 | Kubota et al. | 6,008,762 A | 12/1999 | Nghiem |
| 5,810,923 A | 9/1998 | Yano et al. | 6,011,641 A | 1/2000 | Shin et al. |
| 5,812,272 A | 9/1998 | King et al. | 6,011,646 A | 1/2000 | Mirkarimi et al. |
| 5,814,583 A | 9/1998 | Itozaki et al. | 6,013,553 A | 1/2000 | Wallace et al. |
| 5,825,055 A | 10/1998 | Summerfelt | 6,020,222 A | 2/2000 | Wollesen |
| 5,825,799 A | 10/1998 | Ho et al. | 6,022,140 A | 2/2000 | Fraden et al. |
| 5,827,755 A | 10/1998 | Yonehara et al. | 6,022,410 A | 2/2000 | Yu et al. |
| 5,828,080 A | 10/1998 | Yano et al. | 6,022,671 A | 2/2000 | Binkley et al. |
| 5,830,270 A | 11/1998 | McKee et al. | 6,022,963 A | 2/2000 | McGall et al. |
| 5,831,960 A | 11/1998 | Jiang et al. | 6,023,082 A | 2/2000 | McKee et al. |
| 5,833,603 A | 11/1998 | Kovacs et al. | 6,028,853 A | 2/2000 | Haartsen |
| 5,834,362 A | 11/1998 | Miyagaki et al. | 6,039,803 A | 3/2000 | Fitzgerald et al. |
| 5,838,035 A | 11/1998 | Ramesh | 6,045,626 A | 4/2000 | Yano et al. |
| 5,838,053 A | 11/1998 | Bevan et al. | 6,046,464 A | 4/2000 | Schetzina |
| 5,844,260 A | 12/1998 | Ohori | 6,048,751 A | 4/2000 | D'Asaro et al. |
| 5,846,846 A | 12/1998 | Suh et al. | 6,049,110 A | 4/2000 | Koh |
| 5,852,687 A | 12/1998 | Wickham | 6,049,702 A | 4/2000 | Tham et al. |
| 5,857,049 A | 1/1999 | Beranek et al. | 6,051,858 A | 4/2000 | Uchida et al. |
| 5,858,814 A | 1/1999 | Goossen et al. | 6,051,874 A | 4/2000 | Masuda |
| 5,861,966 A | 1/1999 | Ortel | 6,055,179 A | 4/2000 | Koganei et al. |
| 5,863,326 A | 1/1999 | Nause et al. | 6,058,131 A | 5/2000 | Pan |
| 5,864,171 A | 1/1999 | Yamamoto et al. | 6,059,895 A | 5/2000 | Chu et al. |
| 5,869,845 A | 2/1999 | Vander Wagt et al. | 6,064,078 A | 5/2000 | Northrup et al. |
| 5,872,493 A | 2/1999 | Ella | 6,064,092 A | 5/2000 | Park |
| 5,873,977 A | 2/1999 | Desu et al. | 6,064,783 A | 5/2000 | Congdon et al. |
| 5,874,860 A | 2/1999 | Brunel et al. | 6,078,717 A | 6/2000 | Nashimoto et al. |
| 5,878,175 A | 3/1999 | Sonoda et al. | 6,080,378 A | 6/2000 | Yokota et al. |
| 5,879,956 A | 3/1999 | Seon et al. | 6,083,697 A | 7/2000 | Beecher et al. |
| 5,880,452 A | 3/1999 | Plesko | 6,087,681 A * | 7/2000 | Shakuda ..................... 257/103 |
| 5,882,948 A | 3/1999 | Jewell | 6,088,216 A | 7/2000 | Laibowitz et al. |
| 5,883,564 A | 3/1999 | Partin | 6,090,659 A | 7/2000 | Laibowitz et al. |

| | | | |
|---|---|---|---|
| 6,093,302 A | 7/2000 | Montgomery |
| 6,096,584 A | 8/2000 | Ellis-Monaghan et al. |
| 6,100,578 A | 8/2000 | Suzuki |
| 6,103,008 A | 8/2000 | McKee et al. |
| 6,103,403 A | 8/2000 | Grigorian et al. |
| 6,107,653 A | 8/2000 | Fitzgerald |
| 6,107,721 A | 8/2000 | Lakin |
| 6,108,125 A | 8/2000 | Yano |
| 6,110,813 A | 8/2000 | Ota et al. |
| 6,110,840 A | 8/2000 | Yu |
| 6,113,225 A | 9/2000 | Miyata et al. |
| 6,113,690 A | 9/2000 | Yu et al. |
| 6,114,996 A | 9/2000 | Nghiem |
| 6,121,642 A | 9/2000 | Newns |
| 6,121,647 A | 9/2000 | Yano et al. |
| 6,128,178 A | 10/2000 | Newns |
| 6,134,114 A | 10/2000 | Ungermann et al. |
| 6,136,666 A | 10/2000 | So |
| 6,137,603 A | 10/2000 | Henmi |
| 6,139,483 A | 10/2000 | Seabaugh et al. |
| 6,140,746 A | 10/2000 | Miyashita et al. |
| 6,143,072 A | 11/2000 | McKee et al. |
| 6,143,366 A | 11/2000 | Lu |
| 6,146,906 A | 11/2000 | Inoue et al. |
| 6,150,239 A | 11/2000 | Goesele et al. |
| 6,151,240 A | 11/2000 | Suzuki |
| 6,153,010 A | 11/2000 | Kiyoku et al. |
| 6,153,454 A | 11/2000 | Krivokapic |
| 6,156,581 A | 12/2000 | Vaudo et al. |
| 6,173,474 B1 | 1/2001 | Conrad |
| 6,174,755 B1 | 1/2001 | Manning |
| 6,175,497 B1 | 1/2001 | Tseng et al. |
| 6,175,555 B1 | 1/2001 | Hoole |
| 6,180,252 B1 | 1/2001 | Farrell et al. |
| 6,180,486 B1 | 1/2001 | Leobandung et al. |
| 6,181,920 B1 | 1/2001 | Dent et al. |
| 6,184,044 B1 | 2/2001 | Sone et al. |
| 6,184,144 B1 | 2/2001 | Lo |
| 6,191,011 B1 | 2/2001 | Gilboa et al. |
| 6,194,753 B1 | 2/2001 | Seon et al. |
| 6,197,503 B1 | 3/2001 | Vo-Dinh et al. |
| 6,198,119 B1 | 3/2001 | Nabatame et al. |
| 6,204,525 B1 | 3/2001 | Sakurai et al. |
| 6,204,737 B1 | 3/2001 | Ella |
| 6,208,453 B1 | 3/2001 | Wessels et al. |
| 6,210,988 B1 | 4/2001 | Howe et al. |
| 6,211,096 B1 | 4/2001 | Allman et al. |
| 6,222,654 B1 | 4/2001 | Frigo |
| 6,224,669 B1 | 5/2001 | Yi et al. |
| 6,225,051 B1 | 5/2001 | Sugiyama et al. |
| 6,229,159 B1 | 5/2001 | Suzuki |
| 6,232,242 B1 | 5/2001 | Hata et al. |
| 6,232,806 B1 | 5/2001 | Woeste et al. |
| 6,232,910 B1 | 5/2001 | Bell et al. |
| 6,233,435 B1 | 5/2001 | Wong |
| 6,235,145 B1 | 5/2001 | Li et al. |
| 6,235,649 B1 | 5/2001 | Kawahara et al. |
| 6,238,946 B1 | 5/2001 | Ziegler |
| 6,239,012 B1 | 5/2001 | Kinsman |
| 6,239,449 B1 | 5/2001 | Fafard et al. |
| 6,241,821 B1 | 6/2001 | Yu et al. |
| 6,242,686 B1 | 6/2001 | Kishimoto et al. |
| 6,248,459 B1 | 6/2001 | Wang et al. |
| 6,248,621 B1 | 6/2001 | Wilk et al. |
| 6,252,261 B1 | 6/2001 | Usui et al. |
| 6,255,198 B1 | 7/2001 | Linthicum et al. |
| 6,256,426 B1 | 7/2001 | Duchet |
| 6,265,749 B1 | 7/2001 | Gardner et al. |
| 6,268,269 B1 | 7/2001 | Lee et al. |
| 6,271,619 B1 | 8/2001 | Yamada et al. |
| 6,275,122 B1 | 8/2001 | Speidell et al. |
| 6,277,436 B1 | 8/2001 | Stauf et al. |
| 6,278,137 B1 | 8/2001 | Shimoyama et al. |
| 6,278,138 B1 | 8/2001 | Suzuki |
| 6,278,523 B1 | 8/2001 | Gorecki |
| 6,278,541 B1 | 8/2001 | Baker |
| 6,291,319 B1 | 9/2001 | Yu et al. |
| 6,291,866 B1 | 9/2001 | Wallace |
| 6,297,598 B1 | 10/2001 | Wang et al. |
| 6,297,842 B1 | 10/2001 | Koizumi et al. |
| 6,300,615 B1 | 10/2001 | Shinohara et al. |
| 6,306,668 B1 | 10/2001 | McKee et al. |
| 6,307,996 B1 | 10/2001 | Nashimoto et al. |
| 6,312,819 B1 | 11/2001 | Jia et al. |
| 6,313,486 B1 | 11/2001 | Kencke et al. |
| 6,316,785 B1 | 11/2001 | Nunoue et al. |
| 6,316,832 B1 | 11/2001 | Tsuzuki et al. |
| 6,319,730 B1 | 11/2001 | Ramdani et al. |
| 6,320,238 B1 | 11/2001 | Kizilyalli et al. |
| 6,326,637 B1 | 12/2001 | Parkin et al. |
| 6,326,645 B1 | 12/2001 | Kadota |
| 6,326,667 B1 | 12/2001 | Sugiyama et al. |
| 6,329,277 B1 | 12/2001 | Liu et al. |
| 6,338,756 B2 | 1/2002 | Dietze |
| 6,339,664 B1 | 1/2002 | Farjady et al. |
| 6,340,788 B1 | 1/2002 | King et al. |
| 6,341,851 B1 | 1/2002 | Takayama et al. |
| 6,343,171 B1 | 1/2002 | Yoshimura et al. |
| 6,345,424 B1 | 2/2002 | Hasegawa et al. |
| 6,348,373 B1 | 2/2002 | Ma et al. |
| 6,355,945 B1 | 3/2002 | Kadota et al. |
| 6,359,330 B1 | 3/2002 | Goudard |
| 6,362,017 B1 | 3/2002 | Manabe et al. |
| 6,362,558 B1 | 3/2002 | Fukui |
| 6,367,699 B2 | 4/2002 | Ackley |
| 6,372,356 B1 | 4/2002 | Thornton et al. |
| 6,372,813 B1 | 4/2002 | Johnson et al. |
| 6,376,337 B1 | 4/2002 | Wang et al. |
| 6,389,209 B1 | 5/2002 | Suhir |
| 6,391,674 B2 | 5/2002 | Ziegler |
| 6,392,253 B1 | 5/2002 | Saxena |
| 6,392,257 B1 | 5/2002 | Ramdani et al. |
| 6,393,167 B1 | 5/2002 | Davis et al. |
| 6,404,027 B1 | 6/2002 | Hong et al. |
| 6,410,941 B1 | 6/2002 | Taylor et al. |
| 6,410,947 B1 | 6/2002 | Wada |
| 6,411,756 B2 | 6/2002 | Sadot et al. |
| 6,415,140 B1 | 7/2002 | Benjamin et al. |
| 6,417,059 B2 | 7/2002 | Huang |
| 6,419,849 B1 | 7/2002 | Qiu et al. |
| 6,427,066 B1 | 7/2002 | Grube |
| 6,432,546 B1 | 8/2002 | Ramesh et al. |
| 6,438,281 B1 | 8/2002 | Tsukamoto et al. |
| 6,445,724 B2 | 9/2002 | Abeles |
| 6,452,232 B1 | 9/2002 | Adan |
| 6,461,927 B1 | 10/2002 | Mochizuki et al. |
| 6,462,360 B1 | 10/2002 | Higgins, Jr. et al. |
| 6,477,285 B1 | 11/2002 | Shanley |
| 6,496,469 B1 | 12/2002 | Uchizaki |
| 6,498,358 B1 | 12/2002 | Lach et al. |
| 6,501,121 B1 | 12/2002 | Yu et al. |
| 6,504,189 B1 | 1/2003 | Matsuda et al. |
| 6,524,651 B2 | 2/2003 | Gan et al. |
| 6,528,374 B2 | 3/2003 | Bojarczuk, Jr. et al. |
| 6,538,359 B1 | 3/2003 | Hiraku et al. |
| 6,589,887 B1 | 7/2003 | Dalton et al. |
| 2001/0013313 A1 | 8/2001 | Droopad et al. |
| 2001/0020278 A1 | 9/2001 | Saito |
| 2001/0036142 A1 | 11/2001 | Kadowaki et al. |
| 2001/0055820 A1 | 12/2001 | Sakurai et al. |
| 2002/0006245 A1 | 1/2002 | Kubota et al. |
| 2002/0008234 A1 | 1/2002 | Emrick |

| | | | | | | |
|---|---|---|---|---|---|---|
| 2002/0021855 A1 | 2/2002 | Kim | | GB | 2 335 792 | 9/1999 |
| 2002/0030246 A1 | 3/2002 | Eisenbeiser et al. | | JP | 52-88354 | 7/1977 |
| 2002/0047123 A1 | 4/2002 | Ramdani et al. | | JP | 52-89070 | 7/1977 |
| 2002/0047143 A1 | 4/2002 | Ramdani et al. | | JP | 52-135684 | 11/1977 |
| 2002/0052061 A1 | 5/2002 | Fitzgerald | | JP | 54-134554 | 10/1979 |
| 2002/0072245 A1 | 6/2002 | Ooms et al. | | JP | 55-87424 | 7/1980 |
| 2002/0076878 A1 | 6/2002 | Wasa et al. | | JP | 58-075868 | 5/1983 |
| 2002/0079576 A1 | 6/2002 | Seshan | | JP | 58-213412 | 12/1983 |
| 2002/0131675 A1 | 9/2002 | Litvin | | JP | 59-044004 | 3/1984 |
| 2002/0140012 A1 | 10/2002 | Droopad | | JP | 59066183 | 4/1984 |
| 2002/0145168 A1 | 10/2002 | Bojarczuk, Jr. et al. | | JP | 59-073498 | 4/1984 |
| 2002/0179000 A1 | 12/2002 | Lee et al. | | JP | 60-161635 | 8/1985 |
| 2002/0195610 A1 | 12/2002 | Klosowiak | | JP | 60-210018 | 10/1985 |
| 2003/0022395 A1 * | 1/2003 | Olds ............................ 438/3 | | JP | 60-212018 | 10/1985 |
| 2004/0022474 A1 * | 2/2004 | Lim et al. ..................... 385/4 | | JP | 61-36981 | 2/1986 |
| | | | | JP | 61-63015 | 4/1986 |

FOREIGN PATENT DOCUMENTS

| | | | | | | |
|---|---|---|---|---|---|---|
| | | | | JP | 61-108187 | 5/1986 |
| EP | 0 250 171 | 12/1987 | | JP | 62-245205 | 10/1987 |
| EP | 0 300 499 | 1/1989 | | JP | 63-34994 | 2/1988 |
| EP | 0 309 270 | 3/1989 | | JP | 63-131104 | 6/1988 |
| EP | 0 331 338 | 9/1989 | | JP | 63-198365 | 8/1988 |
| EP | 0 331 467 | 9/1989 | | JP | 63-289812 | 11/1988 |
| EP | 0 342 937 | 11/1989 | | JP | 64-50575 | 2/1989 |
| EP | 0 392 714 | 10/1990 | | JP | 64-52329 | 2/1989 |
| EP | 0 412 002 | 2/1991 | | JP | 1-102435 | 4/1989 |
| EP | 0 455 526 | 6/1991 | | JP | 1-179411 | 7/1989 |
| EP | 0 483 993 | 5/1992 | | JP | 01-196809 | 8/1989 |
| EP | 0 494 514 | 7/1992 | | JP | 03-149882 | 11/1989 |
| EP | 0 514 018 | 11/1992 | | JP | HEI 2-391 | 1/1990 |
| EP | 0 538 611 | 4/1993 | | JP | 02051220 | 2/1990 |
| EP | 0 581 239 | 2/1994 | | JP | 3-41783 | 2/1991 |
| EP | 0 600 658 | 6/1994 | | JP | 03046384 | 2/1991 |
| EP | 0 602 568 | 6/1994 | | JP | 3-171617 | 7/1991 |
| EP | 0 607 435 | 7/1994 | | JP | 03-18619 | 8/1991 |
| EP | 0 614 256 | 9/1994 | | JP | 5-48072 | 2/1993 |
| EP | 0 619 283 | 10/1994 | | JP | 5-086477 | 4/1993 |
| EP | 0 630 057 | 12/1994 | | JP | 05150143 | 6/1993 |
| EP | 0 661 561 | 7/1995 | | JP | 5-152529 | 6/1993 |
| EP | 0 860 913 | 8/1995 | | JP | 05 221800 | 8/1993 |
| EP | 0 682 266 | 11/1995 | | JP | 5-232307 | 9/1993 |
| EP | 0 711 853 | 5/1996 | | JP | 5-238894 | 9/1993 |
| EP | 0 766 292 | 4/1997 | | JP | 5-243525 | 9/1993 |
| EP | 0 777 379 | 6/1997 | | JP | 5-291299 | 11/1993 |
| EP | 0 810 666 | 12/1997 | | JP | 06-069490 | 3/1994 |
| EP | 0 828 287 | 3/1998 | | JP | 6-232126 | 8/1994 |
| EP | 0 852 416 | 7/1998 | | JP | 6-291299 | 10/1994 |
| EP | 0 875 922 | 11/1998 | | JP | 6-334168 | 12/1994 |
| EP | 0 881 669 | 12/1998 | | JP | 0812494 | 1/1996 |
| EP | 0 884 767 | 12/1998 | | JP | 9-67193 | 3/1997 |
| EP | 0 926 739 | 6/1999 | | JP | 9-82913 | 3/1997 |
| EP | 0 957 522 | 11/1999 | | JP | 10-256154 | 9/1998 |
| EP | 0 964 259 | 12/1999 | | JP | 10-269842 | 10/1998 |
| EP | 0 964 453 | 12/1999 | | JP | 10-303396 | 11/1998 |
| EP | 0 993 027 | 4/2000 | | JP | 10-321943 | 12/1998 |
| EP | 0 999 600 | 5/2000 | | JP | 11135614 | 5/1999 |
| EP | 1 001 468 | 5/2000 | | JP | 11-238683 | 8/1999 |
| EP | 1 035 759 | 9/2000 | | JP | 11-260835 | 9/1999 |
| EP | 1 037 272 | 9/2000 | | JP | 01 294594 | 11/1999 |
| EP | 1 043 426 | 10/2000 | | JP | 11340542 | 12/1999 |
| EP | 1 043 427 | 10/2000 | | JP | 2000-068466 | 3/2000 |
| EP | 1 043 765 | 10/2000 | | JP | 2 000 1645 | 6/2000 |
| EP | 1 054 442 | 11/2000 | | JP | 2000-278085 | 10/2000 |
| EP | 1 069 605 | 1/2001 | | JP | 2000-349278 | 12/2000 |
| EP | 1 069 606 | 1/2001 | | JP | 2000-351692 | 12/2000 |
| EP | 1 085 319 | 3/2001 | | JP | 2001-196892 | 7/2001 |
| EP | 1 089 338 | 4/2001 | | JP | 2002-9366 | 1/2002 |
| EP | 1 109 212 | 6/2001 | | WO | WO 92/10875 | 6/1992 |
| EP | 1 176 230 | 1/2002 | | WO | WO 93/07647 | 4/1993 |
| FR | 2 779 843 | 12/1999 | | WO | WO 94/03908 | 2/1994 |
| GB | 1 319 311 | 6/1970 | | WO | WO 95/02904 | 1/1995 |
| GB | 2 152 315 | 7/1985 | | WO | WO 97/45827 | 12/1997 |

| | | |
|---|---|---|
| WO | WO 98/05807 | 1/1998 |
| WO | WO 98/20606 | 5/1998 |
| WO | WO 99/14797 | 3/1999 |
| WO | WO 99/14804 | 3/1999 |
| WO | WO 99/19546 | 4/1999 |
| WO | WO 99/63580 | 12/1999 |
| WO | WO 99/67882 | 12/1999 |
| WO | WO 00/06812 | 2/2000 |
| WO | WO 00/16378 | 3/2000 |
| WO | WO 00/33363 | 6/2000 |
| WO | WO 00/48239 | 8/2000 |
| WO | WO 01/04943 A1 | 1/2001 |
| WO | WO 01/16395 | 3/2001 |
| WO | WO 01/33585 | 5/2001 |
| WO | WO 01/37330 | 5/2001 |
| WO | WO 01/59814 A2 | 8/2001 |
| WO | WO 01/59820 A1 | 8/2001 |
| WO | WO 01/59821 A1 | 8/2001 |
| WO | WO 01/59837 | 8/2001 |
| WO | WO 02 01648 | 1/2002 |
| WO | WO 02/03113 | 1/2002 |
| WO | WO 02/03467 | 1/2002 |
| WO | WO 02/03480 | 1/2002 |
| WO | WO 02/08806 | 1/2002 |
| WO | WO 02/09160 A2 | 1/2002 |
| WO | WO 02/009150 | 1/2002 |
| WO | WO 02/11254 | 2/2002 |
| WO | WO 02/33385 A2 | 4/2002 |
| WO | WO 02/47127 A2 | 6/2002 |
| WO | WO 02/50879 | 6/2002 |
| WO | WO 02/099885 | 12/2002 |
| WO | WO 03/012874 | 2/2003 |

OTHER PUBLICATIONS

Charles Kittel; "Introduction to Solid State Physics"; John Wiley & Sons, Inc. Fifth Edition: pp. 415.

Chyuan–Wei Chen et al; "Liquid–phase epitaxial growth and characterization of InGaAsP layers grown on GaAsP substrates for application to orango light–omitting diodos"; 931 Journal of Applied Physics; 77 (1995) Jan. 15, NO. 2: Woodbury, NY, US: pp. 905–909.

W. Zhu et al.; "Oriented diamond films grown on nickel substrates"; 320 Applied Physics Letters: 63(1993) Sep., No. 12, Woodbury, NY, US: pp. 1640–1642.

M. Schreck et al.; "Diamond/Ir/SrTiO3: A material combination for improved heteroepitaxial diamond films"; Applied Physics Letters; vol. 74, No. 5; Feb. 1, 1999; pp. 650–652.

Yoshihiro Yokota et al.; "Cathodoluminescence of borou–doped heteroepitaxial diamond films on platinum"; Diamond and Related Materials 8(1999); pp. 1587–1591.

J.R. Busch et al.; "Linear Electro–Optic Response in SOL–CEL PZT Planar Waveguide"; Electronics Letters; Aug. 13, 1992; vol. 28, No. 17; pp. 1591–1592.

R. Droopad et al; "Epitaxial Oxide Films on Silicon: Growth, Modeling and Device Properties" ; Mat. Res. Soc. Symp. Proc. vol. 619; 2000 Materials Research Society; pp. 155–165.

H. Ohkubo et al.; "Fabrication of High Quality Perovskite Oxide Films by Lateral Epitaxy Verified with RIIEED Oscilation" ; 2419A Int. Conf. on Solid State Devices & Materials. Tsukuba, Aug. 26–28 (1992); pp. 457–459.

Lin Li; "Ferroelectric/Superconductor Heterostructures" ; Materials Science and Engineering; 29 (2000) pp. 153–181.

L. Fan et al.; "Dynaamic Beam Switching of Vertical–Cavity Surface–Emitting Lasers with Integrated Optical Beam Routers" ; IEEE Photonics Technology Letters; vol. 9, NO. 4; Apr. 4, 1997; pp. 505–507.

Y. Q. Xu. et al.; "(Mn, Sb) dropped–Pb(Zr, Ti)03 infrared detector arrays" ; Journal of Applied Physics; vol. 88, NO. 2; Jul. 15, 2000; pp. 1004–1007.

Kiyoko Kuto et al.; "Reduction of dislocations in InGaAs layer on GaAs using epitaxial lateral overgrowth" ; 2300 Journal of Crystal Growth 115 (1991) pp. 174–179; Dec. 1991.

Nakagawara et al.; Effects of Buffer Layers in Epitaxial Growth of $SrTiO_3$ Thin Film on Si(100), *J. Appl. Phys.*, 78 (12), Dec. 15, 1995, pp. 7226–7230.

Suzuki et al., "A Proposal of Epitaxial Oxide Thin Film Structures For Future Oxide Electronics," *Materials Science and Engineering B41*, (1996), pp. 166–173.

W. F. Egelhoff et al., "Optimizing GMR Spin Valves: The Outlook for Improved Properties", *1998 Int'l Non Volatile Memory Technology Conference*, pp. 34–37.

Wang et al., "Processing and Performance of Piezoelectric Films", Univ. of MD, Wilcoxon Research Col, and Motorola Labs, May 11, 2000.

M. Rotter et al., "Nonlinear Acoustoelectric Interactions in $GaAs/LiNbO_3$ Structures", *Applied Physics Letters*, vol. 75(7), Aug. 16, 1999, pp. 965–967.

K. Sreenivas et al., "Surface Acoustic Wave Propagation on Lead Zirconate Titanate Thin Films," *Appl. Phys. Lett.* 52 (9), Feb. 29, 1998, pp. 709–711.

M. Rotter et al., "Single Chip Fused Hybrids for Acousto–Electric and Acousto–Optic Applications," *1997 Applied Physics Letters*, vol. 70(16), Apr. 21, 1997, pp. 2097–2099.

A. Mansingh et al., "Surface Acoustic Wave Propagation in $PZT/YBCO/SrTiO_3$ and $PbTiO_3/YBCO/SrTiO_3$ Epitaxial Heterostructures," *Ferroelectric*, vol. 224, pp. 275–282, 1999.

S. Mathews et al., "Ferroelectric Field Effect Transistor Based on Epitaxial Perovskite Heterostructures", Science, vol. 276, Apr. 11, 1997, pp. 238–240.

R. Houdre et al., "Properties of GaAs on Si Grown by Molecular Beam Epitaxy," *Solid State and Materials Sciences*, vol. 16, Issue 2, 1990, pp. 91–114.

S. F. Fang et al., "Gallium Arsenide and Other Compound Semiconductors on Silicon," *J. Appl. Phys.*, 68(7), Oct. 1, 1990, pp. R31–R58.

Carlin et al., Impact of GaAs Buffer Thickness on Electronic Quality of GaAs Grown on Graded Ge/GeSVSI Substrates, *Appl. Phys. Letter*, vol. 76, No. 14, Apr. 2000, pp. 1884–1886.

Ringel et al., "Epitaxial integration of III–V Materials and Devices with Si Using Graded GeSi Buffers," 27th International Symposium on Compound Semiconductors, Oct. 2000.

Zogg et al., "Progress in Compound–Semiconductor–on–Silicon–Heteroepitaxy with Fluoride Buffer Layers," *J. Electrochem Soc.*, vol. 136, No. 3, Mar. 1998, pp. 775–779.

Xiong et al., "Oxide Defined GaAs Vertical–Cavity Surface–Emitting Lasers on Si Substrates," *IEEE Photonics Technology Letters*, vol. 12, No. 2, Feb. 2000, pp. 110–112.

Clem et al., "Investigation of PZT//LSCO//Pt//Aerogel Thin Film Composites for Uncooled Pyroelectric IR Detectors," *Mat. Res. Soc. Symp. Proc.*, vol. 541, pp. 661–666, 1999.

Gunapala et al., "Bound–To–Quasi–Bound Quantum–Well Infrared Photodetectors," NASA Tech Brief, vol. 22, No. 9, Sep. 1998.

Abhay M. Joshi et al., "Monolithic InGaAs–on–silicon Wave Infrared Detector Arrays," *Intn. Society for Optical Engineering*, vol. 2999, pp. 211–224.

Bruley et al., "Nanostructure and Chemistry of a (100)MgO/(100) GaAs Interface," *Appl. Phys Lett*, 65(5), Aug. 1994, pp. 564–566.

Fork et al., "Epitaxial MgO On Si(001) for Y–Ba–Cu–O Thin Film Growth by Pulsed Laser Deposition," *Appl. Phys Lett.*, 58(20), May 20, 1991, pp. 2294–2296.

Himpsel et al., "Dialectrics on Semiconductors," *Materials Science and Engineering*, B1(1988), pp. 9–13.

Li et al., "Epitaxial La$_{0.67}$Sr$_{0.33}$MnO$_3$ Magnetic Tunnel Junctions," *J. Appl. Phys.* 81(8), Apr. 15, 1997, pp. 5509–5511.

O'Donnell et al., "Colossal Magnetoresistance Magnetic Tunnel Junctions Grown by Molecular–Beam Epitaxy," *Appl. Physics Letters*, vol. 76, No. 14, Apr. 3, 2000, pp. 1914–1916.

Mikami et al., "Formation of Si Epi/MgO–Al$_2$O$_3$Epi./SiO$_3$/Si and Its Epitaxial Film Quality," Fundamental Research Laboratories and Microelectronics Laboratories, pp. 31–34, 1983.

T. Asano et al., "An Epitaxial Si/Insulator/Si Structure Prepared by Vacuum Deposition of CaF$_2$ and Silicon," *Thin Solid Films*, vol. 93 (1982), pp. 143–150.

T. Chikyow et al., "Reaction and Regrowth Control of CeO$_2$ on Si(111) Surface for the Silicon–On–Insulator Structure," *Appl. Phys. Lett.*, vol. 65, No. 8, Aug. 22, 1994, pp. 1030–1032.

J.F. Kang, et al., "Epitaxial Growth of CeO$_2$(100) Films on Si(100) Substrates by Dual Ion Beams Reactive Sputtering," *Solid State Communications*, vol. 108, No. 4, pp. 225–227, 1998.

R.A. Morgan et al., "Vertical–Cavity Surface–Emitting Lasers Come of Age," *SPIE*, vol. 2683, pp. 18–29.

"Technical Analysis of Qualcomm QCP–800 Portable Cellular Phone (Transmitter Circuitry)," Tatus Corporation, Qualcomm QCP–800 Technical Analysis Report, Dec. 10, 1996, pp. 5–8.

Jo–Ey Wong, et al.; "An Electrostatically–Actuated Mems Switch for Power Applications"; IEEE, 2000; pp. 633–638.

T. Mizuno, et al.; "Electron and Hole Mobility Enhancement in Strained–Si MOSFET's on SiGe–on–Insulator Substrates Fabricated by SIMOX Technology"; IEEE Electron Device Letters, vol. 21. No. 5, May 2000; pp. 230–232.

F.M. Buffer, et al.; "Strain–dependence of electron transport in bulk Si and deep–submicron MOSFET's" Computatural Electronics, 2000, Book of Abstracts, IWCE Glasgow 2000, 7$^{th}$ Int'l Workshop on, 2000; pp. 64–65.

S.S. Lu, et al.; "Piezoelectric field effect transistor (PEFET) using In$_{0.2}$Ga$_{0.8}$As/Al$_{0.35}$Ga$_{0.65}$As/In$_{0.2}$Ga$_{0.8}$As/GaAs Strained layer structure on (111)B GaAs substrate"; Electronics Letters, 12$^{TH}$ Ma 1994, vol. 30, No. 10; pp. 823–825.

Klhong Kim, et al. "On–Chip Wireless Interconnection with Integrated Antennas"; 2000 IEEE; pp. 20.2.1–20.3.4.

G. Passiopoulos, et al.; "V–Band Single Chip, Direct Carrier BPSK Modulation Transmitter with Integrated Patch Antenna"; 1998 IEEE MIT-S Digest; pp. 305–308.

Mau–Chung Frank Chang, et al.; "RF/Wireless Interconnect for Inter– and Intra–Chip Communications"; Proceedings of the IEEE, vol. 89, No. 4, Apr. 2001; pp. 456–466.

The Electronics Industry Report; Prismark; 2001; pp. 111–120.

J.K. Abrokwah, et al.; "A Manufacturable Complementary GaAs Process"; GaAs IC Symposium, IEEE, 1993; pp. 127–130.

H. Nagata, "A Preliminary Consideration of the Growth Behaviour of CeO$_2$, SrTIO$_3$ and SrVO$_3$ Films on Si Substrate," *Thin Solid Films*, 224, 1993, pp. 1–3.

Nagata et al., "Heteroepitaxial Growth of CeO$_2$(001) Films on Si(001) Substrates by Pulsed Laser Deposition in Ultrahigh Vacuum," *Jpn. Jour. Appl. Phys.*, vol. 30, No. 6B, Jun. 1991, pp. L1136–L1138.

Kado et al., "Heteroepitaxial Growth of SrO Films on Si Substrates," *J. Appl. Phys.*, 61(6), Mar. 15, 1987, pp. 2398–2400.

H. Ishiwara et al., "Epitaxial Growth of Perovskite Type Oxide Films on Substrates"; *Materials Research Symposium Proceedings*, vol. 220, pp. 595–600, Apr. 29–May 3, 1991.

J.K. Abrokwah, et al.; "A Manufacturable High–Speed Low–Power Complementary GaAs Process"; Extended Abstracts of the 1994 International Conference on Solid State Devices and Materials, Yokohama, 1994, pp. 592–594.

C.J. Palmstrom et al.; "Stable and Epitaxial Contacts to III–V Compound Semiconductors"; Contacts to Semiconductors Fundamentals and Technology; Nyoles Publications, 1993; pp. 67–150.

Jayshri Sabarinathat, et al.; "Submicron three–dimensional infrared GaAs/Al$_x$O$_y$–based photonic crystal using single–step epitaxial growth"; Applied Physics Letters, vol. 78, No. 20, May 14, 2001; pp. 3024–3026.

Philip Ball; "The Next Generation of Optical Fibers"; Technology Review, May 2001; pp. 55–61.

John D. Joannopoulos, et al.; "Molding the Flow of Light"; Photonic Crystals; Princeton University Press, 1995.

Thomas F. Krauss, et al.; "Photonic crystals in the optical regime—past, present and future"; Progress in Quantum Electronics 23 (1999) 51–96.

G. H. Jin, et al.; "PLZT Film Waveguide Mach–Zehnder Electrooptic Modulator"; Journal of Lightwave Technology, vol. 18, No. 6. Jun. 2000; pp. 807–812.

D.E. Aspnes, et al.; "Steps on (001) silicon surfaces"; J. Vac. Sci. Technol. B, vol. 5, No. 4, Jul./Aug. 1987; pp. 939–944.

D.M. Newns, et al.; "Mott transition field effect transistor"; Applied Physics Letters, vol. 73, No. 6, Aug. 10, 1998; pp. 780–782.

Lucent Technologies, Inc. "Arrayed Waveguide Grating Multiplexer/Demultiplexer"; Jan. 2000, 4 pages.

Hisashi Shichijo, et al.; "Co–integration GaAs MESFET and SI CMOS Circuits"; IEEE Electron Device Letters, vol. 9, No. 9, Sep. 1988; pp. 444–446.

H. Shichijo, et al.; "GaAs MESFET and Si CMOS Cointegration and Circuit Techniques"; 1988 IEEE; GaAs IC Symposium –239–242.

H. Shichijo, et al.; "Monolithic Process for Co–Integration of GaAs and Silicon Circuits"; 1988 IEEE; pp. 778–781.

Z.H. Zhu, et al. "Growth of InGaAs multi–quantum wells at 1.3 m wavelength on GaAs compliant substrates"; Applied Physics Letters, vol. 72, No. 20, May 18, 1998; pp. 2598–2600.

Kurt Eisenbeiser, et al; "Metamorphic InAlAs/InGaAs Enhancement Mode HEMT's on GaAs Substrates"; IEEE Electron Device Letters, vol. 20, No. 10, Oct. 1999; pp. 507–509.

Tomonori Nagashima, et al.; "Three–Terminal Tandem Solar Cells With a Back–Contact Type Bottom Cell" Higashifuji Technical Center, Toyota Motor Corporation; 4 pages.

James Schellenberg, et al.; "Low–Loss, Planar Monolithic Baluns for K/Ka–Band Applications"; 1999 IEEE MTT–S Digest; pp. 1733–1736.

Arnold Leitner et al; "Pulsed Laser Deposition of Superconducting Strontium Titanate Thin–Films"; ; Session K11–Thin Films and Borocarbides; Mixed Session, Wednesday Afternoon; Mar. 19, 1997; Room 1202 B, Conv. Center (Abstract).

R.D. Vispute; "High quality optoelectronic grade epitaxial AlN films on $-Al_2O_3$, Si and 6H–SiC by pulsed laser deposition"; Thin Solid Films 299 (1997), pp. 94–103.

T. Warran Weeks, et al.; "GaN thin films deposited via organometallic vapor phase epitaxy on (6H)–SiC(0001) using high–temperature monocrystalline AlN buffer layers" 320 Applied Physics Letters, vol. 67, No. 3, Jul. 17, 1995, pp401–403.

Z. Yu, et al.; "Epitaxial oxide thin films on SI(001)*"; J. Vac. Sci. Technol. B. vol. 18, No. 4, Jul./Aug. 2000; pp. 2139–2145.

Gentex Corporate Website; Photoelectric Smoke Detectors—How They Work: 2001.

Jeffrey B. Casady, et al.; "A Hybrid 6H–SiC Temperature Sensor Operational from 25 C to 500 C"; IEEE Transactions on Components, Packaging, and Manufacturing Technology—Part A, vol. 19, No. 3, Sep. 1996; pp. 416–422.

Ronald W. Waynant, et al.; "Optoelectric Integrated Circuits"; Electro–Optics Handbook, McGraw–Hill, Inc., 1994; Chapter Twenty Seven.

Antonio Mecozzi, et al.; "The Roles of Semiconductor Optical Amplifiers in Optical Networks"; Optics & Photonics News; Mar. 2001; pp. 37–42.

D.A. Francis, et al.; "A single–chip linear optical amplifier"; OFC, 2001; Mar. 17–22, 2001.

G. Vogg et al.; "Epitaxial alloy films of zinti–phase Ca(SI1–xGex)2"; Journal of Crystal Growth 223 (2001); pp. 573–576.

Peter S. Guilfoyle, et al.; "Optoelectronic Architecture for High–Speed Switching and Processing Applications"; 1998 The Photonics Design and Applications Handbook; pp. H–399–H–406.

Gerald B. Stringfellow; "Organometallic Vapor–Phase Epitaxy: Theory and Practice"; Departments of Materials Science and Engineering and Electrical Engineering, University of Utah; Academic Press, 1989.

M.A. Herman, et al.; "Molecular Beam Epitaxy Fundamentals and Current Status"; Springer–Verlag Berlin Heidelberg, 1989, 1996.

"Integration of GaAs on Si Using a Spinel Buffer Layer", IBM Technical Bulletin, vol. 30, No. 6, Nov. 1987, p. 365.

"GaInAs Superconducting FET," IBM Technical Bulletin, vol. 36, No. 8, Aug. 1993, p. 655–656.

"Epitaxial 3d Structure Using Mixed Spinels," IBM Technical Bulletin, vol. 30, No. 3, Aug. 1987, p. 1271.

Moon et al., "Roles of Buffer Layers in Epitaxial Growth of $SrTiO_3$ Films on Silicon Substrates," *Japan J of Appl. Phys.*, vol. 33, Mar. 1994, pp. 1472–1477.

Yodo et al., GaAs Heteroepitaxial Growth on Si Substrates with Thin Si Interlayers in situ Annealed at High Temperatures, 8257b *Journal of Vacuum Science & Technology*, May/Jun. 1995, vol. 13, No. 3, pp. 1000–1005.

Cuomo et al., "Substrate Effect on the Superconductivity of $YBa_2 Cu_3 O_7$ Thin Films," AIP Conference 1988, pp. 141–148.

McKee et al., "Crystalline Oxides on Silicon: The First Five Monolayers," *Physical Review Letters*, vol. 81, No. 14, Oct. 1998, pp. 3014–3017.

McKee et al., "Molecular Beam Epitaxy Growth of Epitaxial Barium Silicide, Barium Oxide, and Barium Titanate on Silicon," *1991 American Institute of Physics*, pp. 782–784, Aug. 13, 1991.

Tambo et al., Molecular Beam Epitaxy Growth of $SrTiO_3$ Films on Si(100)–2x1 with SrO Buffer Layer, *Jpn. J. Appl. Phys.*, vol. 37, 1998, pp. 4454–4459.

McKee et al., "The MBE Growth and Optical Quality of $BaTiO_3$ and $SrTiO_3$ Thin Films on MgO," *Mat. Res. Soc. Symp. Proc.*, vol. 341, Apr. 1994, pp. 309–314.

McKee et al., "$BaSi_2$ and Thin Film Alkaline Earth Silicides on Silicon," *Appl. Phys. Lett.*, 63 (20), Nov. 1993, pp. 2818–2820.

McKee et al., "Surface Structures and the Orthohombic Transformation of Thin Film $BaSi_2$ on Silicon," *Mat. Res. Soc. Symp. Proc.*, vol. 221, pp. 131–136.

Brian A. Floyd, et al.; "The projected Power Consumption of a Wireless Clock Distribution System and Comparison to Conventional Distribution Systems"; IEEE, 1999; pp. IITC99–249–IITC99–250.

Mori et al., "Epitaxial Growth of $SrTIO_3$ Films on Si(100) Substrates Using a Focused Electron Beam Evaporation Method," *Jpn. J. of Apl. Phys.*, vol. 30, No. 8A, Aug. 1991, pp. L1415–L1417.

Moon et al., "Growth of Crystalline $SrTIO_3$ Films on Si Substrates Using Thin Fluoride Buffer Layers and Their Electrical Properties," *Jpn. J. of Appl. Phys.*, vol. 33, (1994), pp. 5911–5916.

Farrow et al., "Heteroepitaxy of Dissimilar Materials," *Mat. Res. Soc. Symposium Proceedings*, vol. 221, pp. 29–34, Apr. 29–May 2, 1991.

Ishiwara et al., "Heteroepitaxy on Silicon: Fundamentals, Structure, and Devices," *Mat. Res. Soc.*, Symposium Proceedings, vol. 116, pp. 369–374, Apr. 5–8, 1988.

Douglas B. Chrisey, et al; Pulsed Laser Deposition of Thin Films; pp. 273–285.

B.A. Block, et al; "Photoluminescence properties of $Er^3$–doped $BaTiO_3$ thin films"; Appl. Phys. Lett. 65 (1), Jul. 4, 1994, pp. 25–27.

Kevin J. Chen et al; "A Novel Ultrafast Functional Device: Resonant Tunneling High Electron Mobility Transistor"; Electron Devices Meetingk 1996; IEEE Hong Kong; Jun. 29, 1996; pp. 60–63, XP010210167.

Wenhua Zhu et al.; "Molecular Beam Epitaxy of GaAs on Si–on–Insulator"; 320 Applied Physics Letters 59(1991) Jul. 8 No. 2; pp. 210–212.

Umesh K. Mishra et al; "Oxide Based Compound Semiconductor Electronics"; Electron Devices Meeting; 1997; Technical Digest, International; Washington, D.C.; Dec. 7–10, 1997; pp. 545–548.

J.M. Daughton et al.; "Applications of Spin Dependent Transport Materials"; J. Phys. D. Appl. Phys. 32(1999) R169–R177.

Wei Zhang et al.; "Stress Effect and Enhanced Magnetoresistance in $La_{0.67}Ca_{0.33}MnO_{3-\delta}$ Films"; Physical Review, B. Condensed Matter; American Institute of Physics; vol. 58, No. 21, Part 1; Dec. 1, 1998; pp. 14143–14146.

Q.-Y. Tong et al.; "IOS–a new type of materials combination for system–on–a chip preparation"; 1999 IEEE International SOI Conference, Oct. 1999; pp. 104–105.

T. Kanniainen et al.; "Growth of Dielectric 1hfo2/Ta2O5 Thin Film Nanolaminate Capacitors By Atomic Layer Epitaxy"; Electrochemical Society Proceedings, U.S. Electrochemical Society; Pennington, N.J.; Aug. 31, 1997; pp. 36–46.

Myung Bok Lee; "Heteroepitaxial Growth of BaTio$_3$ Films on Si by Pulsed Laser Deposition"; Applied Physics Letters; Mar. 13, 1995; pp. 1331–1333.

Myung Bok Lee; "Formation and Characterization of Eptiaxial TIO$_2$ and BaTIO$_3$/TIO$_2$ Films on SI Substrate"; Japan Journal Applied Physics Letters; vol. 34; 1995; pp. 808–811.

Gilbert Lecarpentier et al.; "High Accuracy Machine Automated Assembly for Opto Electronics"; 2000 Electronic Components and Technology Conference; pp. 1–4.

R. Ramesh; "Ferroelectric La–Sr–Co–O/Pb–Zr–Ti–O/La–Sr–Co–O Heterostructures on Silicon via Template Growth"; 320 Applied Physics Letters; 63(1993); Dec. 27; No. 26; pp. 3592–3594.

K. Eisenbeiser; "Field Effect Transistors with SiTiO$_3$ Gate Dielectric on Si"; Applied Physics Letters; vol. 76, No. 10; Mar. 6, 2000; pp. 1324–1326.

Stephen A. Mass; "Microwave Mixers"; Second Edition; 2pp.

Douglas J. Hamilton et al.; "Basic Integrated Circuit Engineering"; pp. 2; 1975.

Takeshi Obata; "Tunneling Magnetoresistance at Up to 270 K in La$_{0.8}$Sr$_{0.2}$MnO$_3$/SrTiO$_3$/La$_{0.8}$Sr$_{0.2}$MnO$_3$ Junctions with 1.6– nm–Thick Barriers"; Applied Physics Letters; vol. 74, No. 2; Jan. 11, 1999; pp. 290–292.

Wei Zhang et al.; "Enhanced Magnetoresistance in La–Ca–Mn–O Films on Si Substrates Using YbaCuO/CeO$_2$ Heterostructures"; Physica C; vol. 282–287, No. 2003; Aug. 1, 1997; pp. 1231–1232.

Shogo Imada et al; "Epitaxial Growth of Ferroelectric YmnO$_3$ Thin Films on Si (111) Substrates by Molecular Beam Epitaxy"; Jpn. J. Appl. Phys. vol. 37 (1998); pp. 6497–6501; Part 1, No. 12A, Dec. 1998.

Ladislav Pust et al.; "Temperature Dependence of the Magnetization Reversal in Co(fcc)–BN–Co(poly hcp) Structures"; Journal of Applied Physics; vol. 85, No. 8; Apr. 15, 1999; pp. 5765–5767.

C. Martinez; "Epitaxial Metallic Nanostructures on GaAs"; Surface Science; vol. 482–485; pp. 910–915; 2001.

Wen–Ching Shih et al.; "Theoretical Investigation of the SAW Properties of Ferroelectric Film Composite Structures"; IEEE Transactions of Ultrasonics, Ferroelectrics, and Frequency Control; vol. 45, No. 2; Mar. 1998; pp. 305–316.

Zhu Dazhong et al.; "Design of ZnO/SiO$_2$/Si Monolithic Integrated Programmable SAW Filter"; Proceedings of Fifth International Conference on Solid–State and Integrated Circuit Technology; 21–23; Oct. 1998; pp. 826–829.

Kirk–Othmer Encyclopedia of Chemical Technology; Fourth Edition, vol. 12; Fuel Resources to Heat Stabilizers; A Wiley–Interscience Publication; John Wiley & Sons.

Joseph W. Goodman et al; "Optical Interconnections For VLSI Systems"; Proceedings of the IEEE, vol. 72, No. 7 Jul. 1984.

Fathimulla et al.; "Monolithic Integration of InGaAs/InAlAs MODFETs and RTDs on InP–bonded–to Si Substrate"; Fourth International Conference on Indium Phosphide and Related Materials, Newport, RI, USA; Apr. 21–24, 1992; pp. 167–170; XP000341253; IEEE, New York, NY, USA; ISBN: 0–7803–0522–1.

H. Takahashi et al.; "Arrayed–Waveguide Grating For Wavelength Division Multi/Demultiplexer With Nanometre REsolution"; Electronics Letters; vol. 26, No. 2, Jan. 18, 1990.

Pierret, R.F.; "1/J–FET and MESFET"; Field Effect Devices; MA, Addison–Wesley; 1990; pp. 9–22.

M. Schreiter, et al.; "Sputtering of Self–Polarized PZT Films for IR–Detector Arrays"; 1998 IEEE; pp. 181–185.

Hideaki Adachi et al.; "Sputtering Preparation of Ferroelectric PLZT Thin Films and Their Optical Applications"; IEEE Transactions of Ultrasonics, Ferroelectrics and Frequency Control, vol. 38, No. 6, Nov. 1991.

A.J. Moulson et al.; "Electroceramics Materials Properties Applications"; Chapman & Hall; pp. 366–369.

P.A. Langjahr et al.; "Epitaxial Growth and Structure of Cubic and Pseudocubic Perovskite Films on Perovskite Substrates"; Mat. Res. Soc. Symp. Proc., vol. 401; 1995 Materials Research Society; pp. 109–114.

Wang et al.; "Depletion–Mode GaAs MOSFETs with Negligible Drain Current Drift and Hysteresis"; Electron Devices Meeting, 1998, IEDM '98 Technical Digest; pp. 67–70.

Ben G. Streetman; "Solid State Electronic Devices"; 1990, Prentice Hall; Third Edition; pp. 320–322.

A. Y Wu et al.; "Highly Oriented (Pb,La)(Zr,Ti)O$_3$ Thin Films on Amorphous Substrates"; IEEE, 1992; pp. 301–304.

Timothy E. Glassman et al.; "Evidence for Cooperative Oxidation of MoCVD Precursors Used in Ba$_x$Sr$_{1-x}$TiO$_3$ Film Growth"; Mat. Res. Soc. Symp. Proc. vol. 446, 1997 Materials Research Society; pp. 321–326.

S.N. Subbarao et al.; "Monolithic PIN Photodetector and FET Amplifier on GaAs–os–Si"; IEEE; GaAs IC Symposium–163–166; 1989.

T.A. Langdo et al.; "High Quality Ge on Si by Epitaxial Necking"; Applied Physics Letters; vol. 76, No. 25; pp. 3700–3702; Jun. 19, 2000.

Chenning Hu et al.; Solar Cells From Basics to Advanced Systems; McGraw–Hill Book Company; 1983.

O.J. Painter et al; "Room Temperature Photonic Crystal Defect Lasers at Near–Infrared Wavelengths in InGaAsp"; Journal of Lightwave Technology, vol. 17, No. 11; Nov. 1999.

C. Donn et al.; "A 16–Element, K–Band Monolithic Active Receive Phased Array Antenna"; Antennas and Propagation Society International Symposium, 1988; pp. 188–191, vol. 1; Jun. 6–10, 1988.

Don W. Shaw; "Epitaxial GaAs on Si: Progress and Potential Applications"; Mat. Res. Soc. Symp. Proc.; pp. 15–30; 1987.

G.J.M. Dormans, et al.; "PbTiO/$_3$/Thin Films Grown by Organometallic Chemical Vapour Deposition"; Third International Symposium on Integrated Ferroelectrics; Apr. 3–5, 1991 (Abstract).

P.J. Borrelli et al.; "Compositional and Structural Properties of Sputtered PLZT Thin Films"; Ferroelectric Thin Films II Symposium; Dec. 2–4, 1991 (Abstract).

Ranu Nayak et al; "Enhanced acousto–optic diffraction efficiency in a symmetric SrRiO3/BaTiO3/SrTiO3 thin–film heterostructure"; Nov. 1, 2000; vol. 39, No. 31; Applied Optics; pp. 5847–5853.

Ranu Nayak et al; "Studies on acousto–optical interaction in SrTiO3/BaTiO3/SrTiO3 epitaxial thin film heterostructures"; J. Phys. D: Appl. Phys. 32 (1999) 380–387.

S.K. Tewksbury et al.; "Cointegration of Optoelectronics and Submicron CMOS"; Wafer Scale Integration; 1993; Proceedings, Fifth Annual IEEE; Jan. 20, 1993; pp. 358–367.

V. Kaushik et al.; "Device Characteristics of Crystalline Epitaxial Oxides on Silicon"; Device Research Conference, 2000; Conference Digest 58th DRC; pp. 17–20; Jun. 19–21, 2000.

Katherine Derbyshire; "Prospects Bright for Optoelectronics Volume, Cost Drive Manufacturing for Optical Applications"; Semiconductor Magazine; vol. 3, No. 3; Mar. 2002.

Alex Chediak et al; "Integration of GaAs/Si with Buffer Layers and Its Impact on Device Integration": TICS 4, Prof. Sands. MSE 225, Apr. 12, 2002; pp. 1–5.

S.A. Chambers et al; "Band Discontinuities at Epitaxial SrTiO3/Si(001) Heterojunctions"; Applied Physics Letters; vol. 77, No. 11; Sep. 11, 2000; pp. 1662–1664.

H. Wang et al.; "GaAs/GaAlAs Power HBTs for Mobile Communications"; Microwave Symposium Digest; 1993 IEEE; vol. 2.; pp. 549–552.

Y. Ota et al.; "Application of Heterojunction FET to Power Amplifier to Cellular Telephone"; Electronics Letters; May 26, 1994; vol. 30, No. 11; pp. 906–907.

Keilchi Sakuno et al; "A 3.5W HBT MMIC Power Amplifier Module for Mobile Communications"; IEEE 1994; Microwave and Millimeter–Wave Monolithic Circuits Symposium; pp. 63–66.

Misubishi Semiconductors Press Release (GaAs FET's) Nov. 8, 1999 pp. 1–2.

R.J. Matyi et al; "Selected Area Heteroepitaxial Growth of GaAs on Silicon for Advanced Device Structures"; 2194 Thin Solid Films; 181 (1989) Dec. 10; No. 1; pp. 213–225.

K. Nashimoto et al; "Patterning of Nb, LaOnZr, TiO3 Waveguides for Fabricating Micro–Optics Using Wet Etching and Solid–Phase Epitaxy"; Applied Physics Letters; vol. 75, No. 8; Aug. 23, 1999; pp. 1054–1056.

Bang–Hung Tsao et al; "Sputtered Barium Titanate and Barium Strontium Titanate Films for Capacitor Applications"; Applications of Ferroelectrics, 2000; Proceedings of the 2000 12th International Symposium on vol. 2; pp. 837–840.

Man Fal Ng et al; "Heteroepitaxial growth of lanthanum aluminate films derived from mixed metal nitrates"; Journal of Materials Research; vol. 12, No. 5; pp. 1306.

Yuji Matsumoto et al.; "Room–Temperature Ferromagnetism in Transparent Transition Metal–Doped Titanium Dioxide"; Science; Feb. 2, 2001; vol. 291; pp. 854–856.

S.A. Chambers et al.; "Epitaxial Growth and Properties of Ferromagnetic Co–Doped TiO2 Anatase"; Applied Physics Letters; vol. 79, No. 21; Nov. 19, 2001; pp. 3467–3469.

Peter Weiss; "Speed demon gets hooked on silicon"; Science News Online; Sep. 15, 2001; pp. 1–3.

"Motorola Develops New Super–Fast Chip"; USA Today; Sep. 4, 2001.

Lori Vallgra; "Motorola Lays GaAs on Si Wafer"; AsiaBiz Tech; Nov. 2001pp. 1–3.

"Holy Graill Motorola Claims High–Yield GaAs Breakthrough"; Micromagazine.com (no date available); pp. 1–3.

Jong–Gul Yoon; "Growth of Ferroelectric LiNbO3 Thin Film on MgO–Buffered Si by the Sol–Gel Method"; Journal of the Korean Physical Society (Proc. Suppl.); vol. 29, Nov. 1996; pp. S648–S651.

V. Bomand et al.; "Deposition of LiTaO3 thin films by pyrosol process"; Thin Solid Films 304 (1997); pp. 239–244.

R. Droopad et al.; "Development of high dielectric constant epitaxial oxides on silicon by molecular beam epitaxy"; Materials Science and Engineering B87 (2001); pp. 292–296.

A.K. Sharma et al.; "Integration of Pb(Zr0.52Ti0.48)O3 epilayers with Si by domain epitaxy"; Applied Physics Letters, vol. 76, No. 11; Mar. 13, 2000; pp. 1458–1460.

Dwight C. Streit et al; "High Reliability GaAs–AlGaAs HBT's by MBE with Be Base Doping and InGaAs Emitter Contacts"; 8179 Ieee Electron Device Letters; 12(1991) Sep., No. 9, New York, US.

C. Y. Hung et al; "Piezoelectrically induced stress tuning of electro–optic devices"; 320 Applied Physics Letters; 59(1991) Dec. 30, No. 27, New York, US.

J. Piprek; "Heat Flow Analysis of Long–Wvelength VCSELs with Various DBR Materials"; University of Delaware, Materials Science, Newark, DE, 19716–3106; Oct. 31, 1994; pp. 286–287.

P. Mackowlak et al.; "Some aspects of designing an efficient nitride VCSEL resonator"; J. Phys. D: Appl. Phys. 34(2001); pp. 954–958.

M.R. Wilson et al.; "GaAs–On–Si: A GaAs IC Manufacturer's Perspective"; GaAs IC Symposium, IEEE, 1988; pp. 243–246.

Y. Kitano et al.; "Thin film crystal growth of BaZrO3 at low oxygen partial pressure"; Journal of Crystal Growth 243 (2002); pp. 164–169.

M.E. Hawley; et al; "Microstructural Study of Colossal Magneto–Resistive Films As a Function of Growth Temperature, As Deposited and Annealed"; 401, 1996; pp. 531–536.

* cited by examiner

STRUCTURE AND METHOD FOR FABRICATING SEMICONDUCTOR MICRORESONATOR DEVICES

FIELD OF THE INVENTION

This invention relates generally to semiconductor structures and devices and to a method for their fabrication, and more specifically to semiconductor structures and microresonator devices and to the fabrication and use of semiconductor structures, microresonator devices, and integrated circuits that include a monocrystalline material layer comprised of semiconductor material, compound semiconductor material, and/or other types of material such as metals and non-metals.

BACKGROUND OF THE INVENTION

Semiconductor devices often include multiple layers of conductive, insulating, and semiconductive layers. Often, the desirable properties of such layers improve with the crystallinity of the layer. For example, the electron mobility and electron lifetime of semiconductive layers improve as the crystallinity of the layer increases. Similarly, the free electron concentration of conductive layers and the electron charge displacement and electron energy recoverability of insulative or dielectric films improve as the crystallinity of these layers increases.

For many years, attempts have been made to grow various monolithic thin films on a foreign substrate such as silicon (Si). To achieve optimal characteristics of the various monolithic layers, however, a monocrystalline film of high crystalline quality is desired. Attempts have been made, for example, to grow various monocrystalline layers on a substrate such as germanium, silicon, and various insulators. These attempts have generally been unsuccessful because lattice mismatches between the host crystal and the grown crystal have caused the resulting layer of monocrystalline material to be of low crystalline quality.

If a large area thin film of high quality monocrystalline material were available at low cost, a variety of semiconductor devices could advantageously be fabricated in or using that film at a low cost compared to the cost of fabricating such devices beginning with a bulk wafer of semiconductor material or in an epitaxial film of such material on a bulk wafer of semiconductor material. In addition, if a thin film of high quality monocrystalline material could be realized beginning with a bulk wafer such as a silicon wafer, an integrated device structure could be achieved that took advantage of the best properties of both the silicon and the high quality monocrystalline material.

Some functions related to microresonators have been unavailable or limited in current technologies because of the unavailability of a low cost wafer structure that includes high quality compound monocrystalline materials in thin layers over a silicon substrate. Existing microresonators include non-gained controlled resonators including those whose critical coupling is controlled by tuning the resonant wavelength by varying the effective index of refraction either through temperature control or by varying the refractive index of a material in the evanescent field region immediately surrounding the resonator (e.g. in an electro-optic polymer material). Another implementation of a gain-controlled resonator uses an optically emitting doped oxide material overlying the resonator that is photo-pumped.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
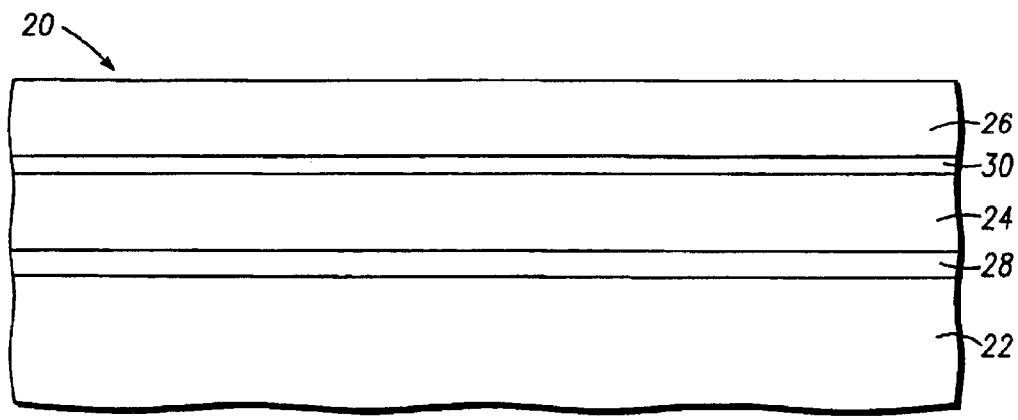
FIGS. 1–3 illustrate schematically, in cross section, device structures in accordance with various embodiments of the invention.

FIG. 1 illustrates schematically, in cross section, a portion of a semiconductor structure 20 in accordance with an embodiment of the invention. Semiconductor structure 20 includes a monocrystalline substrate 22, accommodating buffer layer 24 comprising a monocrystalline material, and a monocrystalline material layer 26. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry.

In accordance with one embodiment of the invention, structure 20 also includes an amorphous intermediate layer 28 positioned between substrate 22 and accommodating buffer layer 24. Structure 20 may also include a template layer 30 between the accommodating buffer layer and monocrystalline material layer 26. As will be explained more fully below, the template layer helps to initiate the growth of the monocrystalline material layer on the accommodating buffer layer. The amorphous intermediate layer helps to relieve the strain in the accommodating buffer layer and by doing so, aids in the growth of a high crystalline quality accommodating buffer layer.

Substrate 22, in accordance with an embodiment of the invention, is a monocrystalline semiconductor or compound semiconductor wafer, preferably of large diameter. The wafer can be of, for example, a material from Group IV of the periodic table. Examples of Group IV semiconductor materials include silicon, germanium, mixed silicon and germanium, mixed silicon and carbon, mixed silicon, germanium and carbon, and the like. Preferably substrate 22 is a wafer containing silicon or germanium, and most preferably is a high quality monocrystalline silicon wafer as used in the semiconductor industry. Substrate 22 may also be, for example, silicon-on-insulator (SOI), where a thin layer of silicon is on top of an insulating material such as silicon oxide or glass. Accommodating buffer layer 24 is preferably a monocrystalline oxide or nitride material epitaxially grown on the underlying substrate. In accordance with one embodiment of the invention, amorphous intermediate layer 28 is grown on substrate 22 at the interface between substrate 22 and the growing accommodating buffer layer by the oxidation of substrate 22 during the growth of layer 24. The amorphous intermediate layer serves to relieve strain that might otherwise occur in the monocrystalline accommodating buffer layer as a result of differences in the lattice constants of the substrate and the buffer layer. As used herein, lattice constant refers to the distance between atoms of a cell measured in the plane of the surface. If such strain is not relieved by the amorphous intermediate layer, the strain may cause defects in the crystalline structure of the accommodating buffer layer. Defects in the crystalline structure of the accommodating buffer layer, in turn, would make it difficult to achieve a high quality crystalline structure in monocrystalline material layer 26 which may comprise a semiconductor material, a compound semiconductor material, or another type of material such as a metal or a non-metal.

Accommodating buffer layer 24 is preferably a monocrystalline oxide or nitride material selected for its crystalline compatibility with the underlying substrate and with the overlying material layer. For example, the material could be an oxide or nitride having a lattice structure closely matched to the substrate and to the subsequently applied monocrystalline material layer. Materials that are suitable for the accommodating buffer layer include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, and other perovskite oxide materials, and gadolinium oxide. Additionally, various nitrides such as gallium nitride, aluminum nitride, and boron nitride may also be used for the accommodating buffer layer. Most of these materials are insulators, although strontium ruthenate, for example, is a conductor. Generally, these materials are metal oxides or metal nitrides, and more particularly, these metal oxides or nitrides typically include at least two different metallic elements. In some specific applications, the metal oxides or nitrides may include three or more different metallic elements.

Amorphous interface layer 28 is preferably an oxide formed by the oxidation of the surface of substrate 22, and more preferably is composed of a silicon oxide. The thickness of layer 28 is sufficient to relieve strain attributed to mismatches between the lattice constants of substrate 22 and accommodating buffer layer 24. Typically, layer 28 has a thickness in the range of approximately 0.5–5 nm.

The material for monocrystalline material layer 26 can be selected, as desired, for a particular structure or application. For example, the monocrystalline material of layer 26 may comprise a compound semiconductor which can be selected, as needed for a particular semiconductor structure, from any of the Group IIIA and VA elements (III–V semiconductor compounds), mixed III–V compounds, Group II (A or B) and VIA elements (II–VI semiconductor compounds), mixed II–VI compounds, Group IV and VI elements (IV–VI semiconductor compounds), mixed IV–VI compounds, Group IV elements (Group IV semiconductors), and mixed Group IV compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), lead selenide (PbSe), lead telluride (PbTe), lead sulfide selenide (PbSSe), silicon (Si), germanium (Ge), silicon germanium (SiGe), silicon germanium carbide (SiGeC), and the like. However, monocrystalline material layer 26 may also comprise other semiconductor materials, metals, or non-metal materials which are used in the formation of semiconductor structures, devices and/or integrated circuits.

Appropriate materials for template 30 are discussed below. Suitable template materials chemically bond to the surface of the accommodating buffer layer 24 at selected sites and provide sites for the nucleation of the epitaxial growth of monocrystalline material layer 26. When used, template layer 30 has a thickness ranging from about 1 to about 10 monolayers.

Figure 2:
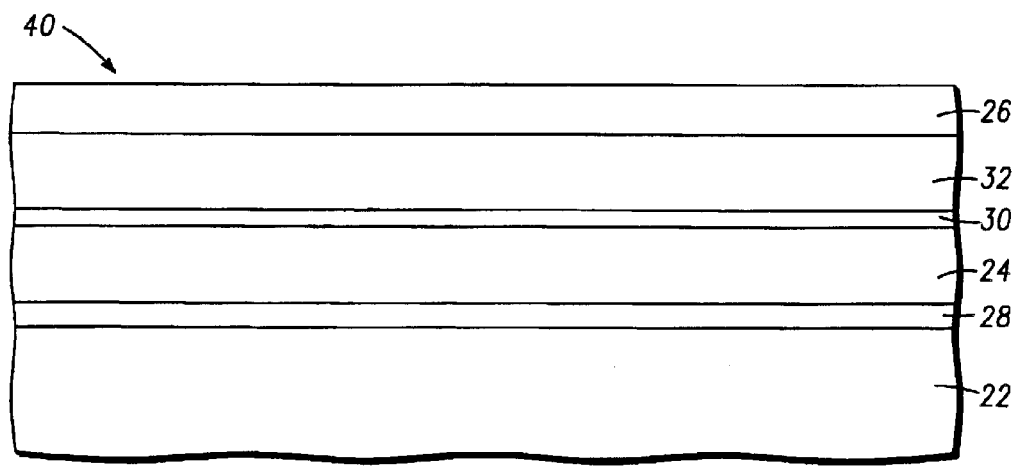

FIG. 2 illustrates, in cross section, a portion of a semiconductor structure 40 in accordance with a further embodiment of the invention. Structure 40 is similar to the previously described semiconductor structure 20, except that an additional buffer layer 32 is positioned between accommodating buffer layer 24 and monocrystalline material layer 26. Specifically, the additional buffer layer 32 is positioned between template layer 30 and the overlying layer of monocrystalline material. The additional buffer layer, formed of a semiconductor or compound semiconductor material when the monocrystalline material layer 26 comprises a semiconductor or compound semiconductor material, serves to provide a lattice compensation when the lattice constant of the accommodating buffer layer cannot be adequately matched to the overlying monocrystalline semiconductor or compound semiconductor material layer.

Figure 3:
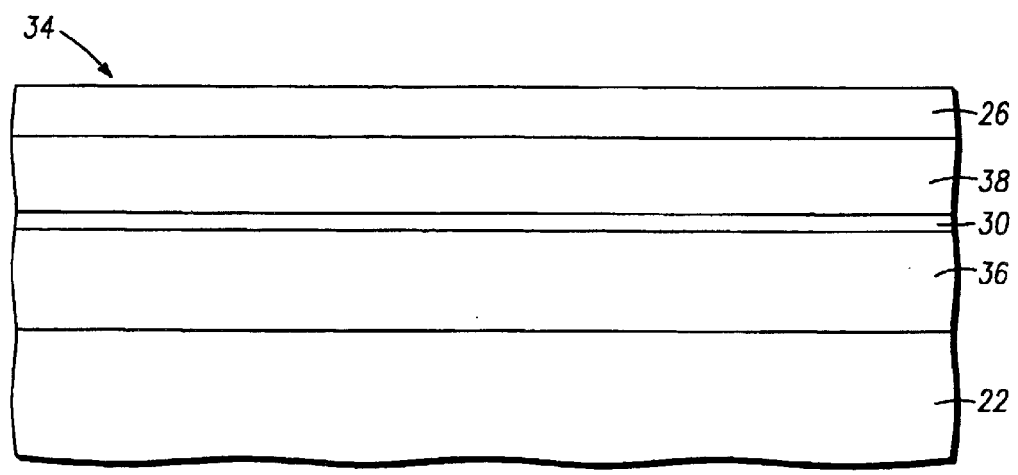

FIG. 3 schematically illustrates, in cross section, a portion of a semiconductor structure 34 in accordance with another exemplary embodiment of the invention. Structure 34 is similar to structure 20, except that structure 34 includes an amorphous layer 36, rather than accommodating buffer layer 24 and amorphous interface layer 28, and an additional monocrystalline layer 38.

As explained in greater detail below, amorphous layer 36 may be formed by first forming an accommodating buffer layer and an amorphous interface layer in a similar manner to that described above. Monocrystalline layer 38 is then formed (by epitaxial growth) overlying the monocrystalline accommodating buffer layer. The accommodating buffer layer may then be optionally exposed to an anneal process to convert at least a portion of the monocrystalline accommodating buffer layer to an amorphous layer. Amorphous layer 36 formed in this manner comprises materials from both the accommodating buffer and interface layers, which amorphous layers may or may not amalgamate. Thus, layer 36 may comprise one or two amorphous layers. Formation of amorphous layer 36 between substrate 22 and additional monocrystalline layer 26 (subsequent to layer 38 formation) relieves stresses between layers 22 and 38 and provides strain relief for subsequent processing—e.g., monocrystalline material layer 26 formation.

The processes previously described above in connection with FIGS. 1 and 2 are adequate for growing monocrystalline material layers over a monocrystalline substrate. However, the process described in connection with FIG. 3, which includes transforming at least a portion of a monocrystalline accommodating buffer layer to an amorphous oxide layer, may be better for growing monocrystalline material layers because it allows any strain in layer 26 to relax.

Additional monocrystalline layer 38 may include any of the materials described throughout this application in connection with either of monocrystalline material layer 26 or additional buffer layer 32. For example, when monocrystalline material layer 26 comprises a semiconductor or compound semiconductor material, layer 38 may include monocrystalline Group IV, monocrystalline compound semiconductor materials, or other monocrystalline materials including oxides and nitrides.

In accordance with one embodiment of the present invention, additional monocrystalline layer 38 serves as an anneal cap during layer 36 formation and as a template for subsequent monocrystalline layer 26 formation. Accordingly, layer 38 is preferably thick enough to provide a suitable template for layer 26 growth (at least one monolayer) and thin enough to allow layer 38 to form as a substantially defect free monocrystalline material.

In accordance with another embodiment of the invention, additional monocrystalline layer 38 comprises monocrystalline material (e.g., a material discussed above in connection with monocrystalline layer 26) that is thick enough to form devices within layer 38. In this case, a semiconductor structure in accordance with the present invention does not include monocrystalline material layer 26. In other words, the semiconductor structure in accordance with this embodiment only includes one monocrystalline layer disposed above amorphous oxide layer 36.

The following non-limiting, illustrative examples illustrate various combinations of materials useful in structures 20, 40, and 34 in accordance with various alternative embodiments of the invention. These examples are merely illustrative, and it is not intended that the invention be limited to these illustrative examples.

EXAMPLE 1

In accordance with one embodiment of the invention, monocrystalline substrate 22 is a silicon substrate typically (100) oriented. The silicon substrate can be, for example, a silicon substrate as is commonly used in making complementary metal oxide semiconductor (CMOS) integrated circuits having a diameter of about 200–300 mm. In accordance with this embodiment of the invention, accommodating buffer layer 24 is a monocrystalline layer of $Sr_zBa_{1-z}TiO_3$ where z ranges from 0 to 1 and the amorphous intermediate layer is a layer of silicon oxide ($SiO_x$) formed at the interface between the silicon substrate and the accommodating buffer layer. The value of z is selected to obtain one or more lattice constants closely matched to corresponding lattice constants of the subsequently formed layer 26. The lattice structure of the resulting crystalline oxide exhibits a substantially 45 degree rotation with respect to the substrate silicon lattice structure. The accommodating buffer layer can have a thickness of about 2 to about 100 nanometers (nm) and preferably has a thickness of about 5 nm. In general, it is desired to have an accommodating buffer layer thick enough to isolate the monocrystalline material layer 26 from the substrate to obtain the desired electrical and optical properties. Layers thicker than 100 nm usually provide little additional benefit while increasing cost unnecessarily; however, thicker layers may be fabricated if needed. The amorphous intermediate layer of silicon oxide can have a thickness of about 0.5–5 nm, and preferably a thickness of about 1 to 2 nm.

In accordance with this embodiment of the invention, monocrystalline material layer 26 is a compound semiconductor layer of gallium arsenide (GaAs) or aluminum gallium arsenide (AlGaAs) having a thickness of about 1 nm to about 100 micrometers ($\mu$m) and preferably a thickness of about 0.5 $\mu$m to 10 $\mu$m. The thickness generally depends on the application for which the layer is being prepared. To facilitate the epitaxial growth of the gallium arsenide or aluminum gallium arsenide on the monocrystalline oxide, a template layer is formed by depositing a surfactant layer comprising one element of the compound semiconductor layer to react with the surface of the oxide layer that has been previously capped. The capping layer is preferably up to 3 monolayers of Sr—O, Ti—O, strontium or titanium. The template layer is preferably of Sr—Ga, Ti—Ga, Ti—As, Ti—O—As, Ti—O—Ga, Sr—O—As, Sr—Ga—O, Sr—Al—O, or Sr—Al. The thickness of the template layer is preferably about 0.5 to about 10 monolayers, and preferably about 0.5–3 monolayers. By way of a preferred example 0.5–3 monolayers of Ga deposited on a capped Sr—O terminated surface have been illustrated to successfully grow GaAs layers. The resulting lattice structure of the compound semiconductor material exhibits a substantially 45 degree rotation with respect to the accommodating buffer layer lattice structure.

EXAMPLE 2

In accordance with a further embodiment of the invention, monocrystalline substrate 22 is a silicon substrate as described above. The accommodating buffer layer is a monocrystalline oxide of strontium or barium zirconate or hafnate in a cubic or orthorhombic phase with an amorphous intermediate layer of silicon oxide formed at the interface between the silicon substrate and the accommodating buffer layer. The accommodating buffer layer can have a thickness of about 2–100 nm and preferably has a thickness of at least 4 nm to ensure adequate crystalline and surface quality and is formed of monocrystalline $SrZrO_3$, $BaZrO_3$, $SrHfO_3$, $BaSnO_3$ or $BaHfO_3$. For example, a monocrystalline oxide layer of $BaZrO_3$ can grow at a temperature of about 700 degrees C. The lattice structure of the resulting crystalline oxide exhibits a substantially 45 degree rotation with respect to the substrate silicon lattice structure.

An accommodating buffer layer formed of these zirconate or hafnate materials is suitable for the growth of a monocrystalline material layer which comprises compound semiconductor materials in an indium phosphide (InP) system. In this system, the compound semiconductor material can be, for example, indium phosphide (InP), indium gallium arsenide (InGaAs), aluminum indium arsenide, (AlInAs), or aluminum gallium indium arsenic phosphide (AlGaInAsP), having a thickness of about 1.0 nm to 10 μm. A suitable template for this structure is about 0.5–10 monolayers of one of a material M-N and a material M-O-N, wherein M is selected from at least one of Zr, Hf, Ti, Sr, and Ba; and N is selected from at least one of As, P, Ga, Al, and In. Alternatively, the template may comprise 0.5–10 monolayers of gallium (Ga), aluminum (Al), indium (In), or a combination of gallium, aluminum or indium, zirconium-arsenic (Zr—As), zirconium-phosphorus (Zr—P), hafnium-arsenic (Hf—As), hafnium-phosphorus (Hf—P), strontium-oxygen-arsenic (Sr—O—As), strontium-oxygen-phosphorus (Sr—O—P), barium-oxygen-arsenic (Ba—O—As), indium-strontium-oxygen (In—Sr—O), or barium-oxygen-phosphorus (Ba—O—P), and preferably 0.5–2 monolayers of one of these materials. By way of an example, for a barium zirconate accommodating buffer layer, the surface is terminated with 0.5–2 monolayers of zirconium followed by deposition of 0.5–2 monolayers of arsenic to form a Zr—As template. A monocrystalline layer of the compound semiconductor material from the indium phosphide system is then grown on the template layer. The resulting lattice structure of the compound semiconductor material exhibits a substantially 45 degree rotation with respect to the accommodating buffer layer lattice structure and a lattice mismatch between the buffer layer and (100) oriented InP of less than 2.5%, and preferably less than about 1.0%.

EXAMPLE 3

In accordance with a further embodiment of the invention, a structure is provided that is suitable for the growth of an epitaxial film of a monocrystalline material comprising a II–VI material overlying a silicon substrate. The substrate is preferably a silicon wafer as described above. A suitable accommodating buffer layer material is $Sr_xBa_{1-x}TiO_3$, where x ranges from 0 to 1, having a thickness of about 2–100 nm and preferably a thickness of about 3–10 nm. The lattice structure of the resulting crystalline oxide exhibits a substantially 45 degree rotation with respect to the substrate silicon lattice structure. Where the monocrystalline layer comprises a compound semiconductor material, the II–VI compound semiconductor material can be, for example, zinc selenide (ZnSe) or zinc sulfur selenide (ZnSSe). A suitable template for this material system includes 0.5–10 monolayers of zinc-oxygen (Zn—O) followed by 0.5–2 monolayers of an excess of zinc followed by the selenidation of zinc on the surface. Alternatively, a template can be, for example, 0.5–10 monolayers of strontium-sulfur (Sr—S) followed by the ZnSSe.

EXAMPLE 4

This embodiment of the invention is an example of structure 40 illustrated in FIG. 2. Substrate 22, accommodating buffer layer 24, and monocrystalline material layer 26 can be similar to those described in example 1. In addition, an additional buffer layer 32 serves to alleviate any strains that might result from a mismatch of the crystal lattice of the accommodating buffer layer and the lattice of the monocrystalline material. Buffer layer 32 can be a layer of germanium or a GaAs, an aluminum gallium arsenide (AlGaAs), an indium gallium phosphide (InGaP), an aluminum gallium phosphide (AlGaP), an indium gallium arsenide (InGaAs), an aluminum indium phosphide (AlInP), a gallium arsenide phosphide (GaAsP), or an indium gallium phosphide (InGaP) strain compensated superlattice. In accordance with one aspect of this embodiment, buffer layer 32 includes a $GaAs_xP_{1-x}$ superlattice, wherein the value of x ranges from 0 to 1. In accordance with another aspect, buffer layer 32 includes an $In_yGa_{1-y}P$ superlattice, wherein the value of y ranges from 0 to 1. By varying the value of x or y, as the case may be, the lattice constant is varied from bottom to top across the superlattice to create a substantial (i.e., effective) match between lattice constants of the underlying oxide and the overlying monocrystalline material which in this example is a compound semiconductor material. The compositions of other compound semiconductor materials, such as those listed above, may also be similarly varied to manipulate the lattice constant of layer 32 in a like manner. The superlattice can have a thickness of about 50–500 nm and preferably has a thickness of about 100–200 nm. The superlattice period can have a thickness of about 2–15 nm, preferably 2–10 nm. The template for this structure can be the same as that described in example 1. Alternatively, buffer layer 32 can be a layer of monocrystalline germanium having a thickness of 1–50 nm and preferably having a thickness of about 2–20 nm. In using a germanium buffer layer, a template layer of either germanium-strontium (Ge—Sr) or germanium-titanium (Ge—Ti) having a thickness of about 0.5–2 monolayers can be used as a nucleating site for the subsequent growth of the monocrystalline material layer which in this example is a compound semiconductor material. The formation of the oxide layer is capped with either a 0.5–2 monolayer of strontium or a 0.5–2 monolayer of titanium to act as a nucleating site for the subsequent deposition of the monocrystalline germanium. The layer of strontium or titanium provides a nucleating site to which the first monolayer of germanium can bond.

EXAMPLE 5

This example also illustrates materials useful in a structure 40 as illustrated in FIG. 2. Substrate material 22, accommodating buffer layer 24, monocrystalline material layer 26 and template layer 30 can be the same as those described above in example 2. In addition, additional buffer layer 32 is inserted between the accommodating buffer layer and the overlying monocrystalline material layer. The buffer layer, a further monocrystalline material which in this instance comprises a semiconductor material, can be, for example, a graded layer of indium gallium arsenide (InGaAs) or indium aluminum arsenide (InAlAs). In accordance with one aspect of this embodiment, additional buffer layer 32 includes InGaAs, in which the indium composition varies from 0% at the monocrystalline material layer 26 to about 50% at the accommodating buffer layer 24. The additional buffer layer 32 preferably has a thickness of about 10–30 nm. Varying the composition of the buffer layer from GaAs to InGaAs serves to provide an effective (i.e. substantial) lattice match between the underlying monocrystalline oxide material and the overlying layer of monocrystalline material which in this example is a compound semiconductor material. Such a buffer layer is especially advantageous if there is a lattice mismatch between accommodating buffer layer 24 and monocrystalline material layer 26.

EXAMPLE 6

This example provides exemplary materials useful in structure 34, as illustrated in FIG. 3. Substrate material 22, template layer 30, and monocrystalline material layer 26 may be the same as those described above in connection with example 1.

Amorphous layer 36 is an amorphous oxide layer which is suitably formed of a combination of amorphous intermediate layer materials (e.g., layer 28 materials as described above) and accommodating buffer layer materials (e.g., layer 24 materials as described above). For example, amorphous layer 36 may include a combination of $SiO_x$ and $Sr_zBa_{1-z}TiO_3$ (where z ranges from 0 to 1), which combine or mix, at least partially, during an anneal process to form amorphous oxide layer 36.

The thickness of amorphous layer 36 may vary from application to application and may depend on such factors as desired insulating properties of layer 36, type of monocrystalline material comprising layer 26, and the like. In accordance with one exemplary aspect of the present embodiment, layer 36 thickness is about 1 nm to about 100 nm, preferably about 1–10 nm, and more preferably about 3–5 nm.

Layer 38 comprises a monocrystalline material that can be grown epitaxially over a monocrystalline oxide material such as material used to form accommodating buffer layer 24. In accordance with one embodiment of the invention, layer 38 includes the same materials as those comprising layer 26. For example, if layer 26 includes GaAs, layer 38 also includes GaAs. However, in accordance with other embodiments of the present invention, layer 38 may include materials different from those used to form layer 26. In accordance with one exemplary embodiment of the invention, layer 38 is about 1 nm to about 500 nm thick.

Referring again to FIGS. 1–3, substrate 22 is a monocrystalline substrate such as a monocrystalline silicon or gallium arsenide substrate. The crystalline structure of the monocrystalline substrate is characterized by a lattice constant and by a lattice orientation. In similar manner, accommodating buffer layer 24 is also a monocrystalline material and the lattice of that monocrystalline material is characterized by a lattice constant and a crystal orientation. The lattice constants of the accommodating buffer layer and the monocrystalline substrate must be closely matched or, alternatively, must be such that upon rotation of one crystal orientation with respect to the other crystal orientation, a substantial match in lattice constants is achieved. In this context the terms "substantially equal" and "substantially matched" mean that there is sufficient similarity between the lattice constants to permit the growth of a high quality crystalline layer on the underlying layer.

Figure 4:
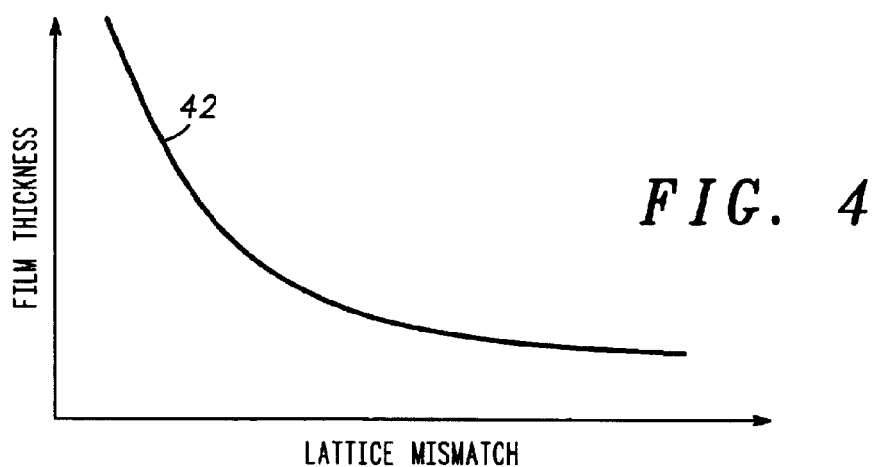
FIG. 4 illustrates graphically the relationship between maximum attainable film thickness and lattice mismatch between a host crystal and a grown crystalline overlayer.

FIG. 4 illustrates graphically the relationship of the achievable thickness of a grown crystal layer of high crystalline quality as a function of the mismatch between the lattice constants of the host crystal and the grown crystal. Curve 42 illustrates the boundary of high crystalline quality material. The area to the right of curve 42 represents layers that have a large number of defects. With no lattice mismatch, it is theoretically possible to grow an infinitely thick, high quality epitaxial layer on the host crystal. As the mismatch in lattice constants increases, the thickness of achievable, high quality crystalline layer decreases rapidly. As a reference point, for example, if the lattice constants between the host crystal and the grown layer are mismatched by more than about 2%, monocrystalline epitaxial layers in excess of about 20 nm cannot be achieved.

In accordance with one embodiment of the invention, substrate 22 is typically a (100) oriented monocrystalline silicon wafer and accommodating buffer layer 24 is a layer of strontium barium titanate. Substantial (i.e., effective) matching of lattice constants between these two materials is achieved by rotating the crystal orientation of the titanate material by approximately 45° with respect to the crystal orientation of the silicon substrate wafer. The inclusion in the structure of amorphous interface layer 28, a silicon oxide layer in this example, if it is of sufficient thickness, serves to reduce strain in the titanate monocrystalline layer that might result from any mismatch in the lattice constants of the host silicon wafer and the grown titanate layer. As a result, in accordance with an embodiment of the invention, a high quality, thick, monocrystalline titanate layer is achievable.

Still referring to FIGS. 1–3, layer 26 is a layer of epitaxially grown monocrystalline material and that crystalline material is also characterized by a crystal lattice constant and a crystal orientation. In accordance with one embodiment of the invention, the lattice constant of layer 26 differs from the lattice constant of substrate 22. To achieve high crystalline quality in this epitaxially grown monocrystalline layer, the accommodating buffer layer must be of high crystalline quality. In addition, in order to achieve high crystalline quality in layer 26, substantial matching between the crystal lattice constant of the host crystal, in this case, the monocrystalline accommodating buffer layer, and the grown crystal is desired. With properly selected materials this substantial matching of lattice constants is achieved as a result of rotation of the crystal orientation of the grown crystal with respect to the orientation of the host crystal. For example, if the grown crystal is gallium arsenide, aluminum gallium arsenide, zinc selenide, or zinc sulfur selenide and the accommodating buffer layer is monocrystalline $Sr_xBa_{1-x}TiO_3$, substantial matching of crystal lattice constants of the two materials is achieved, wherein the crystal orientation of the grown layer is rotated by substantially 45° with respect to the orientation of the host monocrystalline oxide. Similarly, if the host material is a strontium or barium zirconate or a strontium or barium hafnate or barium tin oxide and the compound semiconductor layer is indium phosphide or gallium indium arsenide or aluminum indium arsenide, substantial matching of crystal lattice constants can be achieved by rotating the orientation of the grown crystal layer by substantially 45° with respect to the host oxide crystal. In some instances, a crystalline semiconductor buffer layer 32 between the host oxide and the grown monocrystalline material layer 26 can be used to reduce strain in the grown monocrystalline material layer that might result from small differences in lattice constants. Better crystalline quality in the grown monocrystalline material layer can thereby be achieved.

The following example illustrates a process, in accordance with one embodiment of the invention, for fabricating a semiconductor structure such as the structures depicted in FIGS. 1–3. The process starts by providing a monocrystalline semiconductor substrate comprising silicon or germanium. In accordance with a preferred embodiment of the invention, the semiconductor substrate is a silicon wafer having a (100) orientation. The substrate is oriented on axis or, at most, about 6° off axis, and preferably misoriented 1–3° off axis toward the [110] direction. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process in accordance with the invention. In order to epitaxially grow a monocrystalline oxide layer overlying the monocrystalline substrate, the native oxide layer must first be removed to expose the crystalline structure of the underlying substrate. The following process is preferably carried out by molecular beam epitaxy (MBE), although other epitaxial processes may also be used in accordance with the present invention. The native oxide can be removed by first thermally depositing a thin layer (preferably 1–3 monolayers) of strontium, barium, a combination of strontium and barium, or other alkaline earth metals or combinations of alkaline earth metals in an MBE apparatus. In the case where strontium is used, the substrate is then heated to a temperature above 720° C. as measured by an optical pyrometer to cause the strontium to react with the native silicon oxide layer. The strontium serves to reduce the silicon oxide to leave a silicon oxide-free surface. The resultant surface may exhibit an ordered (2×1) structure. If an ordered (2×1) structure has not been achieved at this stage of the process, the structure may be exposed to additional strontium until an ordered (2×1) structure is obtained. The ordered (2×1) structure forms a template for the ordered growth of an overlying layer of a monocrystalline oxide. The template provides the necessary chemical and physical properties to nucleate the crystalline growth of an overlying layer.

It is understood that precise measurement of actual temperatures in MBE equipment, as well as other processing equipment, is difficult, and is commonly accomplished by the use of a pyrometer or by means of a thermocouple placed in close proximity to the substrate. Calibrations can be performed to correlate the pyrometer temperature reading to that of the thermocouple. However, neither temperature reading is necessarily a precise indication of actual substrate temperature. Furthermore, variations may exist when measuring temperatures from one MBE system to another MBE system. For the purpose of this description, typical pyrometer temperatures will be used, and it should be understood that variations may exist in practice due to these measurement difficulties.

In accordance with an alternate embodiment of the invention, the native silicon oxide can be converted and the substrate surface can be prepared for the growth of a monocrystalline oxide layer by depositing an alkaline earth metal oxide, such as strontium oxide, strontium barium oxide, or barium oxide, onto the substrate surface by MBE at a low temperature and by subsequently heating the structure to a temperature of above 720° C. At this temperature a solid state reaction takes place between the strontium oxide and the native silicon oxide causing the reduction of the native silicon oxide and leaving an ordered (2×1) structure on the substrate surface. If an ordered (2×1) structure has not been achieved at this stage of the process, the structure may be exposed to additional strontium until an ordered (2×1) structure is obtained. Again, this forms a template for the subsequent growth of an ordered monocrystalline oxide layer.

Following the removal of the silicon oxide from the surface of the substrate, in accordance with one embodiment of the invention, the substrate is cooled to a temperature in the range of about 200–600° C., preferably 350°–550° C., and a layer of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set at a minimum value to grow stoichiometric strontium titanate at a growth rate of about 0.1–0.8 nm per minute, preferably 0.3–0.5 nm per minute. After initiating growth of the strontium titanate, the partial pressure of oxygen is increased above the initial minimum value. The stoichiometry of the titanium can be controlled during growth by monitoring RHEED patterns and adjusting the titanium flux. The overpressure of oxygen causes the growth of an amorphous silicon oxide layer at the interface between the underlying substrate and the strontium titanate layer. This stage may be applied either during or after the growth of the strontium titanate layer. The growth of the amorphous silicon oxide layer results from the diffusion of oxygen through the strontium titanate layer to the interface where the oxygen reacts with silicon at the surface of the underlying substrate. The strontium titanate grows as an ordered (100) monocrystal with the (100) crystalline orientation rotated by 45° with respect to the underlying substrate. Strain that otherwise might exist in the strontium titanate layer because of the small mismatch in lattice constant between the silicon substrate and the growing crystal is relieved in the amorphous silicon oxide intermediate layer.

After the strontium titanate layer has been grown to the desired thickness, the monocrystalline strontium titanate is capped by a template layer that is conducive to the subsequent growth of an epitaxial layer of a desired monocrystalline material. For example, for the subsequent growth of a monocrystalline compound semiconductor material layer of gallium arsenide, the MBE growth of the strontium titanate monocrystalline layer can be capped by terminating the growth with up to 2 monolayers of titanium, up to 2 monolayers of strontium, up to 2 monolayers of titanium-oxygen or with up to 2 monolayers of strontium-oxygen. Following the formation of this capping layer, arsenic is deposited to form a Ti—As bond, a Ti—O—As bond or a Sr—O—As bond. Any of these form an appropriate template for deposition and formation of a gallium arsenide monocrystalline layer. Following the formation of the template, gallium is subsequently introduced to the reaction with the arsenic and gallium arsenide forms. Alternatively, 0.5–3 monolayers of gallium can be deposited on the capping layer to form a Sr—O—Ga bond, or a Ti—O—Ga bond, and arsenic is subsequently introduced with the gallium to form the GaAs.

Figure 5:
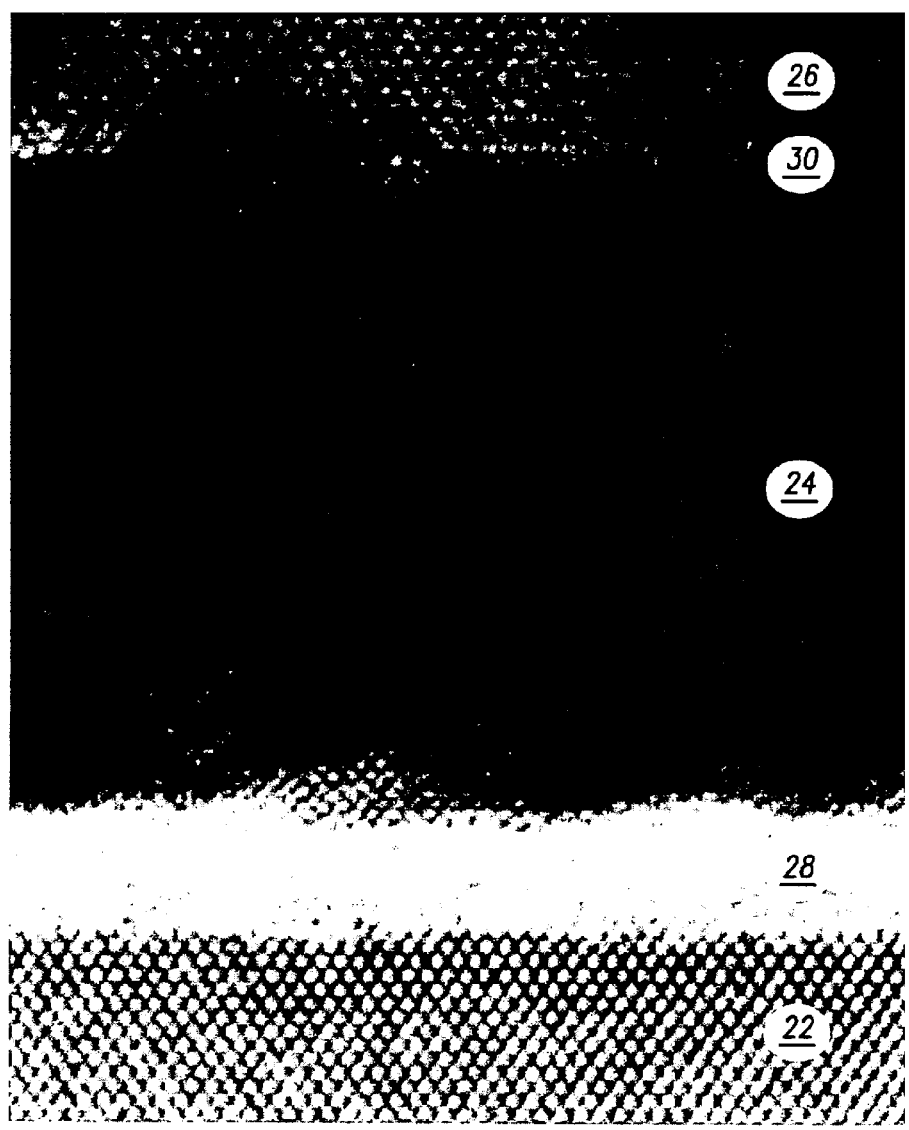
FIG. 5 illustrates a high resolution Transmission Electron Micrograph of a structure including a monocrystalline accommodating buffer layer.

FIG. 5 is a high resolution Transmission Electron Micrograph (TEM) of semiconductor material manufactured in accordance with one embodiment of the present invention. Single crystal SrTiO$_3$ accommodating buffer layer 24 was grown epitaxially on silicon substrate 22. During this growth process, amorphous interfacial layer 28 is formed, which relieves strain due to lattice mismatch. GaAs compound semiconductor layer 26 was then grown epitaxially using template layer 30.

Figure 6:
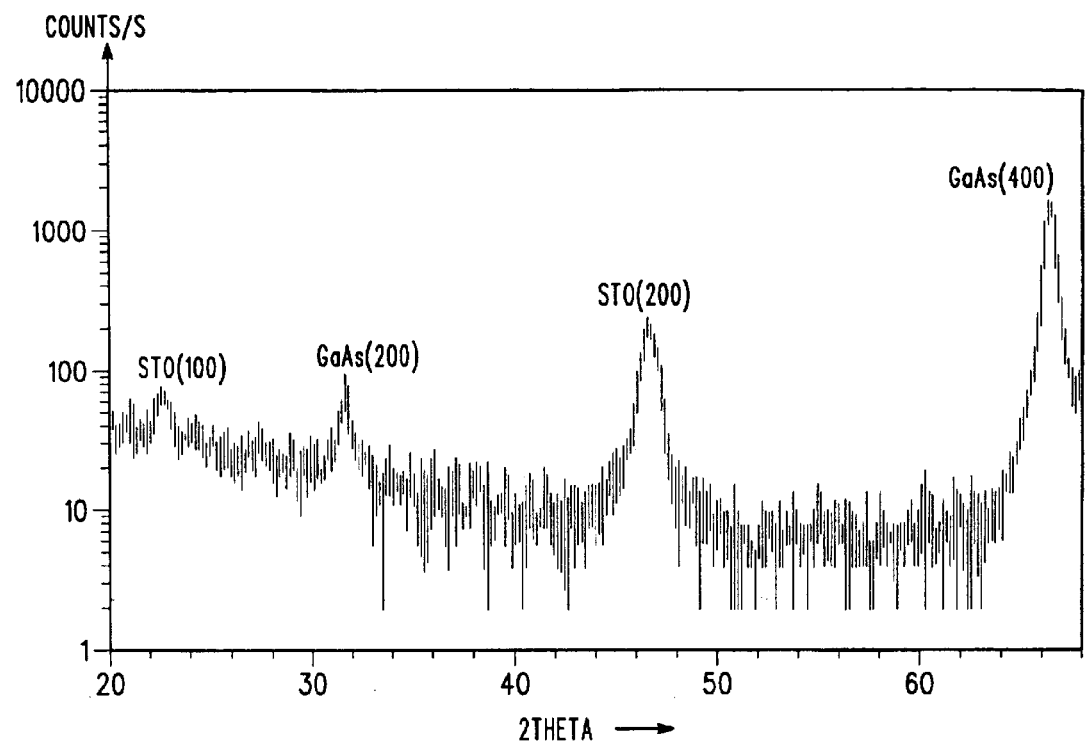
FIG. 6 illustrates an x-ray diffraction spectrum of a structure including a monocrystalline accommodating buffer layer.

FIG. 6 illustrates an x-ray diffraction spectrum taken on a structure including GaAs monocrystalline layer 26 comprising GaAs grown on silicon substrate 22 using accommodating buffer layer 24. The peaks in the spectrum indicate that both the accommodating buffer layer 24 and GaAs compound semiconductor layer 26 are single crystal and (100) oriented.

The structure illustrated in FIG. 2 can be formed by the process discussed above with the addition of an additional buffer layer deposition stage. The additional buffer layer 32 is formed overlying the template layer 30 before the deposition of the monocrystalline material layer 26. If the additional buffer layer 32 is a monocrystalline material comprising a compound semiconductor superlattice, such a superlattice can be deposited, by MBE for example, on the template 30 described above. If instead, the additional buffer layer is a monocrystalline material layer comprising a layer of germanium, the process above is modified to cap the first buffer layer of strontium titanate with a final template layer of either strontium or titanium and then by depositing germanium to react with the strontium or titanium. The germanium buffer layer can then be deposited directly on this template.

Structure 34, illustrated in FIG. 3, may be formed by growing an accommodating buffer layer 24, forming an amorphous oxide layer 28 over substrate 22, and growing semiconductor layer 38 over the accommodating buffer layer, as described above. The accommodating buffer layer 24 and the amorphous oxide layer 28 are then exposed to a higher temperature anneal process sufficient to change the crystalline structure of the accommodating buffer layer from monocrystalline to amorphous, thereby forming an amorphous layer such that the combination of the amorphous oxide layer and the now amorphous accommodating buffer layer form a single amorphous oxide layer 36. Layer 26 is then subsequently grown over layer 38. Alternatively, the anneal process may be carried out subsequent to growth of layer 26.

In accordance with one aspect of this embodiment, layer 36 is formed by exposing substrate 22, the accommodating buffer layer 24, the amorphous oxide layer 28, and monocrystalline layer 38 to a rapid thermal anneal process with a peak temperature of about 700° C. to about 1000° C. (actual temperature) and a process time of about 5 seconds to about 20 minutes. However, other suitable anneal processes may be employed to convert the accommodating buffer layer to an amorphous layer in accordance with the present invention. For example, laser annealing, electron beam annealing, or "conventional" thermal annealing processes (in the proper environment) may be used to form layer 36. When conventional thermal annealing is employed to form layer 36, an overpressure of one or more constituents of layer 38 may be required to prevent degradation of layer 38 during the anneal process. For example, when layer 38 includes GaAs, the anneal environment preferably includes an overpressure of arsenic to mitigate degradation of layer 38. Alternately, an appropriate anneal cap, such as silicon nitride, may be utilized to prevent the degradation of layer 38 during the anneal process with the anneal cap being removed after the annealing process.

As noted above, layer 38 of structure 34 may include any materials suitable for either of layers 32 or 26. Accordingly, any deposition or growth methods described in connection with either layer 32 or 26 may be employed to deposit layer 38.

Figure 7:
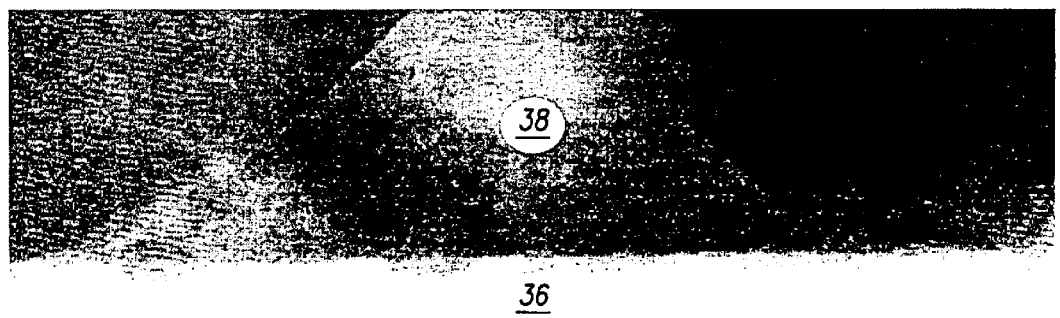
FIG. 7 illustrates a high resolution Transmission Electron Micrograph of a structure including an amorphous oxide layer.

FIG. 7 is a high resolution TEM of semiconductor material manufactured in accordance with the embodiment of the invention illustrated in FIG. 3. In accordance with this embodiment, a single crystal SrTiO$_3$ accommodating buffer layer was grown epitaxially on silicon substrate 22. During this growth process, an amorphous interfacial layer forms as described above. Next, additional monocrystalline layer 38 comprising a compound semiconductor layer of GaAs is formed above the accommodating buffer layer and the accommodating buffer layer is exposed to an anneal process to form amorphous oxide layer 36.

Figure 8:
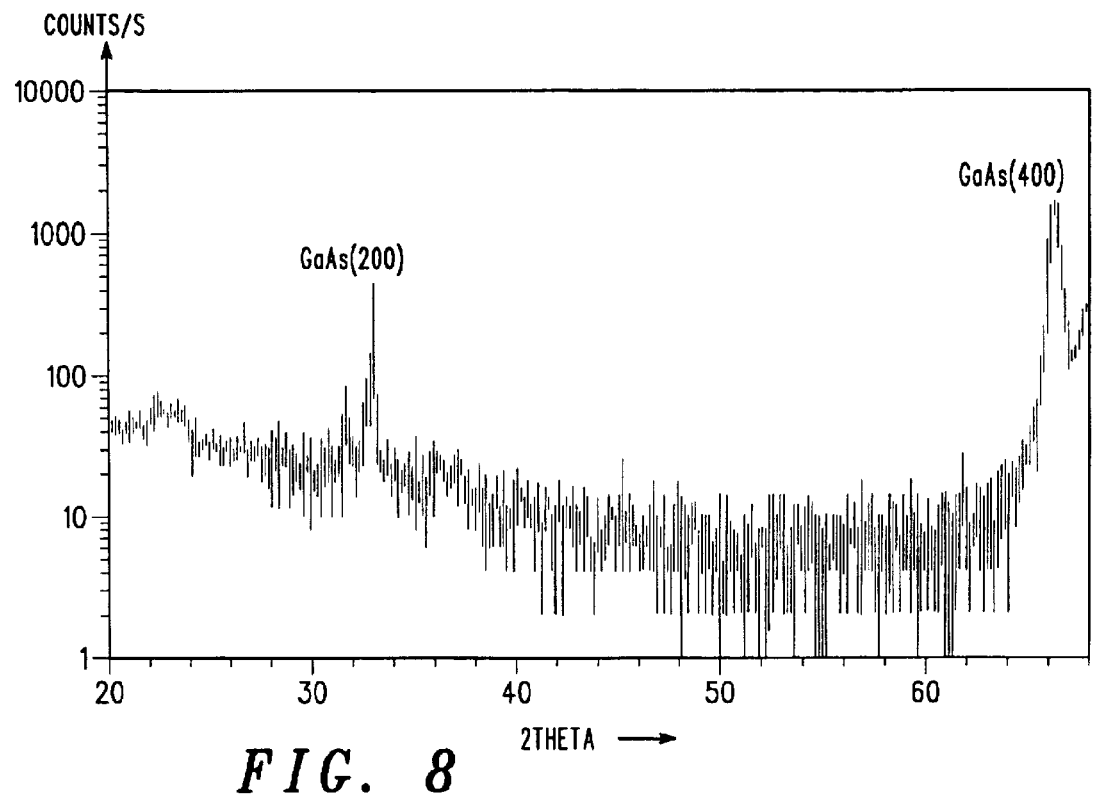
FIG. 8 illustrates an x-ray diffraction spectrum of a structure including an amorphous oxide layer.

FIG. 8 illustrates an x-ray diffraction spectrum taken on a structure including additional monocrystalline layer 38 comprising a GaAs compound semiconductor layer and amorphous oxide layer 36 formed on silicon substrate 22. The peaks in the spectrum indicate that GaAs compound semiconductor layer 38 is single crystal and (100) oriented and the lack of peaks around 40 to 50 degrees indicates that layer 36 is amorphous.

The process described above illustrates a process for forming a semiconductor structure including a silicon substrate, an overlying oxide layer, and a monocrystalline material layer comprising a gallium arsenide compound semiconductor layer by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like. Further, by a similar process, other monocrystalline accommodating buffer layers such as alkaline earth metal titanates, zirconates, hafnates, tantalates, vanadates, ruthenates, niobates, alkaline earth metal tin-based perovskites, lanthanum aluminate, lanthanum scandium oxide, and gadolinium oxide can also be grown. Further, by a similar process such as MBE, other monocrystalline material layers comprising other III–V, II–VI, and IV–VI monocrystalline compound semiconductors, semiconductors, metals and non-metals can be deposited overlying the monocrystalline oxide accommodating buffer layer.

Each of the variations of monocrystalline material layer and monocrystalline oxide accommodating buffer layer uses an appropriate template for initiating the growth of the monocrystalline material layer. For example, if the accommodating buffer layer is an alkaline earth metal zirconate, the oxide can be capped by a thin layer of zirconium. The deposition of zirconium can be followed by the deposition of arsenic or phosphorus to react with the zirconium as a precursor to depositing indium gallium arsenide, indium aluminum arsenide, or indium phosphide, respectively. Similarly, if the monocrystalline oxide accommodating buffer layer is an alkaline earth metal hafnate, the oxide layer can be capped by a thin layer of hafnium. The deposition of hafnium is followed by the deposition of arsenic or phosphorous to react with the hafnium as a precursor to the growth of an indium gallium arsenide, indium aluminum arsenide, or indium phosphide layer, respectively. In a similar manner, strontium titanate can be capped with a layer of strontium or strontium and oxygen, and barium titanate can be capped with a layer of barium or barium and oxygen. Each of these depositions can be followed by the deposition of arsenic or phosphorus to react with the capping material to form a template for the deposition of a monocrystalline material layer comprising compound semiconductors such as indium gallium arsenide, indium aluminum arsenide, or indium phosphide.

Single crystal silicon has 4-fold symmetry. That is, its structure is essentially the same as it is rotated in 90 degree steps in the plane of the (100) surface. Likewise, strontium titanate and many other oxides have a 4-fold symmetry. On the other hand, GaAs and related compound semiconductors have a 2-fold symmetry. The 0 degree and 180 degree rotations of the 2-fold symmetry are not the same as the 90 degree and 270 degree rotations of the 4-fold symmetry. If GaAs is nucleated upon strontium titanate at multiple locations on the surface, two different phases are produced. As the material continues to grow, the two phases meet and form anti-phase domains. These anti-phase domains can have an adverse effect upon certain types of devices, particularly minority carrier devices like lasers and light emitting diodes.

In accordance with one embodiment of the present invention, in order to provide for the formation of high quality monocrystalline compound semiconductor material, the starting substrate is off-cut or misoriented from the ideal (100) orientation by 0.5 to 6 degrees in any direction, and preferably 1 to 2 degrees toward the [110] direction. This offcut provides for steps or terraces on the silicon surface and it is believed that these substantially reduce the number of anti-phase domains in the compound semiconductor material, in comparison to a substrate having an offcut near 0 degrees or off cuts larger than 6 degrees. The greater the amount of off-cut, the closer the steps and the smaller the terrace widths become. At very small angles, nucleation occurs at other than the step edges, decreasing the size of single phase domains. At high angles, smaller terraces decrease the size of single phase domains. Growing a high quality oxide, such as strontium titanate, upon a silicon surface causes surface features to be replicated on the surface of the oxide. The step and terrace surface features are replicated on the surface of the oxide, thus preserving directional cues for subsequent growth of compound semiconductor material. Because the formation of the amorphous interface layer occurs after the nucleation of the oxide has begun, the formation of the amorphous interface layer does not disturb the step structure of the oxide.

After the growth of an appropriate accommodating buffer layer, such as strontium titanate or other materials as described earlier, a template layer is used to promote the proper nucleation of compound semiconductor material. In accordance with one embodiment, the strontium titanate is capped with up to 2 monolayers of SrO. The template layer 30 for the nucleation of GaAs is formed by raising the substrate to a temperature in the range of 540 to 630 degrees and exposing the surface to gallium. The amount of gallium exposure is preferably in the range of 0.5 to 5 monolayers. It is understood that the exposure to gallium does not imply that all of the material will actually adhere to the surface. Not wishing to be bound by theory, it is believed that the gallium atoms adhere more readily at the exposed step edges of the oxide surface. Thus, subsequent growth of gallium arsenide preferentially forms along the step edges and prefer an initial alignment in a direction parallel to the step edge, thus forming predominantly single domain material. Other materials besides gallium may also be utilized in a similar fashion, such as aluminum and indium or a combination thereof.

After the deposition of the template, a compound semiconductor material such as gallium arsenide may be deposited. The arsenic source shutter is preferably opened prior to opening the shutter of the gallium source. Small amounts of other elements may also be deposited simultaneously to aid nucleation of the compound semiconductor material layer. For example, aluminum may be deposited to form AlGaAs. As noted above, layer 38, illustrated in FIG. 3, comprises a monocrystalline material that can be grown epitaxially over a monocrystalline oxide material, such as material used to form accommodating buffer layer 24. In accordance with one embodiment of the invention, layer 38 includes materials different from those used to form layer 26. For example, in a preferred embodiment, layer 38 includes AlGaAs, which is deposited as a nucleation layer at a relatively slow growth rate. For example, the growth rate of layer 38 of AlGaAs can be approximately 0.10–0.5 μm/hr. In this case, growth can be initiated by first depositing As on template layer 30, followed by deposition of aluminum and gallium. Deposition of the nucleation layer generally is accomplished at about 300–600° C., and preferably 400–500° C. In accordance with one exemplary embodiment of the invention, the nucleation layer is about 1 nm to about 500 nm thick, and preferably 5 nm to about 50 nm. In this case, the aluminum source shutter is preferably opened prior to opening the gallium source shutter. The amount of aluminum is preferably in the range from 0 to 50% (expressed as a percentage of the aluminum content in the AlGaAs layer), and is most preferably about 15–25%. Other materials, such as InGaAs, could also be used in a similar fashion. Once the growth of compound semiconductor material is initiated, other mixtures of compound semiconductor materials can be grown with various compositions and various thicknesses as required for various applications. For example, a thicker layer of GaAs may be grown on top of the AlGaAs layer to provide a semi-insulating buffer layer prior to the formation of device layers.

The quality of the compound semiconductor material can be improved by including one or more in-situ anneals at various points during the growth. The growth is interrupted, and the substrate is raised to a temperature of between 500°–650° C., and preferably about 550°–600° C. The anneal time depends on the temperature selected, but for an anneal of about 550° C., the length of time is preferably about 15 minutes. The anneal can be performed at any point during the deposition of the compound semiconductor material, but preferably is performed when there is 50 nm to 500 nm of compound semiconductor material deposited. Additional anneals may also be done, depending on the total thickness of material being deposited.

In accordance with one embodiment, monocrystalline material layer 26 is GaAs. Layer 26 may be deposited on layer 24 at various rates, which may vary from application to application; however in a preferred embodiment, the growth rate of layer 26 is about 0.2 to 1.0 μm/hr. The temperature at which layer 26 is grown may also vary, but in one embodiment, layer 26 is grown at a temperature of about 300°–600° C. and preferably about 350°–500° C.

Turning now to FIGS. 9–12, the formation of a device structure in accordance with still another embodiment of the invention is illustrated in cross-section. This embodiment utilizes the formation of a compliant substrate which relies on the epitaxial growth of single crystal oxides on silicon followed by the epitaxial growth of single crystal silicon onto the oxide.

Figure 9:
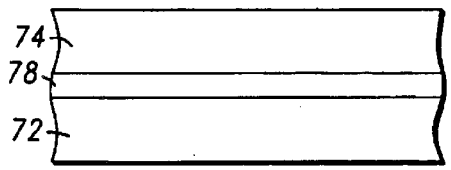
FIGS. 9–12 illustrate schematically, in cross-section, the formation of a device structure in accordance with another embodiment of the invention.

An accommodating buffer layer 74 such as a monocrystalline oxide layer is first grown on a substrate layer 72, such as silicon, with an amorphous interface layer 78 as illustrated in FIG. 9. Monocrystalline oxide layer 74 may be comprised of any of those materials previously discussed with reference to layer 24 in FIGS. 1 and 2, while amorphous interface layer 78 is preferably comprised of any of those materials previously described with reference to the layer 28 illustrated in FIGS. 1 and 2. Substrate 72, although preferably silicon, may also comprise any of those materials previously described with reference to substrate 22 in FIGS. 1–3.

Figure 10:
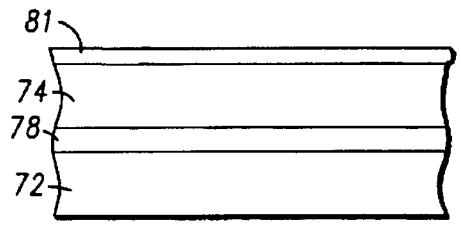

Next, a silicon layer 81 is deposited over monocrystalline oxide layer 74 via MBE, CVD, MOCVD, MEE, ALE, PVD, CSD, PLD, or the like as illustrated in FIG. 10 with a thickness of a few tens of nanometers but preferably with a thickness of about 5 nm. Monocrystalline oxide layer 74 preferably has a thickness of about 2 to 10 nm.

Figure 11:
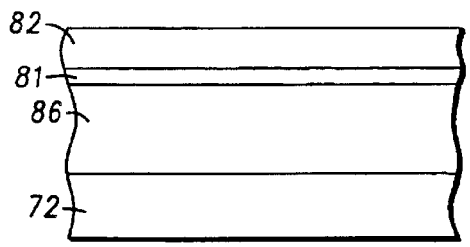

Rapid thermal annealing is then conducted in the presence of a carbon source such as acetylene or methane, for example at a temperature within a range of about 800° C. to 1000° C. to form capping layer 82 and silicate amorphous layer 86. However, other suitable carbon sources may be used as long as the rapid thermal annealing step functions to amorphize the monocrystalline oxide layer 74 into a silicate amorphous layer 86 and carbonize the top silicon layer 81 to form capping layer 82 which in this example would be a silicon carbide (SiC) layer as illustrated in FIG. 11. The formation of amorphous layer 86 is similar to the formation of layer 36 illustrated in FIG. 3 and may comprise any of those materials described with reference to layer 36 in FIG. 3 but the preferable material will be dependent upon the capping layer 82 used for silicon layer 81.

Figure 12:
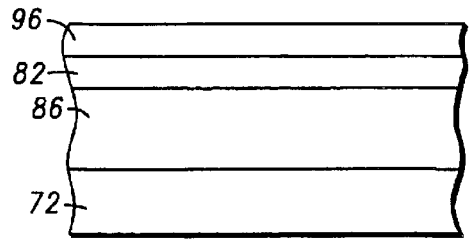

Finally, as shown in FIG. 12, a compound semiconductor layer 96, such as gallium nitride (GaN), is grown over the SiC surface by way of MBE, CVD, MOCVD, MEE, ALE, PVD, CSD, PLD, or the like to form a high quality compound semiconductor material for device formation. More specifically, the deposition of GaN and GaN based systems such as GaInN and AlGaN will result in the formation of dislocation nets confined at the silicon/amorphous region. The resulting nitride containing compound semiconductor material may comprise elements from groups III, IV and V of the periodic table and is defect free.

Although GaN has been grown on SiC substrate in the past, this embodiment of the invention possesses a one step formation of the compliant substrate containing a SiC top surface and an amorphous layer on a Si surface. More specifically, this embodiment of the invention uses an intermediate single crystal oxide layer that is amorphized to form a silicate layer which adsorbs the strain between the layers. Moreover, unlike past use of a SiC substrate, this embodiment of the invention is not limited by wafer size which is usually less than 50 mm in diameter for prior art SiC substrates.

The monolithic integration of nitride containing semiconductor compounds containing group III–V nitrides and silicon devices can be used for high temperature and high power RF applications and optoelectronics. GaN systems have particular use in the photonic industry for the blue/green and UV light sources and detection. High brightness light emitting diodes (LEDs) and lasers may also be formed within the GaN system.

Clearly, those embodiments specifically describing structures having compound semiconductor portions and Group IV semiconductor portions are meant to illustrate embodiments of the present invention and not limit the present invention. There are a multiplicity of other combinations and other embodiments of the present invention. For example, the present invention includes structures and methods for fabricating material layers which form semiconductor structures, devices and integrated circuits including other layers such as metal and non-metal layers. More specifically, the invention includes structures and methods for forming a compliant substrate which is used in the fabrication of semiconductor structures, devices and integrated circuits and the material layers suitable for fabricating those structures, devices, and integrated circuits. By using embodiments of the present invention, it is now simpler to integrate devices that include monocrystalline layers comprising semiconductor and compound semiconductor materials, as well as other material layers that are used to form those devices, with other components that work better or are easily and/or inexpensively formed within semiconductor or compound semiconductor materials. This allows a device to be shrunk, the manufacturing costs to decrease, and yield and reliability to increase.

In accordance with one embodiment of this invention, a monocrystalline semiconductor or compound semiconductor wafer can be used in forming monocrystalline material layers over the wafer. In this manner, the wafer is essentially a "handle" wafer used during the fabrication of semiconductor electrical components within a monocrystalline layer overlying the wafer. Therefore, electrical components can be formed within semiconductor materials over a wafer of at least approximately 200 millimeters in diameter and possibly at least approximately 300 millimeters.

By the use of this type of substrate, the relatively inexpensive "handle" wafer overcomes the fragile nature of wafers fabricated of monocrystalline compound semiconductor or other monocrystalline material by placing the materials over a relatively more durable and easy to fabricate base substrate. Therefore, an integrated circuit can be formed such that all electrical components, and particularly all active electronic devices, can be formed within or using the monocrystalline material layer even though the substrate itself may include a different monocrystalline semiconductor material. Fabrication costs for compound semiconductor devices and other devices employing non-silicon monocrystalline materials should decrease because larger substrates can be processed more economically and more readily compared to the relatively smaller and more fragile substrates (e.g., conventional compound semiconductor wafers).

Figure 13:
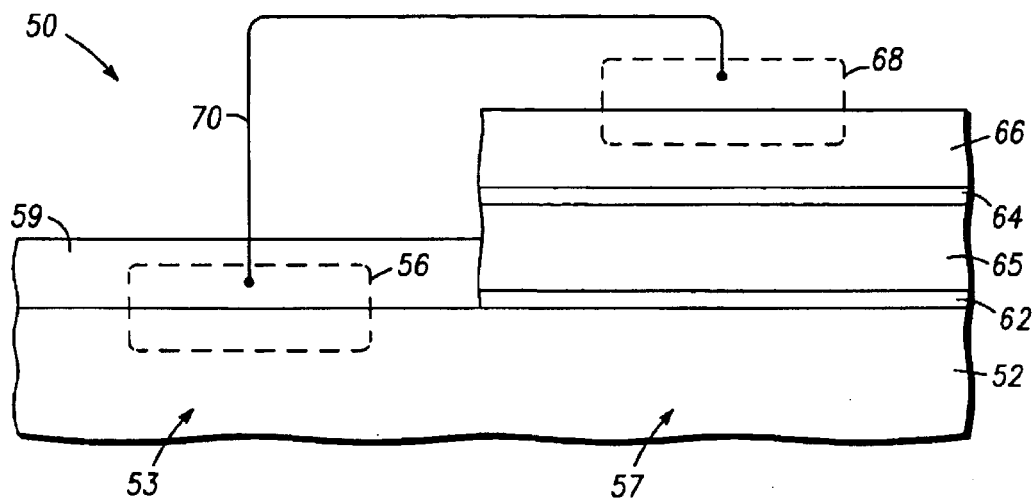
FIGS. 13 and 14 illustrate schematically, in cross section, device structures that can be used in accordance with various embodiments of the invention.

FIG. 13 illustrates schematically, in cross section, a device structure 50 in accordance with a further embodiment. Device structure 50 includes a monocrystalline semiconductor substrate 52, preferably a monocrystalline silicon wafer. Monocrystalline semiconductor substrate 52 includes two regions, 53 and 57. A semiconductor component generally indicated by the dashed line 56 is formed, at least partially, in region 53. Semiconductor component 56 can be a resistor, a capacitor, an active electrical component such as a diode or a transistor, an optoelectric component such as a photo detector, or an integrated circuit such as a CMOS integrated circuit. For example, semiconductor component 56 can be a CMOS integrated circuit configured to perform digital signal processing or another function for which silicon integrated circuits are well suited. The electrical semiconductor component in region 53 can be formed by conventional semiconductor processing as well known and widely practiced in the semiconductor industry. A layer of insulating material 59 such as a layer of silicon dioxide or the like may overlie semiconductor component 56.

Insulating material 59 and any other layers that may have been formed or deposited during the processing of semiconductor component 56 in region 53 are removed from the surface of region 57 to provide a bare silicon surface in that region. As is well known, bare silicon surfaces are highly reactive and a native silicon oxide layer can quickly form on the bare surface. A layer (preferably 1–3 monolayers) of strontium or strontium and oxygen is deposited onto the native oxide layer on the surface of region 57 and is reacted with the oxidized surface to form a first template layer (not shown). In accordance with one embodiment, a monocrystalline oxide layer is formed overlying the template layer by a process of molecular beam epitaxy. Reactants including strontium, titanium and oxygen are deposited onto the template layer to form the monocrystalline oxide layer. Initially during the deposition the partial pressure of oxygen is kept near the minimum necessary to fully react with the strontium and titanium to form a monocrystalline strontium titanate layer. The partial pressure of oxygen is then increased to provide an overpressure of oxygen and to allow oxygen to diffuse through the growing monocrystalline oxide layer. The oxygen diffusing through the strontium titanate reacts with silicon at the surface of region 57 to form an amorphous layer of silicon oxide 62 on second region 57 and at the interface between silicon substrate 52 and the monocrystalline oxide layer 65. Layers 65 and 62 may be subject to an annealing process as described above in connection with FIG. 3 to form a single amorphous accommodating layer.

In accordance with an embodiment, the step of depositing the monocrystalline oxide layer 65 is terminated by depositing a capping layer 64, which can be up to 3 monolayers of titanium, strontium, strontium and oxygen, or titanium and oxygen. A layer 66 of a monocrystalline compound semiconductor material is then deposited overlying capping layer 64 by a process of molecular beam epitaxy. The deposition of layer 66 is initiated by depositing a layer of gallium onto capping layer 64. This initial step is followed by depositing arsenic and gallium to form monocrystalline gallium arsenide 66. Alternatively, barium or a mix of barium and strontium can be substituted for strontium in the above example.

In accordance with a further embodiment, a semiconductor component, generally indicated by a dashed line 68 is formed in compound semiconductor layer 66. Semiconductor component 68 can be formed by processing steps conventionally used in the fabrication of gallium arsenide or other III–V compound semiconductor material devices. Semiconductor component 68 can be any active or passive component, and preferably is a semiconductor laser, light emitting diode, photodetector, heterojunction bipolar transistor (HBT), high frequency MESFET, pseudomorphic high electron mobility transistor (PHEMT), or other component that utilizes and takes advantage of the physical properties of compound semiconductor materials. A metallic conductor schematically indicated by the line 70 can be formed to electrically couple device 68 and device 56, thus implementing an integrated device that includes at least one component formed in silicon substrate 52 and one device formed in monocrystalline compound semiconductor material layer 66. Although illustrative structure 50 has been described as a structure formed on a silicon substrate 52 and having a strontium (or barium) titanate layer 65 and a gallium arsenide layer 66, similar devices can be fabricated using other substrates, monocrystalline oxide layers and other compound semiconductor layers as described elsewhere in this disclosure.

Figure 14:
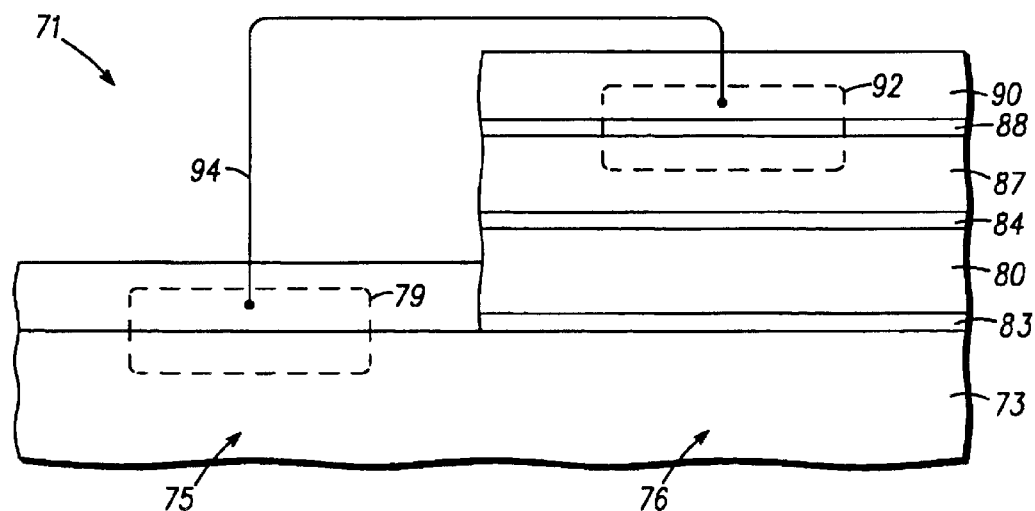

FIG. 14 illustrates a semiconductor structure 71 in accordance with a further embodiment. Structure 71 includes a monocrystalline semiconductor substrate 73 such as a monocrystalline silicon wafer that includes a region 75 and a region 76. A semiconductor component schematically illustrated by the dashed line 79 is formed in region 75 using conventional silicon device processing techniques commonly used in the semiconductor industry. Using process steps similar to those described above, a monocrystalline oxide layer 80 and an intermediate amorphous silicon oxide layer 83 are formed overlying region 76 of substrate 73. A template layer 84 and subsequently a monocrystalline semiconductor layer 87 are formed overlying monocrystalline oxide layer 80. In accordance with a further embodiment, an additional monocrystalline oxide layer 88 is formed overlying layer 87 by process steps similar to those used to form layer 80, and an additional monocrystalline semiconductor layer 90 is formed overlying monocrystalline oxide layer 88 by process steps similar to those used to form layer 87. In accordance with one embodiment, at least one of layers 87 and 90 is formed from a compound semiconductor material. Layers 80 and 83 may be subject to an annealing process as described above in connection with FIG. 3 to form a single amorphous accommodating layer.

A semiconductor component generally indicated by a dashed line 92 is formed at least partially in monocrystalline semiconductor layer 87. In accordance with one embodiment, semiconductor component 92 may include a field effect transistor having a gate dielectric formed, in part, by monocrystalline oxide layer 88. In addition, monocrystalline semiconductor layer 90 can be used to implement the gate electrode of that field effect transistor. In accordance with one embodiment, monocrystalline semiconductor layer 87 is formed from a group III–V compound and semiconductor component 92 is a radio frequency amplifier that takes advantage of the high mobility characteristic of group III–V component materials. In accordance with yet a further embodiment, an electrical interconnection schematically illustrated by the line 94 electrically interconnects component 79 and component 92. Structure 71 thus integrates components that take advantage of the unique properties of the two monocrystalline semiconductor materials.

Figure 15:
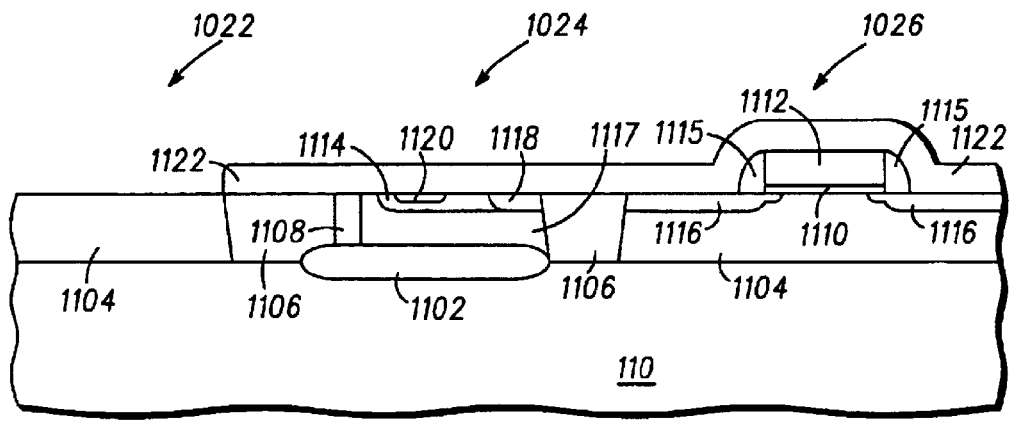
FIGS. 15–19 include illustrations of cross-sectional views of a portion of an integrated circuit that includes a compound semiconductor portion, a bipolar portion, and a MOS portion in accordance with what is shown herein.

Attention is now directed to a method for forming exemplary portions of illustrative composite semiconductor structures or composite integrated circuits like 50 or 71. In particular, the illustrative composite semiconductor structure or integrated circuit 103 shown in FIGS. 15–19 includes a compound semiconductor portion 1022, a bipolar portion 1024, and a MOS portion 1026. In FIG. 15, a p-type doped, monocrystalline silicon substrate 110 is provided having a compound semiconductor portion 1022, a bipolar portion 1024, and a MOS portion 1026. Within bipolar portion 1024, the monocrystalline silicon substrate 110 is doped to form an N$^+$ buried region 1102. A lightly p-type doped epitaxial monocrystalline silicon layer 1104 is then formed over the buried region 1102 and the substrate 110. A doping step is then performed to create a lightly n-type doped drift region 1117 above the N$^+$ buried region 1102. The doping step converts the dopant type of the lightly p-type epitaxial layer within a section of the bipolar region 1024 to a lightly n-type monocrystalline silicon region. A field isolation region 1106 is then formed between and around the bipolar portion 1024 and the MOS portion 1026. A gate dielectric layer 1110 is formed over a portion of the epitaxial layer 1104 within MOS portion 1026, and the gate electrode 1112 is then formed over the gate dielectric layer 1110. Sidewall gaprs 1115 are formed along vertical sides of the gate electrode 1112 and gate dielectric layer 1110.

A p-type dopant is introduced into the drift region 1117 to form an active or intrinsic base region 1114. An n-type, deep collector region 1108 is then formed within the bipolar portion 1024 to allow electrical connection to the buried region 1102. Selective n-type doping is performed to form N+ doped regions 1116 and the emitter region 1120. N+ doped regions 1116 are formed within layer 1104 along adjacent sides of the gate electrode 1112 and are source, drain, or source/drain regions for the MOS transistor. The N+ doped regions 1116 and emitter region 1120 have a doping concentration of at least 1E19 atoms per cubic centimeter to allow ohmic contacts to be formed. A p-type doped region is formed to create the inactive or extrinsic base region 1118 which is a P+ doped region (doping concentration of at least 1E19 atoms per cubic centimeter).

In the embodiment described, several processing steps have been performed but are not illustrated or further described, such as the formation of well regions, threshold adjusting implants, channel punchthrough prevention implants, field punchthrough prevention implants, as well as a variety of masking layers. The formation of the device up to this point in the process is performed using conventional steps. As illustrated, a standard N-channel MOS transistor has been formed within the MOS region 1026, and a vertical NPN bipolar transistor has been formed within the bipolar portion 1024. Although illustrated with a NPN bipolar transistor and an N-channel MOS transistor, device structures and circuits in accordance with various embodiments may additionally or alternatively include other electronic devices formed using the silicon substrate. As of this point, no circuitry has been formed within the compound semiconductor portion 1022.

After the silicon devices are formed in regions 1024 and 1026, a protective layer 1122 is formed overlying devices in regions 1024 and 1026 to protect devices in regions 1024 and 1026 from potential damage resulting from device formation in region 1022. Layer 1122 may be formed of, for example, an insulating material such as silicon oxide or silicon nitride.

All of the layers that have been formed during the processing of the bipolar and MOS portions of the integrated circuit, except for epitaxial layer 1104 but including protective layer 1122, are now removed from the surface of compound semiconductor portion 1022. A bare silicon surface is thus provided in the manner set forth above for the subsequent processing of this portion, for example in the manner set forth below.

Figure 16:
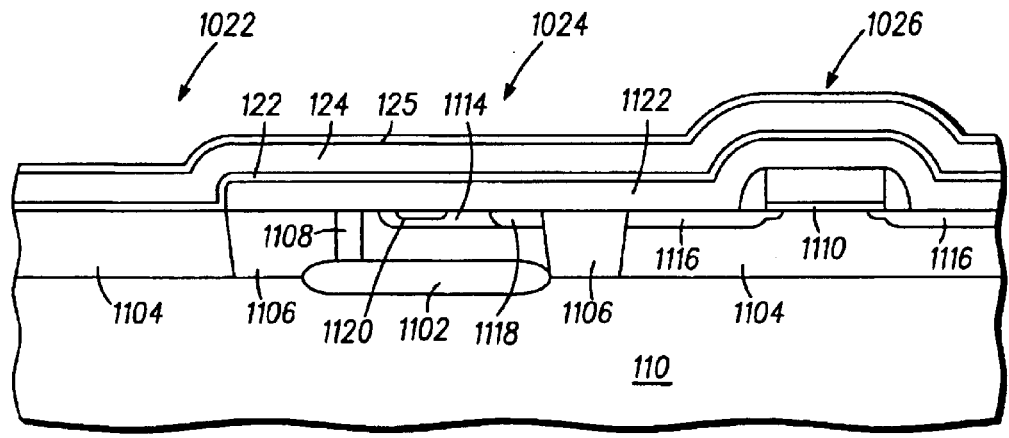

An accommodating buffer layer 124 is then formed over the substrate 110 as illustrated in FIG. 16. The accommodating buffer layer will form as a monocrystalline layer over the properly prepared (i.e., having the appropriate template layer) bare silicon surface in portion 1022. The portion of layer 124 that forms over portions 1024 and 1026, however, may be polycrystalline or amorphous because it is formed over a material that is not monocrystalline, and therefore, does not nucleate monocrystalline growth. The accommodating buffer layer 124 typically is a monocrystalline metal oxide or nitride layer and typically has a thickness in a range of approximately 2–100 nanometers. In one particular embodiment, the accommodating buffer layer is approximately 3–10 nm thick. During the formation of the accommodating buffer layer, an amorphous intermediate layer 122 is formed along the uppermost silicon surfaces of the integrated circuit 103. This amorphous intermediate layer 122 typically includes an oxide of silicon and has a thickness and range of approximately 0.5–5 nm. In one particular embodiment, the thickness is 1–2 nm. Following the formation of the accommodating buffer layer 124 and the amorphous intermediate layer 122, a capping layer of up to 3 monolayers of titanium, strontium, titanium oxygen, or strontium oxygen is formed. Template layer 125 is then formed by depositing 0.5–10 monolayers of gallium, indium, aluminum, or a combination thereof and has a thickness in a range of approximately one half to ten monolayers. In one particular embodiment, the template includes gallium, titanium-arsenic, titanium-oxygen-arsenic, strontium-oxygen-arsenic, or other similar materials as previously described with respect to FIGS. 1–5.

Figure 17:
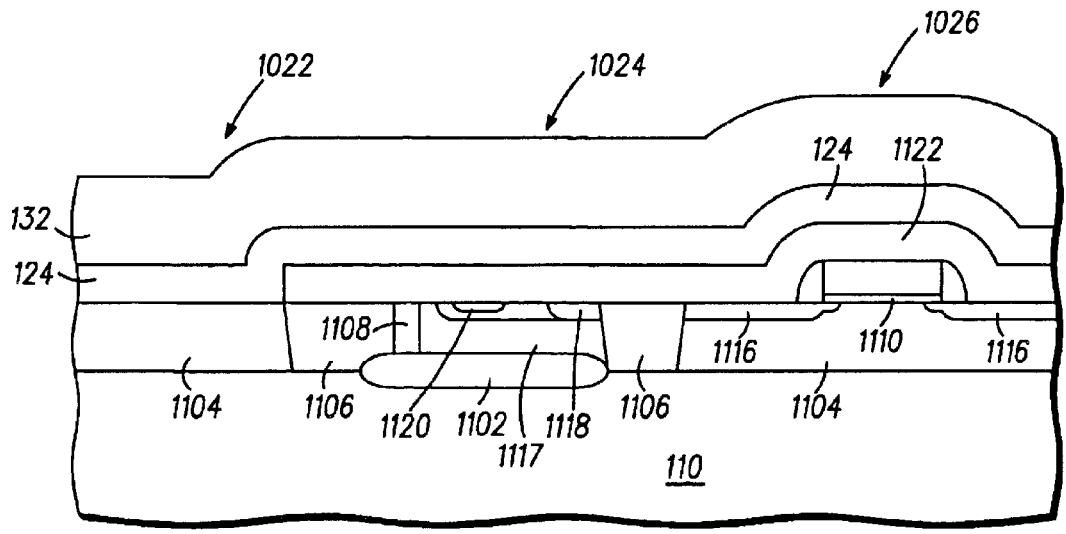

A monocrystalline compound semiconductor layer 132 is then epitaxially grown overlying the monocrystalline portion of accommodating buffer layer 124 as shown in FIG. 17. The portion of layer 132 that is grown over portions of layer 124 that are not monocrystalline may be polycrystalline or amorphous. The compound semiconductor layer can be formed by a number of methods and typically includes a material such as gallium arsenide, aluminum gallium arsenide, indium phosphide, or other compound semiconductor materials as previously mentioned. The thickness of the layer is in a range of approximately 1–5,000 nm, and more preferably 100–2000 nm. Furthermore, additional monocrystalline layers may be formed above layer 132.

In the particular embodiment of FIG. 17, each of the elements within the template layer are also present in the accommodating buffer layer 124, the monocrystalline compound semiconductor material 132, or both. Therefore, the delineation between the template layer 125 and its two immediately adjacent layers disappears during processing. Therefore, when a transmission electron microscopy (TEM) photograph is taken, an interface between the accommodating buffer layer 124 and the monocrystalline compound semiconductor layer 132 is seen.

After at least a portion of layer 132 is formed in region 1022, layers 122 and 124 may be subject to an annealing process as described above in connection with FIG. 3 to form a single amorphous accommodating layer. If only a portion of layer 132 is formed prior to the anneal process, the remaining portion may be deposited onto structure 103 prior to further processing.

Figure 18:
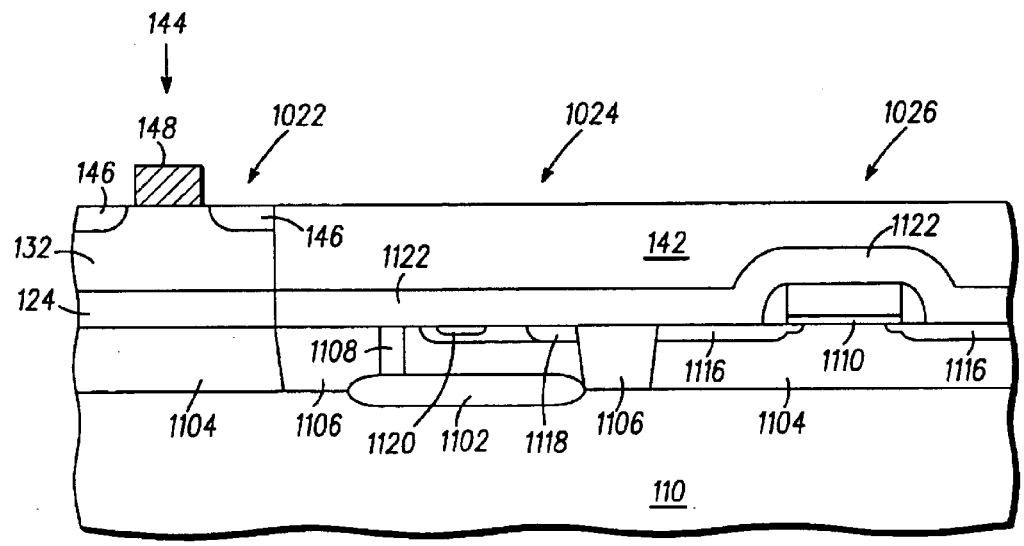

At this point in time, sections of the compound semiconductor layer 132 and the accommodating buffer layer 124 (or of the amorphous accommodating layer if the annealing process described above has been carried out) are removed from portions overlying the bipolar portion 1024 and the MOS portion 1026 as shown in FIG. 18. After the section of the compound semiconductor layer and the accommodating buffer layer 124 are removed, an insulating layer 142 is formed over protective layer 1122. The insulating layer 142 can include a number of materials such as oxides, nitrides, oxynitrides, low-k dielectrics, or the like. As used herein, low-k is a material having a dielectric constant no higher than approximately 3.5. After the insulating layer 142 has been deposited, it is then polished or etched to remove portions of the insulating layer 142 that overlie monocrystalline compound semiconductor layer 132.

A transistor 144 is then formed within the monocrystalline compound semiconductor portion 1022. A gate electrode 148 is then formed on the monocrystalline compound semiconductor layer 132. Doped regions 146 are then formed within the monocrystalline compound semiconductor layer 132. In this embodiment, the transistor 144 is a metal-semiconductor field-effect transistor (MESFET). If the MESFET is an n-type MESFET, the doped regions 146 and at least a portion of monocrystalline compound semiconductor layer 132 are also n-type doped. If a p-type MESFET were to be formed, then the doped regions 146 and at least a portion of monocrystalline compound semiconductor layer 132 would have just the opposite doping type. The heavier doped (N+) regions 146 allow ohmic contacts to be made to the monocrystalline compound semiconductor layer 132. At this point in time, the active devices within the integrated circuit have been formed. Although not illustrated in the drawing figures, additional processing steps such as formation of well regions, threshold adjusting implants, channel punchthrough prevention implants, field punchthrough prevention implants, and the like may be performed in accordance with the present invention. This particular embodiment includes an n-type MESFET, a vertical NPN bipolar transistor, and a planar n-channel MOS transistor. Many other types of transistors, including P-channel MOS transistors, p-type vertical bipolar transistors, p-type MESFETs, and combinations of vertical and planar transistors, can be used. Also, other electrical components, such as resistors, capacitors, diodes, and the like, may be formed in one or more of the portions 1022, 1024, and 1026.

Figure 19:
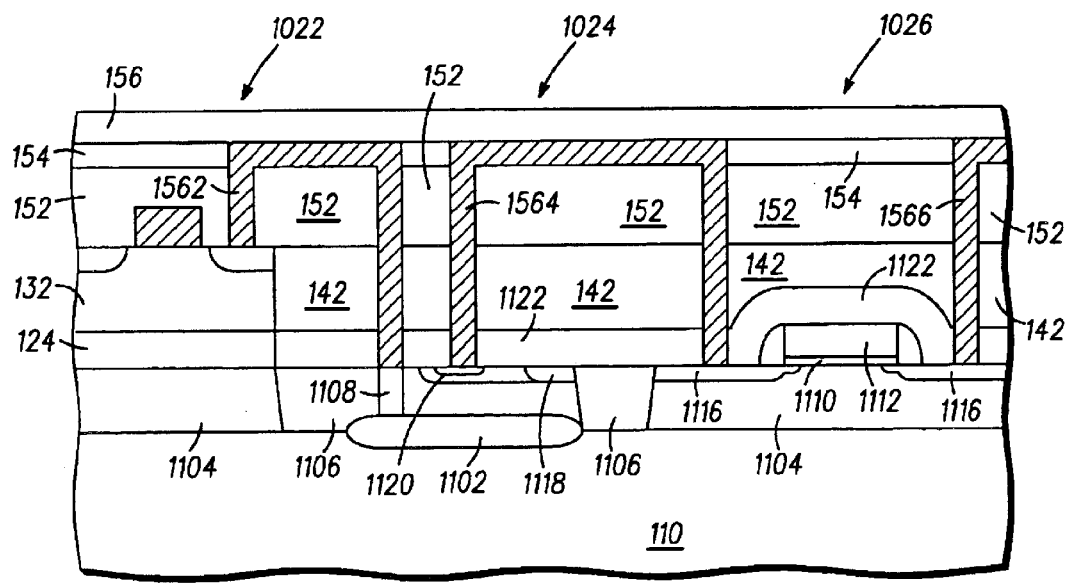

Processing continues to form a substantially completed integrated circuit 103 as illustrated in FIG. 19. An insulating layer 152 is formed over the substrate 110. The insulating layer 152 may include an etch-stop or polish-stop region that is not illustrated in FIG. 19. A second insulating layer 154 is then formed over the first insulating layer 152. Portions of layers 154, 152, 142, 124, and 1122 are removed to define contact openings where the devices are to be interconnected. Interconnect trenches are formed within insulating layer 154 to provide the lateral connections between the contacts. As illustrated in FIG. 19, interconnect 1562 connects a source or drain region of the n-type MESFET within portion 1022 to the deep collector region 1108 of the NPN transistor within the bipolar portion 1024. The emitter region 1120 of the NPN transistor is connected to one of the doped regions 1116 of the n-channel MOS transistor within the MOS portion 1026. The other doped region 1116 is electrically connected to other portions of the integrated circuit that are not shown. Similar electrical connections are also formed to couple regions 1118 and 1112 to other regions of the integrated circuit.

A passivation layer 156 is formed over the interconnects 1562, 1564, and 1566 and insulating layer 154. Other electrical connections are made to the transistors as illustrated as well as to other electrical or electronic components within the integrated circuit 103 but are not illustrated in the FIGS. Further, additional insulating layers and interconnects may be formed as necessary to form the proper interconnections between the various components within the integrated circuit 103.

As can be seen from the previous embodiment, active devices for both compound semiconductor and Group IV semiconductor materials can be integrated into a single integrated circuit. Because there is some difficulty in incorporating both bipolar transistors and MOS transistors within a same integrated circuit, it may be possible to move some of the components within bipolar portion 1024 into the compound semiconductor portion 1022 or the MOS portion 1026. Therefore, the requirement of special fabricating steps solely used for making a bipolar transistor can be eliminated. Therefore, there would only be a compound semiconductor portion and a MOS portion to the integrated circuit.

In still another embodiment, an integrated circuit can be formed such that it includes an optical laser in a compound semiconductor portion and an optical interconnect (waveguide) to a MOS transistor within a Group IV semiconductor region of the same integrated circuit. FIGS. 20–26 include illustrations of one embodiment.

Figure 20:
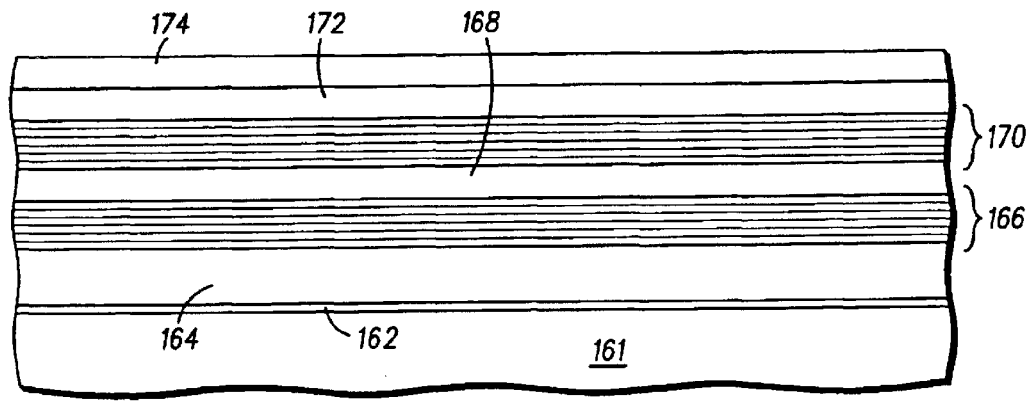
FIGS. 20–26 include illustrations of cross-sectional views of a portion of another integrated circuit that includes a semiconductor laser and a MOS transistor in accordance with what is shown herein.

FIG. 20 includes an illustration of a cross-sectional view of a portion of an integrated circuit 160 that includes a monocrystalline silicon wafer 161. An amorphous intermediate layer 162 and an accommodating buffer layer 164, similar to those previously described, have been formed over wafer 161. Layers 162 and 164 may be subject to an annealing process as described above in connection with FIG. 3 to form a single amorphous accommodating layer. In this specific embodiment, the layers needed to form the optical laser will be formed first, followed by the layers needed for the MOS transistor. In FIG. 20, the lower mirror layer 166 includes alternating layers of compound semiconductor materials. For example, the first, third, and fifth films within the optical laser may include a material such as gallium arsenide, and the second, fourth, and sixth films within the lower mirror layer 166 may include aluminum gallium arsenide or vice versa. Layer 168 includes the active region that will be used for photon generation. Upper mirror layer 170 is formed in a similar manner to the lower mirror layer 166 and includes alternating films of compound semiconductor materials. In one particular embodiment, the upper mirror layer 170 may be p-type doped compound semiconductor materials, and the lower mirror layer 166 may be n-type doped compound semiconductor materials.

Another accommodating buffer layer 172, similar to the accommodating buffer layer 164, is formed over the upper mirror layer 170. In an alternative embodiment, the accommodating buffer layers 164 and 172 may include different materials. However, their function is essentially the same in that each is used for making a transition between a compound semiconductor layer and a monocrystalline Group IV semiconductor layer. Layer 172 may be subject to an annealing process as described above in connection with FIG. 3 to form an amorphous accommodating layer. A monocrystalline Group IV semiconductor layer 174 is formed over the accommodating buffer layer 172. In one particular embodiment, the monocrystalline Group IV semiconductor layer 174 includes germanium, silicon germaniumF, silicon germanium carbide, or the like.

Figure 21:
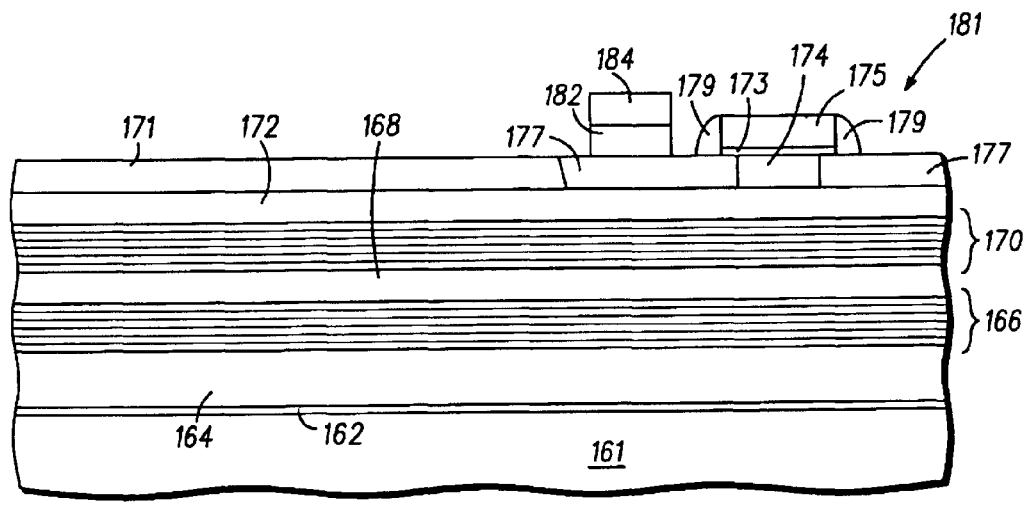

In FIG. 21, the MOS portion is processed to form electrical components within this upper monocrystalline Group IV semiconductor layer 174. As illustrated in FIG. 21, a field isolation region 171 is formed from a portion of layer 174. A gate dielectric layer 173 is formed over the layer 174, and a gate electrode 175 is formed over the gate dielectric layer 173. Doped regions 177 are source, drain, or source/drain regions for the transistor 181, as shown. Sidewall gaprs 179 are formed adjacent to the vertical sides of the gate electrode 175. Other components can be made within at least a part of layer 174. These other components include other field effect transistors (n-channel or p-channel), capacitors, bipolar transistors, diodes, and the like.

A monocrystalline Group IV semiconductor layer is epitaxially grown over one of the doped regions 177. An upper portion 184 is P+ doped, and a lower portion 182 remains substantially intrinsic (undoped) as illustrated in FIG. 21. The layer can be formed using a selective epitaxial process. In one embodiment, an insulating layer (not shown) is formed over the transistor 181 and the field isolation region 171. The insulating layer is patterned to define an opening that exposes one of the doped regions 177. At least initially, the selective epitaxial layer is formed without dopants. The entire selective epitaxial layer may be intrinsic, or a p-type dopant can be added near the end of the formation of the selective epitaxial layer. If the selective epitaxial layer is intrinsic, as formed, a doping step may be formed by implantation or by furnace doping. Regardless how the P+ upper portion 184 is formed, the insulating layer is then removed to form the resulting structure shown in FIG. 21.

Figure 22:
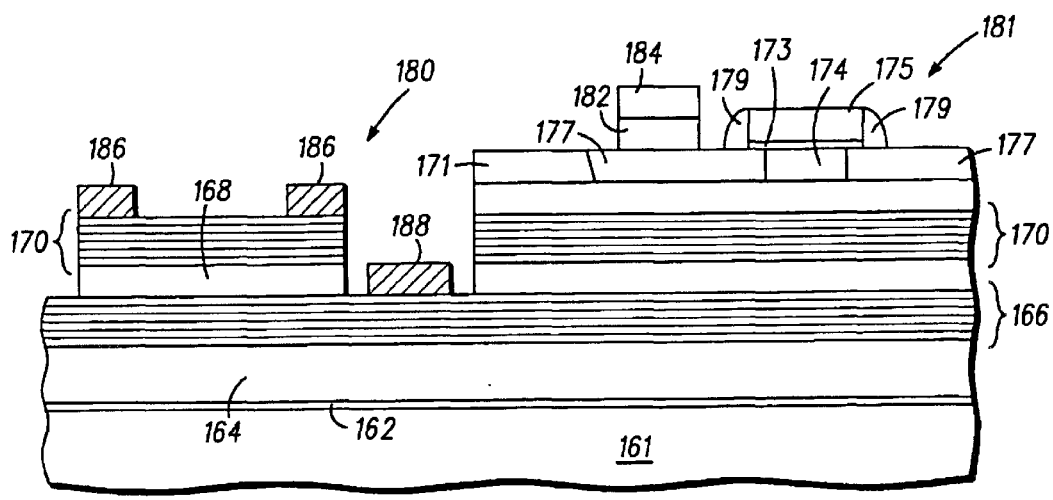

The next set of steps is performed to define the optical laser 180 as illustrated in FIG. 22. The field isolation region 171 and the accommodating buffer layer 172 are removed over the compound semiconductor portion of the integrated circuit. Additional steps are performed to define the upper mirror layer 170 and active layer 168 of the optical laser 180. The sides of the upper mirror layer 170 and active layer 168 are substantially coterminous.

Contacts 186 and 188 are formed for making electrical contact to the upper mirror layer 170 and the lower mirror layer 166, respectively, as shown in FIG. 22. Contact 186 has an annular shape to allow light (photons) to pass out of the upper mirror layer 170 into a subsequently formed optical waveguide.

Figure 23:
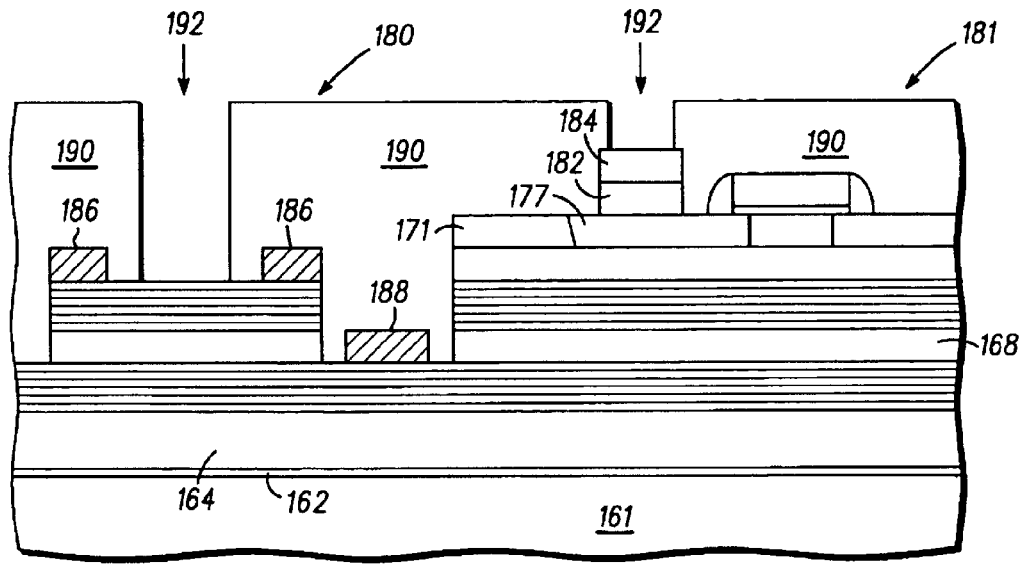
Figure 24:
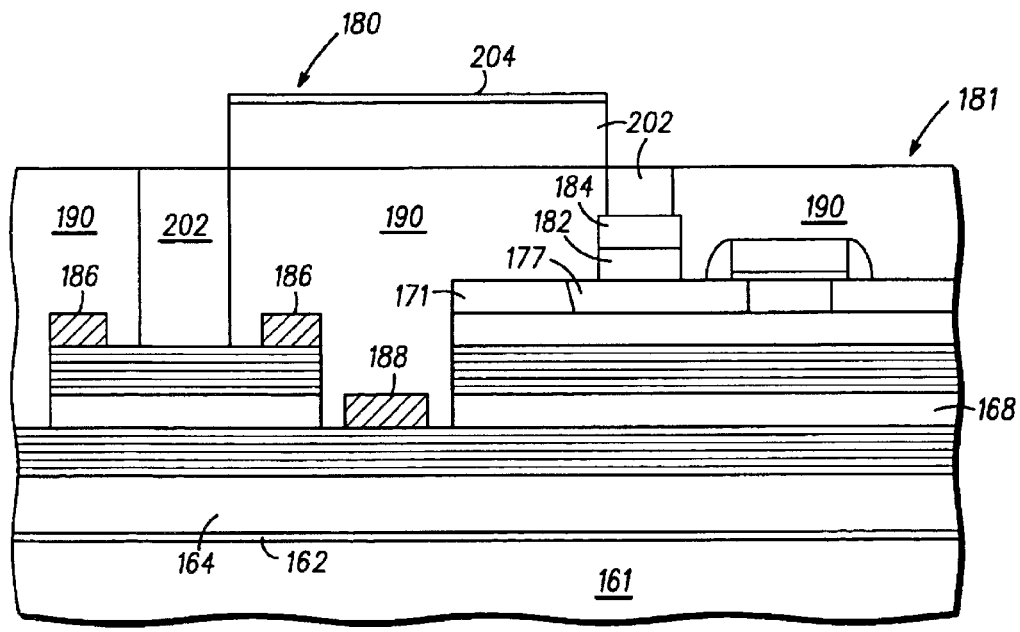

An insulating layer 190 is then formed and patterned to define optical openings extending to the contact layer 186 and one of the doped regions 177 as shown in FIG. 23. The insulating material can be any number of different materials, including an oxide, nitride, oxynitride, low-k dielectric, or any combination thereof. After defining the openings 192, a higher refractive index material 202 is then formed within the openings to fill them and to deposit the layer over the insulating layer 190 as illustrated in FIG. 24. With respect to the higher refractive index material 202, "higher" is in relation to the material of the insulating layer 190 (i.e., material 202 has a higher refractive index compared to the insulating layer 190). Optionally, a relatively thin lower refractive index film (not shown) could be formed before forming the higher refractive index material 202. A hard mask layer 204 is then formed over the high refractive index layer 202. Portions of the hard mask layer 204, and high refractive index layer 202 are removed from portions overlying the opening and to areas closer to the sides of FIG. 24.

Figure 25:
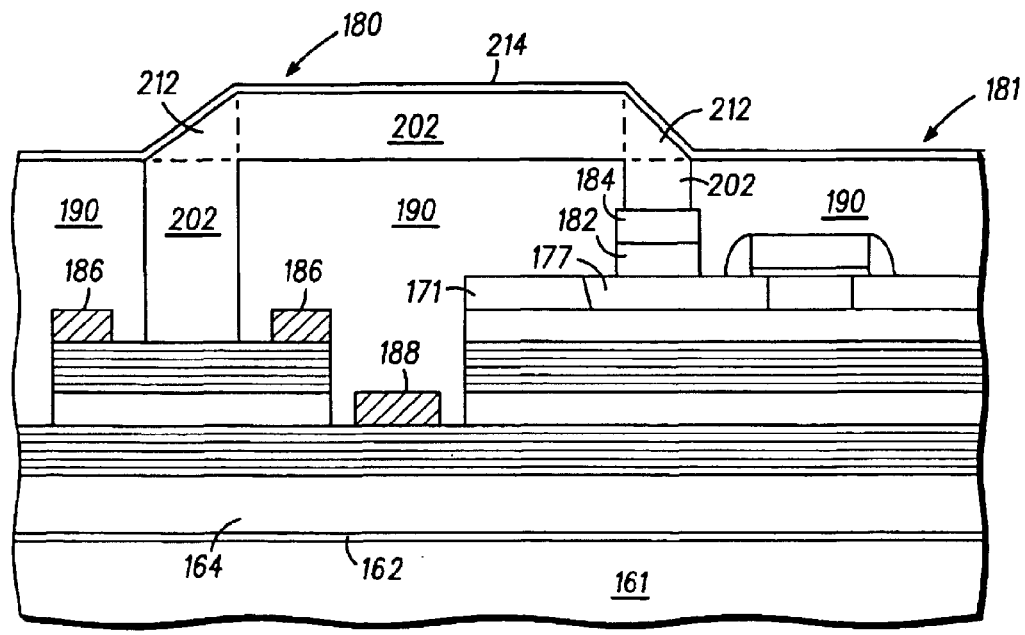

The balance of the formation of the optical waveguide, which is an optical interconnect, is completed as illustrated in FIG. 25. A deposition procedure (possibly a deep-etch process) is performed to effectively create sidewalls sections 212. In this embodiment, the sidewall sections 212 are made of the same material as material 202. The hard mask layer 204 is then removed, and a low refractive index layer 214 (low relative to material 202 and layer 212) is formed over the higher refractive index material 212 and 202 and exposed portions of the insulating layer 190. The dash lines in FIG. 25 illustrate the border between the high refractive index materials 202 and 212. This designation is used to identify that both are made of the same material but are formed at different times.

Figure 26:
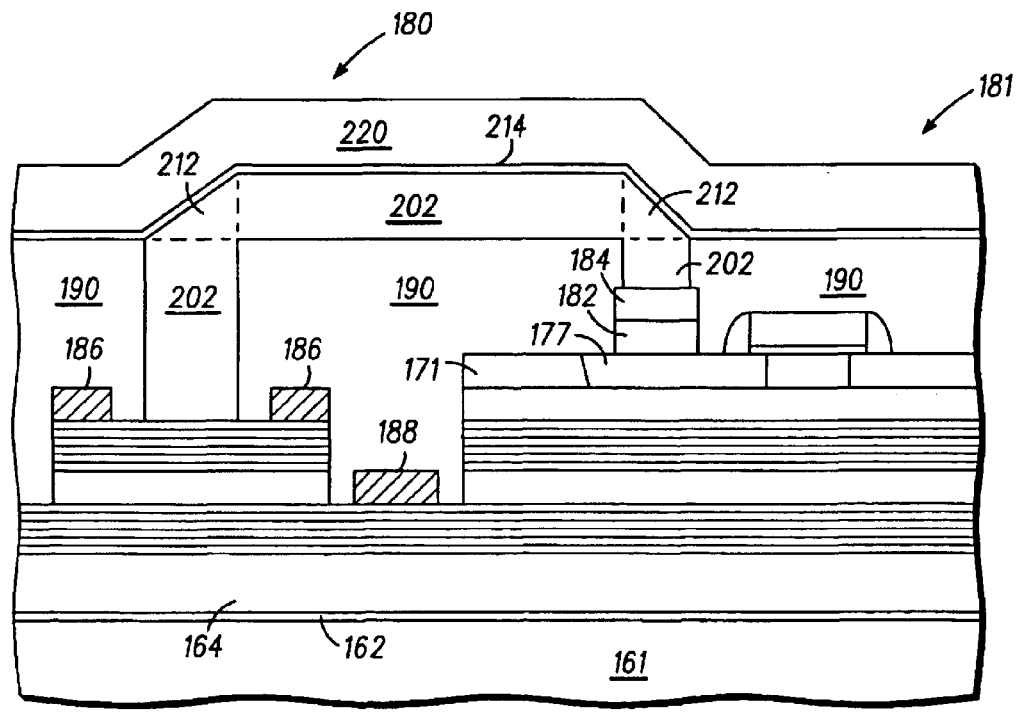

Processing is continued to form a substantially completed integrated circuit as illustrated in FIG. 26. A passivation layer 220 is then formed over the optical laser 180 and MOSFET transistor 181. Although not shown, other electrical or optical connections are made to the components within the integrated circuit but are not illustrated in FIG. 26. These interconnects can include other optical waveguides or may include metallic interconnects.

In other embodiments, other types of lasers can be formed. For example, another type of laser can emit light (photons) horizontally instead of vertically. If light is emitted horizontally, the MOSFET transistor could be formed within the substrate 161, and the optical waveguide would be reconfigured, so that the laser is properly coupled (optically connected) to the transistor. In one specific embodiment, the optical waveguide can include at least a portion of the accommodating buffer layer. Other configurations are possible.

Clearly, these embodiments of integrated circuits having compound semiconductor portions and Group IV semiconductor portions, are meant to illustrate what can be done and are not intended to be exhaustive of all possibilities or to limit what can be done. There are a multiplicity of other possible combinations and embodiments. For example, the compound semiconductor portion may include light emitting diodes, photodetectors, diodes, or the like, and the Group IV semiconductor can include digital logic, memory arrays, and most structures that can be formed in conventional MOS integrated circuits. By using what is shown and described herein, it is now simpler to integrate devices that work better in compound semiconductor materials with other components that work better in Group IV semiconductor materials thus providing optimized IC performance. This allows a device to be shrunk, the manufacturing costs to decrease, and yield and reliability to increase.

A monocrystalline Group IV wafer can be used in forming only compound semiconductor electrical components over the wafer. In this manner, the wafer is essentially a "handle" wafer used during the fabrication of the compound semiconductor electrical components within a monocrystalline compound semiconductor layer overlying the wafer. Therefore, electrical components can be formed within III–V or II–VI semiconductor materials over a wafer of at least approximately 200 millimeters in diameter and possibly at least approximately 300 millimeters.

As explained earlier, the use of this relatively inexpensive "handle" wafer overcomes the fragile nature of the compound semiconductor wafers by placing them over a relatively more durable and easy to fabricate base material. Therefore, an integrated circuit can be formed such that all electrical components, and particularly all active electronic devices, can be formed within the compound semiconductor material even though the substrate itself may include a Group IV semiconductor material. Fabrication costs for compound semiconductor devices should decrease because larger substrates can be processed more economically and more readily, compared to the relatively smaller and more fragile, conventional compound semiconductor wafers.

A composite integrated circuit may include components that provide electrical isolation when electrical signals are applied to the composite integrated circuit. The composite integrated circuit may include a pair of optical components, such as an optical source component and an optical detector component. An optical source component may be a light generating semiconductor device, such as an optical laser (e.g., the optical laser illustrated in FIG. 22), a photo emitter, a diode, etc. An optical detector component may be a light-sensitive semiconductor junction device, such as a photodetector, a photodiode, a bipolar junction, a transistor, etc.

A composite integrated circuit may include processing circuitry that is formed at least partly in the Group IV semiconductor portion of the composite integrated circuit. The processing circuitry is configured to communicate with circuitry external to the composite integrated circuit. The processing circuitry may be electronic circuitry, such as a microprocessor, RAM, logic device, decoder, etc.

For the processing circuitry to communicate with external electronic circuitry, the composite integrated circuit may be provided with electrical signal connections with the external electronic circuitry. The composite integrated circuit may have internal optical communications connections for connecting the processing circuitry in the composite integrated circuit to the electrical connections with the external circuitry. Optical components in the composite integrated circuit may provide the optical communications connections which may electrically isolate the electrical signals in the communications connections from the processing circuitry. Together, the electrical and optical communications connections may be for communicating information, such as data, control, timing, etc.

A composite integrated circuit will typically have an electric connection for a power supply and a ground connection. The power and ground connections are in addition to the communications connections that are discussed above. Processing circuitry in a composite integrated circuit may include electrically isolated communications connections and include electrical connections for power and ground. In most known applications, power supply and ground connections are usually well-protected by circuitry to prevent harmful external signals from reaching the composite integrated circuit. A communications ground may be isolated from the ground signal in communications connections that use a ground communications signal.

A pair of optical components (an optical source component and an optical detector component) in the composite integrated circuit may be configured to pass information. For clarity and brevity, optical detector components are discussed primarily in the context of optical detector components that have been formed in a compound semiconductor portion of a composite integrated circuit. In application, the optical detector component may be formed in many suitable ways (e.g., formed from silicon, etc.). Information that is received or transmitted between the optical pair may be from or for the electrical communications connection between the external circuitry and the composite integrated circuit. The optical components and the electrical communications connection may form a communications connection between the processing circuitry and the external circuitry while providing electrical isolation for the processing circuitry. If desired, a plurality of optical component pairs may be included in the composite integrated circuit for providing a plurality of communications connections and for providing isolation. For example, a composite integrated circuit receiving a plurality of data bits may include a pair of optical components for communication of each data bit.

In operation, for example, an optical source component in a pair of components may be configured to generate light (e.g., photons) based on receiving electrical signals from an electrical signal connection with the external circuitry. An optical detector component in the pair of components may be optically connected to the source component to generate electrical signals based on detecting light generated by the optical source component. Information that is communicated between the source and detector components may be digital or analog.

If desired the reverse of this configuration may be used. An optical source component that is responsive to the on-board processing circuitry may be coupled to an optical detector component to have the optical source component generate an electrical signal for use in communications with external circuitry. A plurality of such optical component pair structures may be used for providing two-way connections. In some applications where synchronization is desired, a first pair of optical components may be coupled to provide data communications and a second pair may be coupled for communicating synchronization information.

Figure 27:
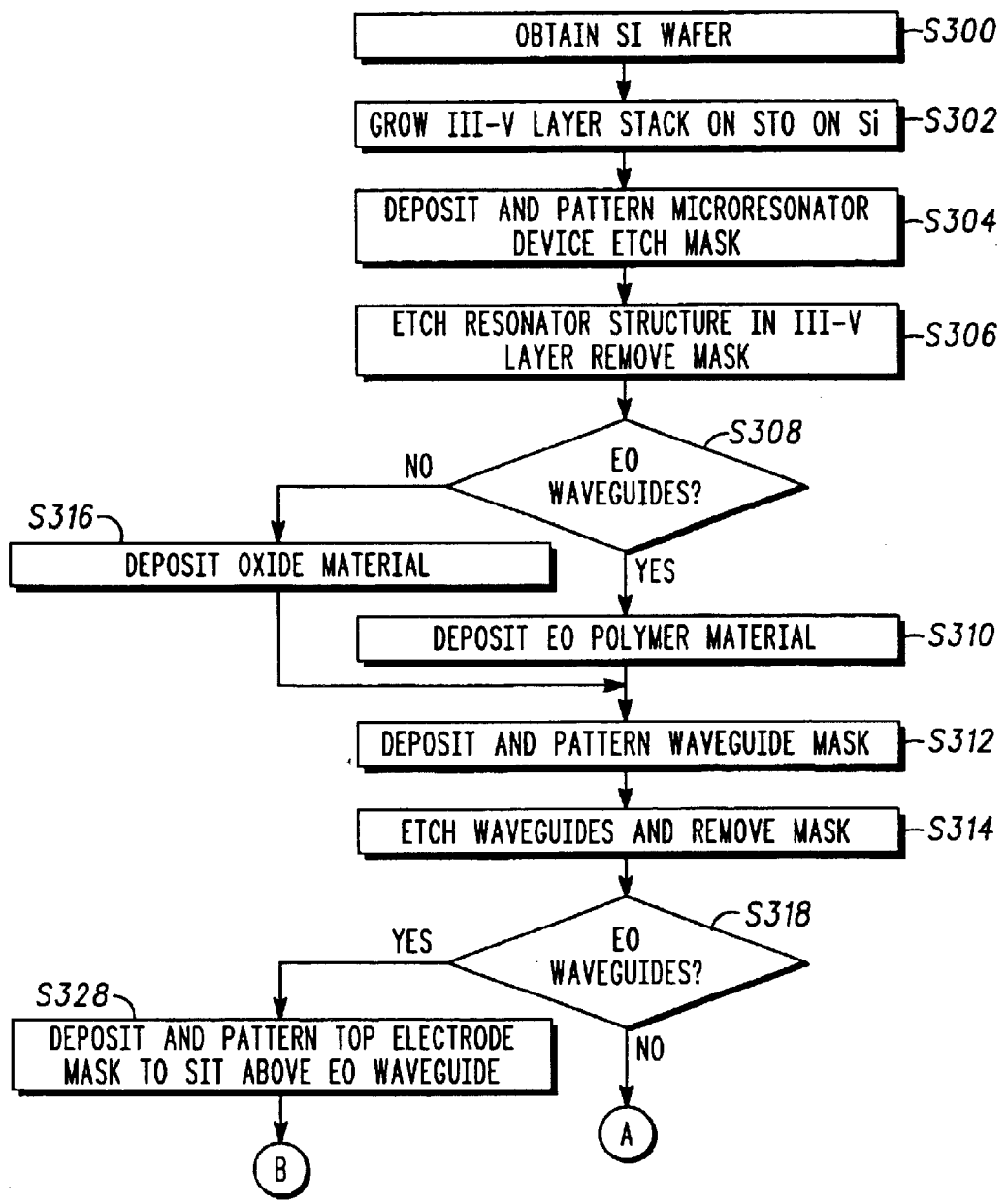
FIGS. 27 and 28 illustrate a flow chart representative of one embodiment of a microresonator device fabrication method in accordance with the present invention
Figure 28:
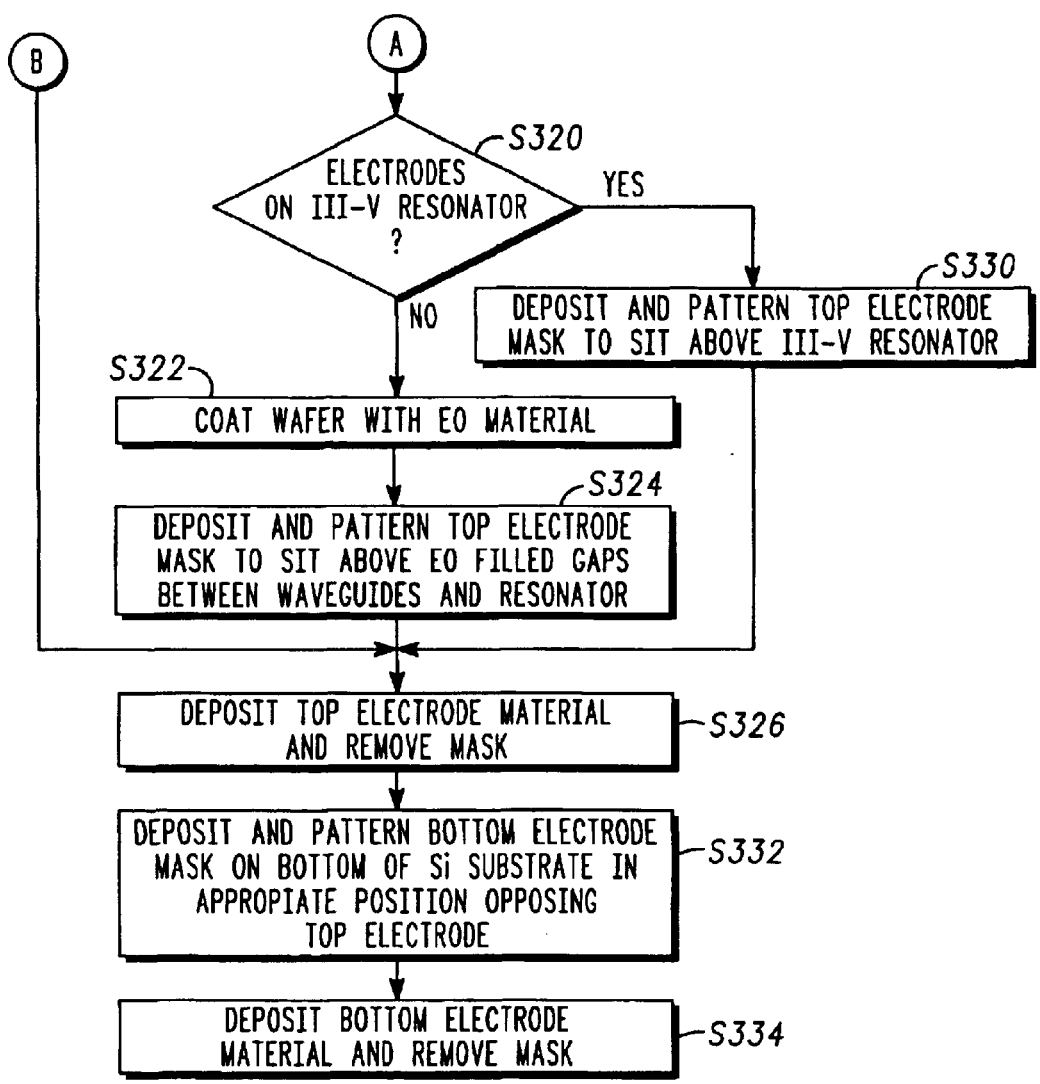

FIGS. 27 and 28 illustrate a flowchart representative of a microresonator device fabrication method having one path for fabrication of electro-optical waveguides and another path for the fabrication of oxide waveguides. First, a silicon wafer having a silicon substrate and a STO layer overlying the substrate is obtained during a stage S300. Second, a Group III–V layer is grown on the STO layer during a stage S302. Third, an etch mask for a microresonator device is deposited and patterned on the III–V layer during a stage S304. Fourth, a resonator structure is etched in the III–V layer during a stage S306.

Stages S308 and S318 represent a decision stages as to whether the waveguides of the microresonator device will fabricated from electro-optical material or oxide material.

The electro-optical path proceeds through stages S310–S312–S314–S328–S326–S332–S334. First, the electro-optical material is deposited on the STO layer during stage S310. Second, a waveguide mask is deposited and patterned on the electro-optical material during stage S312. Third, the electro-optical waveguides are etched and the mask is removed during stage S314. Fourth, a top electrode mask to sit above the electro-optical waveguides is deposited and patterned on the electro-optical waveguides during stage S328. Fifth, material for the top electrode is deposited on the electro-optical waveguides and the mask removed during stage S326. Sixth, a bottom electrode mask on a bottom of the silicon substrate is appropriately deposited and patterned on the silicon substrate during stage S332. Finally, material for the bottom electrode is deposited on the silicon substrate and the mask removed during stage S334.

The oxide path includes a stage S320 represents a decision stage as to whether an electrode will be deposited on the III–V resonator or above electro-optical material filling gaps between the waveguides-resonators. An oxide-electrode-resonator path proceeds through stages S316–S312–S314–S330–S326–S332–S334. First, oxide material is deposited on the STO layer during stage S316. Second, a waveguide mask is deposited and patterned on the oxide material during stage S312. Third, the oxide waveguides are etched and the mask is removed during stage S314. Fourth, a top electrode mask to sit on the III–V resonator is deposited and patterned on the III–V resonator during stage S330. Fifth, material for the top electrode is deposited on the IIV–V resonator and the mask removed during stage S326. Sixth, a bottom electrode mask on a bottom of the silicon substrate is appropriately deposited and patterned on the silicon substrate during stage S332. Finally, material for the bottom electrode is deposited on the silicon substrate and the mask removed during stage S334.

An oxide-electrode-gap path proceeds through stages S316–S312–S314–S322–S324–S326–S332–S334. First, oxide material is deposited on the STO layer during stage S316. Second, a waveguide mask is deposited and patterned on the oxide material during stage S312. Third, the oxide waveguides are etched and the mask is removed during stage S314. Fourth, electro-optical material is coated on the wafer during stage S322. Fifth, a top electrode mask to sit above the gaps is deposited and patterned on the coated electro-optical material during stage S324. Sixth, material for the top electrode is deposited on the electro-optical material and the mask removed during stage S326. Seventh, a bottom electrode mask on a bottom of the silicon substrate is appropriately deposited and patterned on the silicon substrate during stage S332. Finally, material for the bottom electrode is deposited on the silicon substrate and the mask removed during stage S334.

Figure 29:
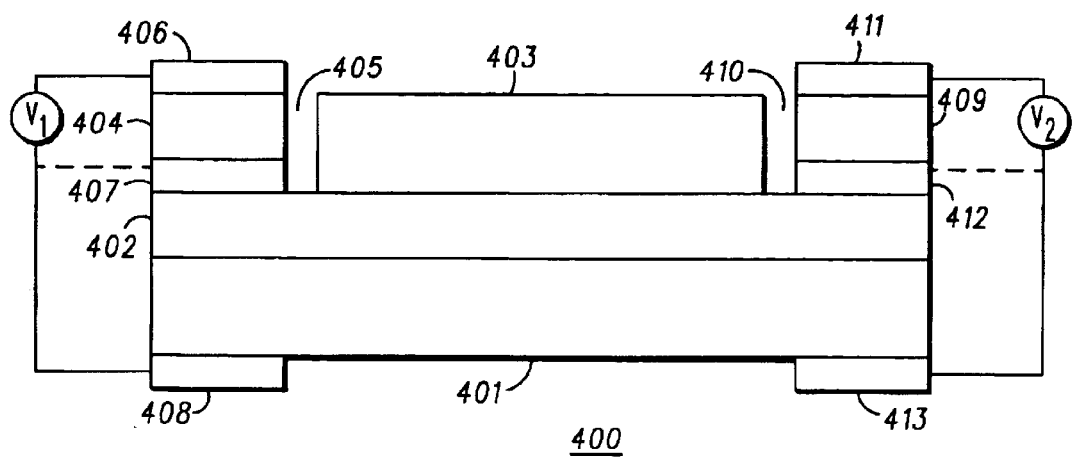
FIGS. 29 and 30 illustrate a first embodiment of a microresonator device in accordance with the present invention.
Figure 30:
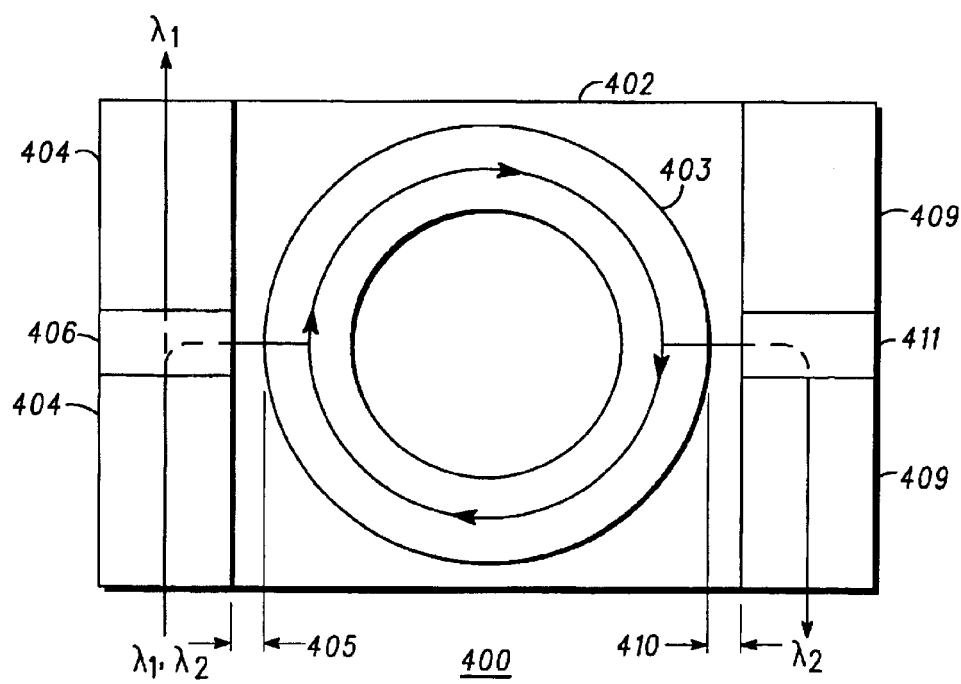

FIGS. 29 and 30 illustrate a microresonator device 400 fabricated in accordance with the electro-optical path of the fabrication method described in FIGS. 27–28. Specifically, a ring resonator 403 formed from III–V material overlays a STO layer 402, which overlays a Si substrate 401. An electro-optical waveguide 404 overlays STO layer 402 and is separated from resonator 403 by a gap 405. An electro-optical output waveguide 409 overlays STO layer 402 and is separated from resonator 403 by a gap 410. A top electrode 406 is formed on waveguide 404, and a top electrode 411 is formed on waveguide 409. A pair of bottom electrodes 408 and 413 are formed on the bottom of substrate 401.

Any light entering into waveguide 404 will propagate out of waveguide 404 or propagate out of waveguide 409 based upon an absence or a presence of a lateral optical coupling of waveguide 404 and resonator 403 across gap 405 and a lateral optical coupling of waveguide 409 and resonator 403 across gap 410. These lateral optical couplings do not exist when the light has a wavelength that does not operatively equal a resonating wavelength of resonator 403. In such a case, substantially all light entering waveguide 404 will propagate through waveguide 404 as shown by an exemplary wavelength $\lambda_1$ illustrated in FIG. 30. These lateral optical couplings do exist when the light has a wavelength that does operatively equal a resonating wavelength of resonator 403. In such a case, light entering waveguide 404 is coupled into resonator 403 and then coupled into waveguide 409 whereby the light will propagate out of waveguide 409 as shown by an exemplary wavelength $\lambda_2$ illustrated in FIG. 30.

For a given wavelength of light entering waveguide 404, the establishment of lateral optical coupling is dependent upon various factors. One factor is a geometry of waveguides 404 and 409. A second factor is a geometry of microresonator 403. A third factor is a refractive index of the material from which the resonator 403 and the waveguides 404 and 409 are formed. A fourth factor is the refractive index of any material in gap 405 and/or gap 410. A fifth factor is the dimensions of gaps 405 and 410.

In an alternative embodiment of microresonator device 400, vertical optical couplings can be achieved when the waveguides 404 and 409 are located below or above an edge portion of microresonator 403 and an appropriate coupling gap has been formed between the waveguide 404 and 409 and the resonator 403 by the addition of a layer of material.

Lateral optical coupling within the microresonator device 400 is sensitive to fabrication conditions. Thus, a control of the lateral optical couplings provided by the electro-optic material of waveguides 404 and 409 can be used to offset any fabrication error.

One method to control the lateral optical couplings is to apply a voltage $V_1$ to waveguide 404 via electrodes 406 and 408, and to concurrently or alternatively apply a voltage $V_2$ to waveguide 409 via electrodes 411 and 413. The application of voltages $V_1$ and $V_2$ to the waveguides 404 and 409, respectively, will change their refractive indices whereby the lateral coupling of each waveguide 404 and 409 to microresonator 403 can be selectively controlled. By proper choice of voltage $V_1$ and appropriate design of the resonator dimensions for a desired resonating wavelength, a lateral optical coupling from waveguide 404 to resonator 403 can be allowed or prevented. In addition, by proper choice of the voltage $V_2$, a lateral optical coupling from resonator 403 to waveguide 409 can be allowed or prevented. In this embodiment, substrates 401 and STO 402 and waveguides 404, 409 must be partially or fully conductive.

In an alternative embodiment of microresonator device 400, electrodes 408 and 413 are eliminated and replaced by electrodes 407 and 412, respectively. To control the lateral optical coupling of waveguide 404 to resonator 403, voltage $V_1$ is applied to waveguide 404 via electrodes 406 and 407. Likewise, to control the lateral optical coupling of resonator 403 to waveguide 409, voltage $V_2$ is applied to waveguide 409 via electrodes 411 and 412.

The similar control methods can also be applied to control vertical optical couplings as would occur to those skilled in the art of the present invention.

Figure 31:
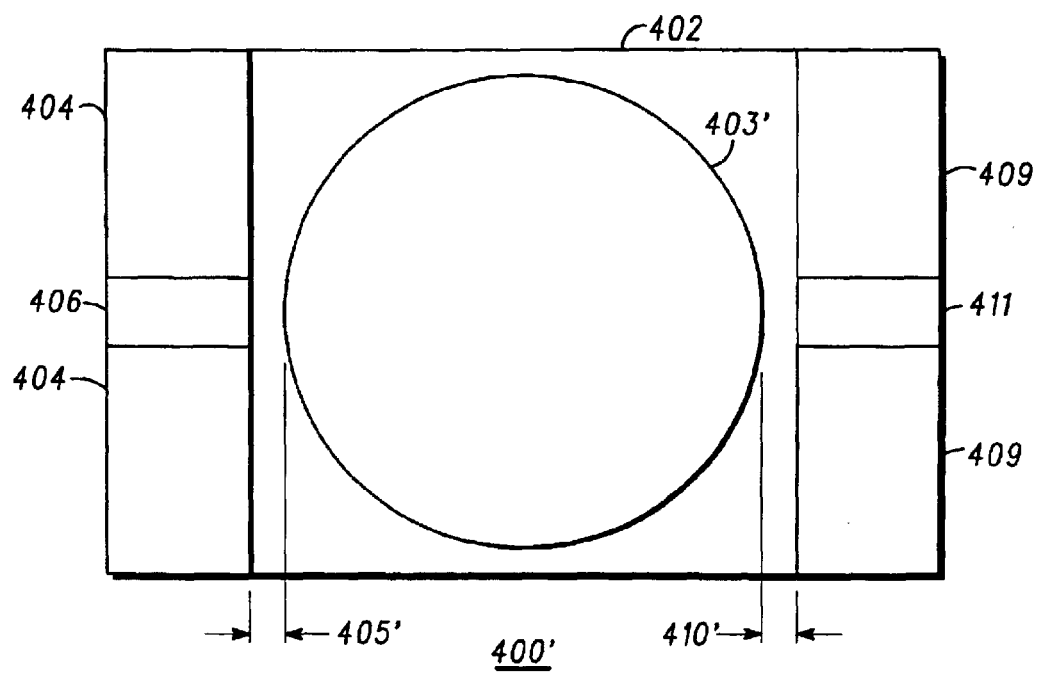
FIG. 31 illustrates a second embodiment of a microresonator device in accordance with the present invention.
Figure 32:
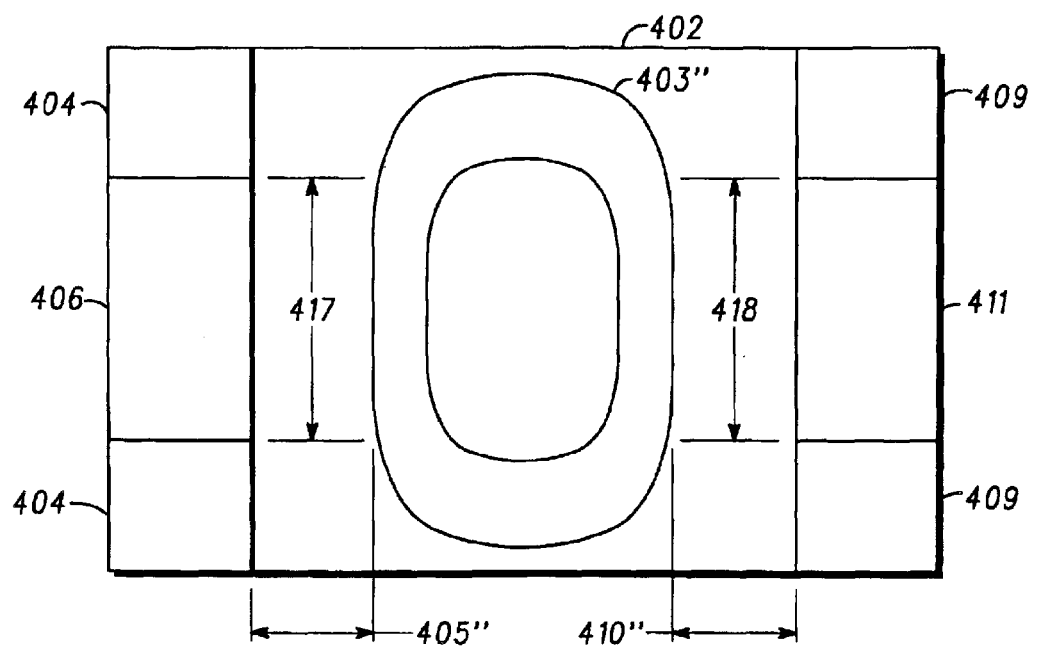
FIG. 32 illustrates a third embodiment of a microresonator device in accordance with the present invention.

In modified versions of microresonator 400, ring resonator 403 can be formed into a variety of other shapes. A first shape example is a disc resonator 403' employed within modified version 400' of microresonator device 400 as illustrated in FIG. 31. A second shape example is a race track resonator 403" employed within a modified version 400" of microresonator device 400 as illustrated in FIG. 32 where any lateral optical coupling of waveguide 404 and resonator 403" occurs along a length 417 of resonator 403". Similarly, any lateral optical coupling of resonator 403" and waveguide 409 occurs along a length 418 of resonator 403". Those having ordinary skill in the art will appreciate other alternative shapes for resonator 403, such as, for example, a double concentric ring.

Figure 33:
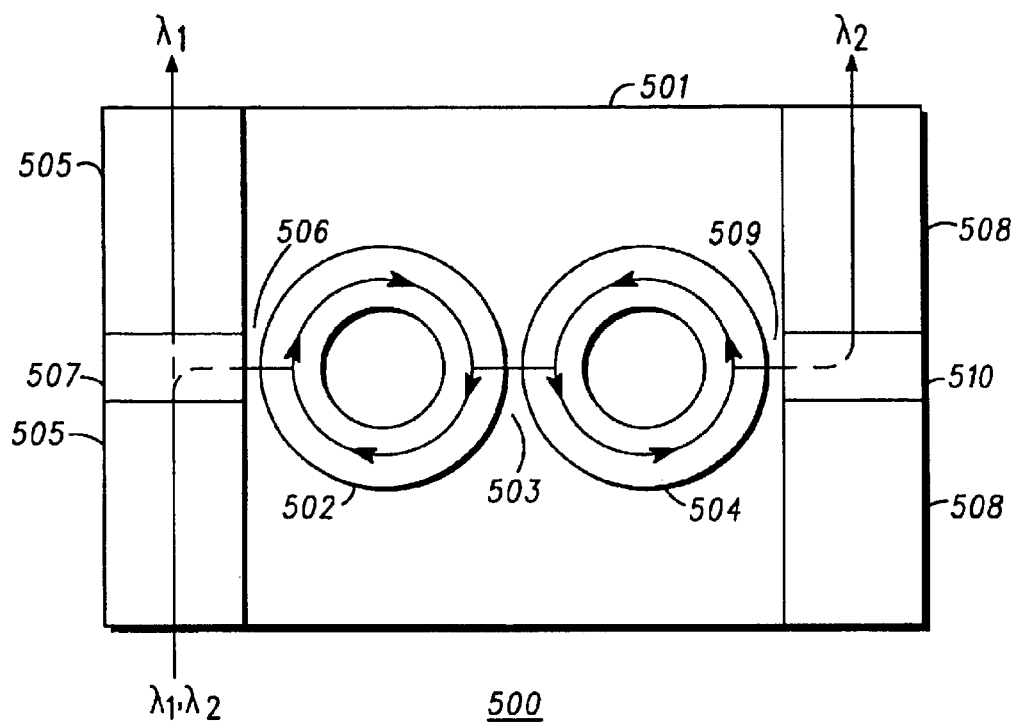
FIG. 33 illustrates a fourth embodiment of a microresonator device in accordance with the present invention.

A plurality of resonators can also be formed on a STO layer in a variety of configurations. One configuration example is two or more resonators in series, such as for example, a microresonator device 500 having a pair of ring resonators 502 and 504 formed in series on a STO layer 501 with a gap 503 therebetween as illustrated in FIG. 33. Microresonator device 500 is fabricated in accordance with the electro-optical path of the fabrication method described in FIGS. 27–28. Specifically, STO layer 501 overlays a Si substrate (not shown). An electro-optical waveguide 505 overlays STO layer 501 and is separated from resonator 502 by a gap 506. An electro-optical output waveguide 508 overlays STO layer 501 and is separated from resonator 504 by a gap 509. A top electrode 507 is formed on waveguide 505, and a top electrode 510 is formed on waveguide 508. A pair of bottom electrodes (not shown) are formed on the bottom of the substrate.

Lateral optical couplings among waveguides 505 and 508 and resonators 502 and 504 essentially do not exist when light entering waveguide 505 has a wavelength that does not operatively equal a resonating wavelength of both resonators 502 and 504. In such a case, essentially all light entering waveguide 505 will propagate through waveguide 505 as shown by an exemplary wavelength $\lambda_1$ illustrated in FIG. 33. These lateral optical couplings do exist when the light entering waveguide 505 has a wavelength that does operatively equal a resonating wavelength of resonators 502 and 504. In such a case, any light entering waveguide 505 is coupled into both resonators 502 and 504 and then coupled into waveguide 508 whereby the light will propagate out of waveguide 508 as exemplary shown a by wavelength $\lambda_2$ illustrated in FIG. 33.

Figure 34:
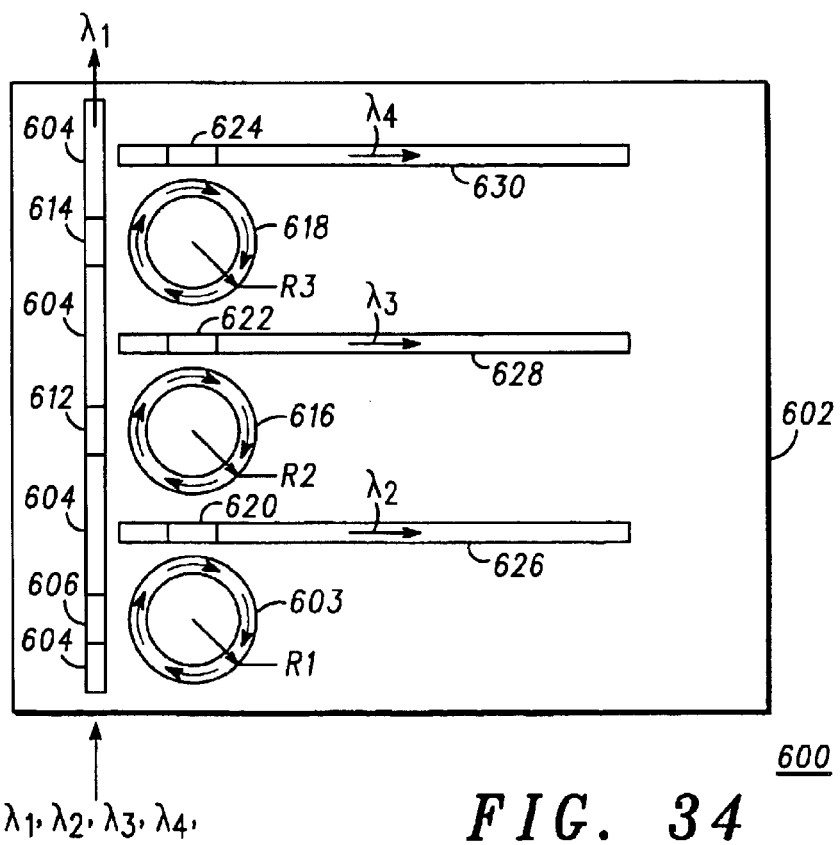
FIG. 34 illustrates a fourth embodiment of a microresonator device in accordance with the present invention.

Another configuration example is two or more resonators in parallel, such as, for example a microresonator device 600 having a parallel configuration of a resonator 603, a resonator 616, and a resonator 618 formed on a STO layer 602 as illustrated in FIG. 34.

Microresonator device 600 is fabricated in accordance with the electro-optical path of the fabrication method described in FIGS. 27–28. Specifically, STO layer 602 overlays a Si substrate (not shown). An electro-optical waveguide 604 overlays STO layer 602 with three (3) top electrodes 606, 612 and 614 formed thereon. Three (3) electro-optical waveguides 626, 628 and 630 also overlay STO layer 602 with top electrodes 620, 622, and 624 formed thereon, respectively. Resonator 603 is separated from waveguides 604 and 626 by respective gaps in the region of electrodes 606 and 620. Resonator 616 is separated from waveguides 612, 626 and 628 by respective gaps in the region of electrodes 606, 620 and 622. Resonator 618 is separated from waveguides 604, 628 and 630 by respective gaps in the region of electrodes 614, 622 and 624.

A radius R1 of resonator 602, a radius R2 of resonator 616 and a radius R3 of resonator 618 are unequal whereby resonators 602, 616 and 618 each have different resonating wavelengths. As a result, essentially no lateral optical couplings exist when light entering waveguide 604 has a wavelength that does not operatively equal a resonating wavelength of any of the resonators 603, 616 and 618. In such a case, essentially all light entering waveguide 606 will propagate through waveguide 606 as shown by an exemplary wavelength $\lambda_1$ illustrated in FIG. 34.

Lateral optical couplings do exist between waveguide 604, resonator 603, and waveguide 626 when the light entering waveguide 604 has a wavelength that operatively equals a resonating wavelength of resonator 603. In such a case, essentially all light entering waveguide 604 is coupled into resonator 603 and then coupled into waveguide 626 whereby the light will propagate out of waveguide 626 as exemplary shown a by wavelength $\lambda_2$ illustrated in FIG. 34.

Lateral optical couplings do exist between waveguide 604, resonator 616, and waveguide 628 when the light entering waveguide 604 has a wavelength that operatively equals a resonating wavelength of resonator 616. In such a case, essentially all light entering waveguide 604 is coupled into resonator 616 and then coupled into waveguide 628 whereby the light will propagate out of waveguide 628 as exemplary shown a by wavelength $\lambda_3$ illustrated in FIG. 34.

Lateral optical couplings do exist between waveguide 604, resonator 618, and waveguide 630 when the light entering waveguide 604 has a wavelength that operatively equals a resonating wavelength of resonator 618. In such a case, essentially all light entering waveguide 604 is coupled into resonator 618 and then coupled into waveguide 630 whereby the light will propagate out of waveguide 630 as exemplary shown a by wavelength $\lambda_4$ illustrated in FIG. 34.

A third configuration example is a microresonator device that includes least one series configuration (e.g., resonators 502 and 504 illustrated in FIG. 33) and at least one parallel configuration (e.g., resonators 603 and 616 illustrated in FIG. 34).

Figure 35:
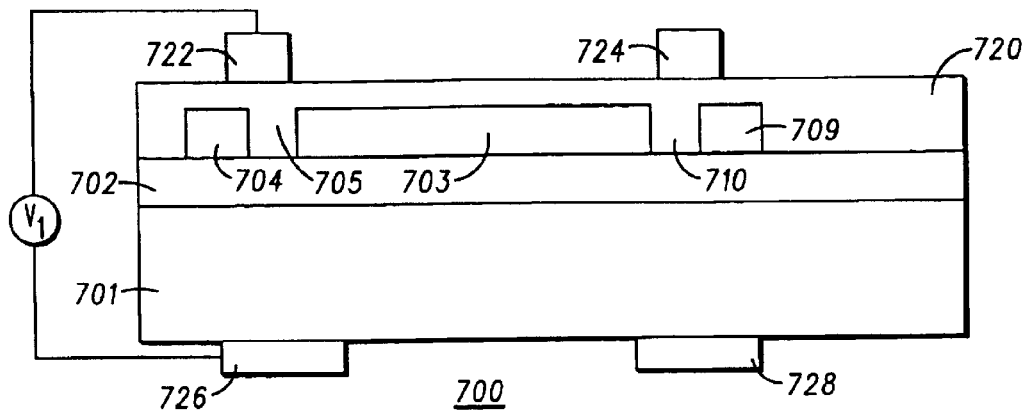
FIG. 35 illustrates a fifth embodiment of a microresonator device in accordance with the present invention.

FIG. 35 illustrates a microresonator device 700 fabricated in accordance with the oxide-electrode-gap path of the fabrication method described in FIGS. 27–28. Specifically, a ring resonator 703 formed from III–V material overlays a STO layer 702, which overlays a Si substrate 701. An electro-optical waveguide 704 overlays STO layer 702 and is separated from resonator 703 by a gap 705. An electro-optical output waveguide 709 overlays STO layer 702 and is separated from resonator 703 by a gap 710. An electro-optical layer 720 overlays STO layer 702 and fills gaps 705 and 710. A top electrode 722 is formed on layer 720 over gap 705, and a top electrode 724 is formed on layer 720 over gap 710. A pair of bottom electrodes 726 and 728 are formed on the bottom of substrate 701. A lateral optical coupling of waveguide 704 and resonator 703 is controlled by an application of voltage $V_1$ between electrodes 722 and 726, and a lateral optical coupling of resonator 703 and waveguide 709 is controlled by an application of voltage $V_2$ between electrodes 724 and 728 (not shown).

Figure 36:
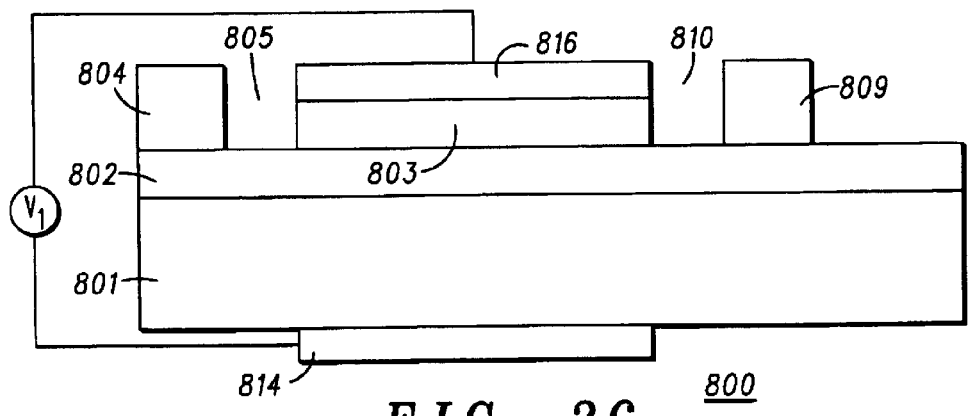
FIG. 36 illustrates a sixth embodiment of a microresonator device in accordance with the present invention.

FIG. 36 illustrates a microresonator device 800 fabricated in accordance with the oxide-electrode-resonator path of the fabrication method described in FIGS. 27–28. Specifically, a ring resonator 803 formed from III–V material overlays a STO layer 802, which overlays a Si substrate 801. A waveguide 804 overlays STO layer 802 and is separated from resonator 803 by a gap 805. An output waveguide 809 overlays STO layer 802 and is separated from resonator 803 by a gap 810. Waveguides 804 and 809 may or may not be electro-optical. A top electrode 816 is formed on resonator 803, and a bottom electrode 814 is formed on the bottom of substrate 801. An injection of current into resonator 803 to thereby produce an outset of gain within resonator 803 is controlled by an application of voltage $V_1$ between electrodes 814 and 816.

Microresonator devices such as the ones illustrated in FIGS. 29–36 can be implemented in various operational environments. One implementation is as a demultiplexor, such as, for example, microresonator device 600 illustrated in FIG. 34.

Figure 37:
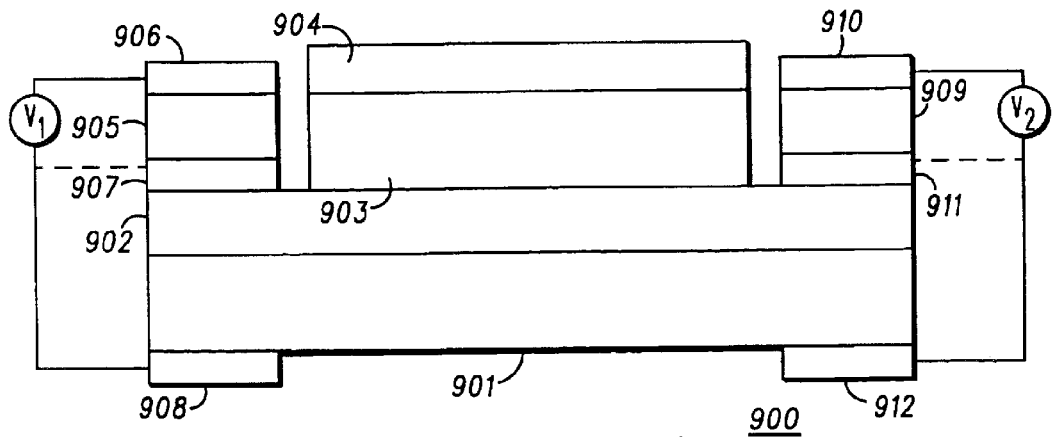
FIGS. 37 and 38 illustrate one embodiment of a pathogen detector in accordance with the present invention.
Figure 38:
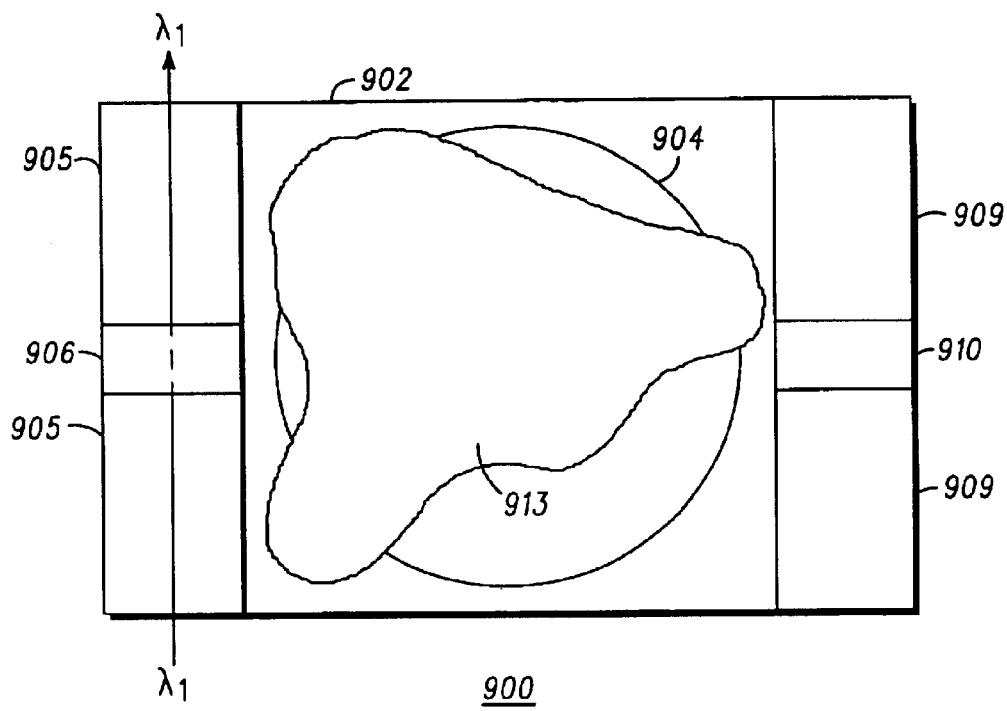

A second implementation is as a pathogen detector, such as, for example, microresonator device 900 illustrated in FIGS. 37 and 38. Microresonator device 900 is fabricated in accordance with the electro-optical path of the fabrication method described in FIGS. 27–28. Specifically, a disc resonator 903 formed from III–V material overlays a STO layer 902, which overlays a Si substrate 901. An electro-optical waveguide 905 overlays STO layer 902 and is separated from resonator 903 by a gap. An electro-optical output waveguide 909 overlays STO layer 902 and is separated from resonator 903 by a gap. A top electrode 906 is formed on waveguide 905, and a top electrode 910 is formed on waveguide 909. A pair of bottom electrodes 908 and 912 are formed on the bottom of substrate 901.

Additionally, a pathogen attractor 904 is formed on resonator 903. The pathogen attractor 904 is attractive to pathogens located in the area of microresonator device 900. In operation, a continuous beam of wavelength $\lambda_1$ enters into waveguide 905. In the absence of a pathogen 913, resonator 903 is designed to laterally optically couple with waveguides 905 and 909 whereby the continuous beam of wavelength $\lambda_1$ propagates out of waveguide 909 (not shown). In the presence of a pathogen 913, resonator 903 is designed to prevent a lateral optical coupling with waveguides 905 and 909 whereby the continuous beam of wavelength $\lambda_1$ propagates out of waveguide 905 as illustrated by example in FIG. 38. Specifically, the resonance of resonator 903 is destroyed when the pathogen 913 attaches to pathogen attractor 904 whereby the beam of wavelength $\lambda_1$ continues to propagate in waveguide 905 without transfer to waveguide 909.

The source of the beam of wavelength $\lambda_1$ may be a laser fabricated on the wafer and coupled into waveguide 905. An integrated detector fabricated at the output of waveguide 909 will detect a signal of wavelength $\lambda_1$ until such time a pathogen 913 attaches to pathogen attractor 914. Further integrating this device with RF electronics (not shown) integrated on the Si substrate 901 provides a method to communicate the presence of a detected pathogen to a monitor of device 900 whereby appropriate action can be initiated by proper authorities.

Figure 39:
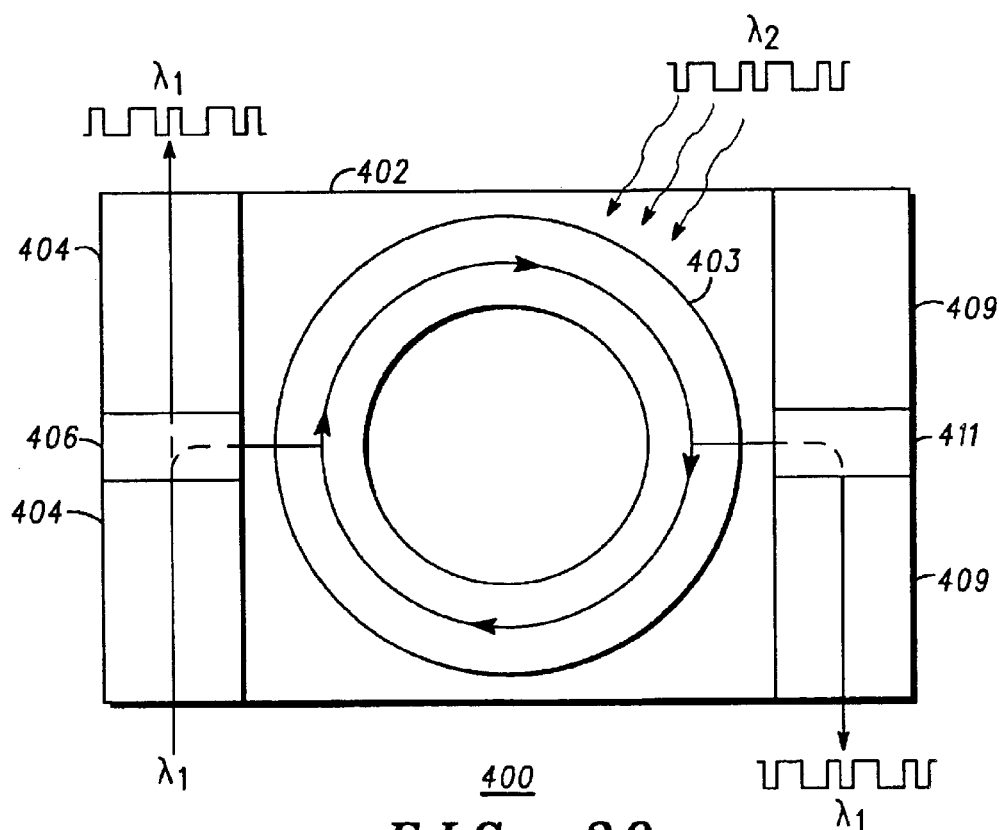
FIG. 39 illustrates an exemplary operation of the FIGS. 29 and 30 microresonator device as an inverter in accordance with the present invention.

A third implementation is as an inverter, such as, for example, microresonator device 400 illustrated in FIG. 39. In this implementation, resonator 403 is designed to couple a light of wavelength $\lambda_1$ from waveguide 404 to waveguide 409 only when light beam of wavelength $\lambda_2$ is incident upon the resonator 403. The source of the light beam of wavelength $\lambda_1$ may be a laser fabricated on the wafer and coupled into waveguide 404, and light of wavelength $\lambda_2$ from an optical data source, such as, for example, an optical fiber in a data transmission system, impinges upon resonator 403. The optical data sources light consists of an optional datastream of bits, each bit being in a zero state or the one state. A bit in the one state carries photons of wavelength $\lambda_2$, and a bit in the zero state carries no photons. For the time when the optical data stream carries a one bit, all of the light from the continuous light beam of wavelength $\lambda_1$ is coupled through the resonator 403 into waveguide 409. For the time the optical data stream carries a zero bit, the continuous light beam of $\lambda_1$ continues to propagate through waveguide 404. FIG. 39 illustrates that optical data stream is impressed onto the light beam of wavelength $\lambda_1$ at the output of waveguide 409, and an inversion of the optical data stream is impressed onto the light beam of wavelength $\lambda_1$ at the output of waveguide 404.

Figure 40:
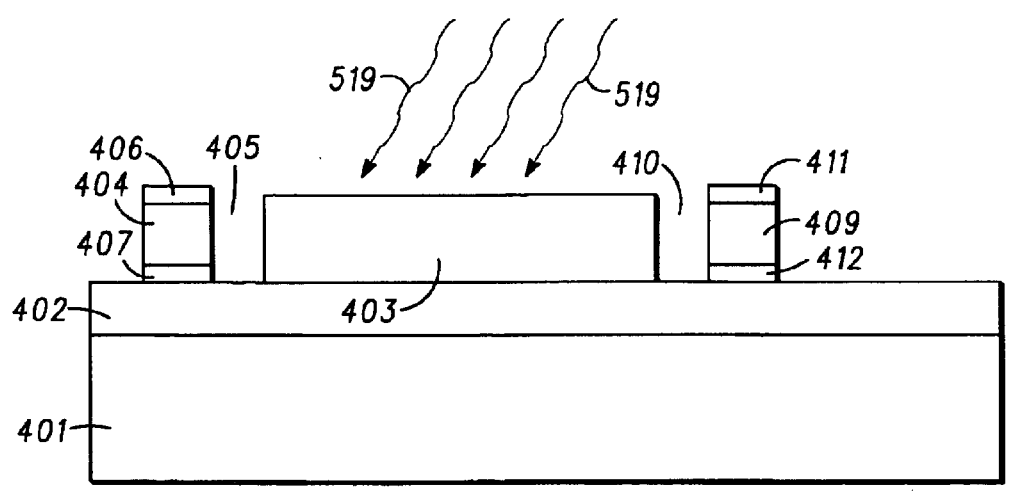
FIG. 40 illustrates an exemplary operation of the FIGS. 29 and 30 microresonator device as an optical amplifier in accordance with the present invention.

A fourth implementation is an optical amplifier, such as, for example, microresonator device 400 illustrated in FIG. 40. In this implementation, a light 519 of appropriate wavelength and sufficient intensity is incident upon the resonator 403 whereby the gain in the resonator 403 exceeds the loss in the resonator 403. As a result, any light propagating into waveguide 404 will be amplified prior to propagating out of both waveguide 404 and 409.

Figure 41:
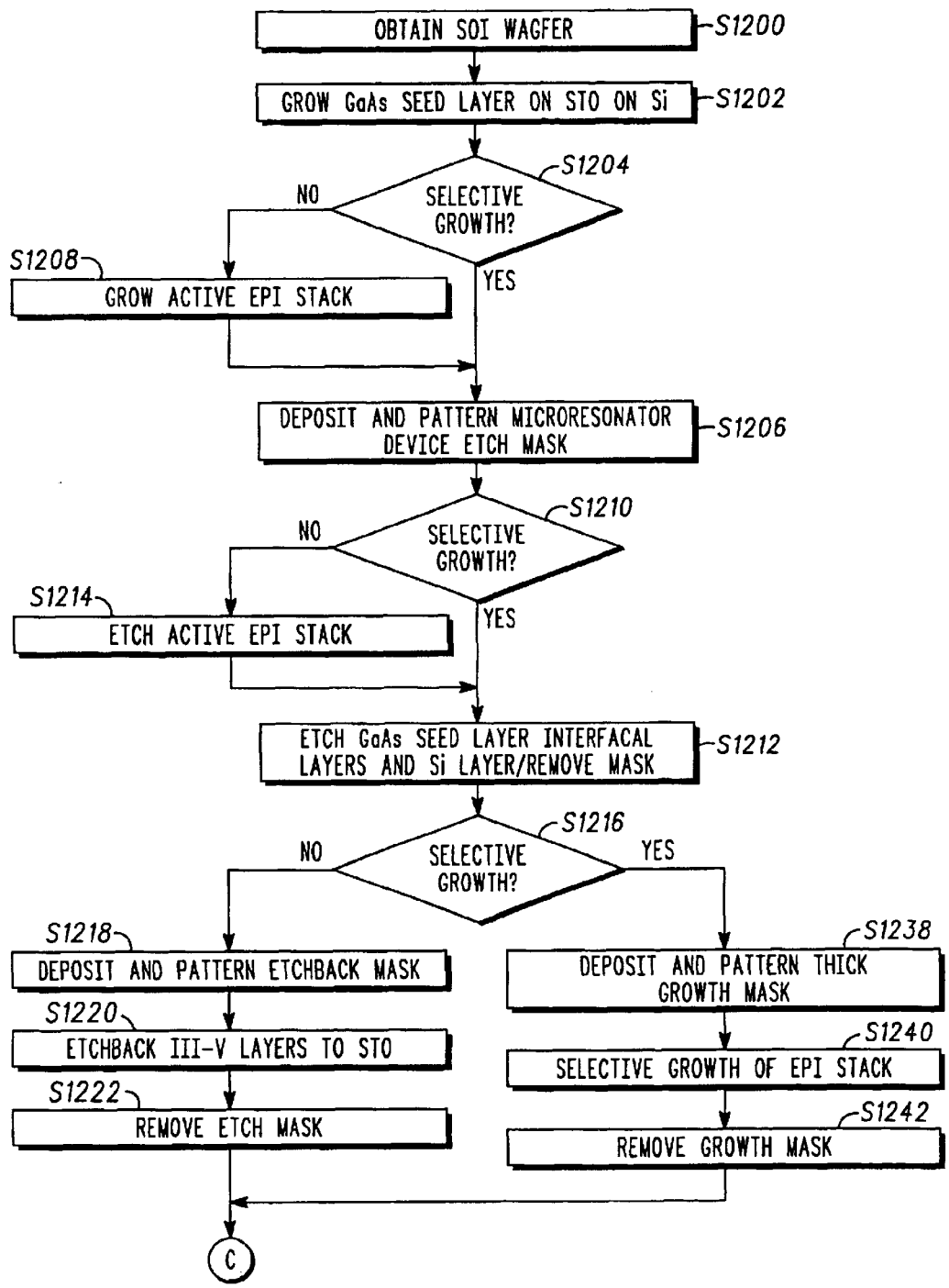
FIGS. 41 and 42 illustrate a flow chart representative of one embodiment of a microresonator device fabrication method in accordance with the present invention.
Figure 42:
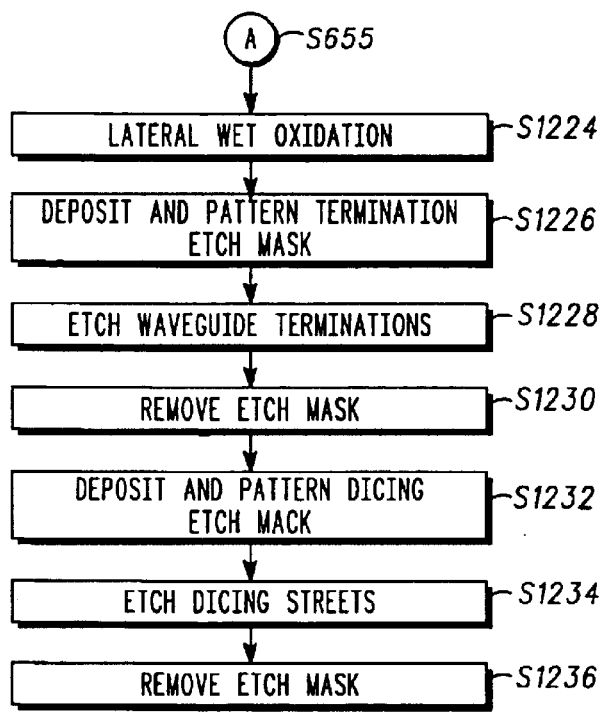

FIGS. 41 and 42 illustrate a flowchart representative of a microresonator device fabrication method having one path for fabrication of a blanket III–V resonator growth and another path for the fabrication of a selective III–V resonator growth. First, SOI in accordance with the previous descriptions herein is obtained during a stage S1200. Second, a GaAs seed layer is grown on a STO layer, which is grown on the SOI wafer during a stage S1202.

Stages S1204, S1210 and S1216 represent decision stages as to whether a blanket III–V resonator growth or a selective III–V resonator growth will be fabricated The blanket III–V resonator growth path proceeds through stages S1208–S1206–S1214–S1212–S1218–S1220–S1222–S1224–S1226–S1228–S1230–S1232–S1234–S1236. First, an active epi stack is deposited in a blank deposition during stage S1208. Second, a microresonator mask is deposited and patterned during stage S1206. Third, the active epi stack is etched during stage S1214. Fourth, the GaAs seed, the interfacial layers and the top Si layer are etched except in the area of the microresonator device, and the mask is removed during stage S1212. Fifth, an etchback mask is deposited and patterned during stage S1218. Sixth, III–V layers are etchbacked to the STO layer during stage S1220. Seventh, the etch mask is removed during stage S1222.

Eighth, a lateral wet oxidation is performed during stage S1224. Ninth, a termination etch mask is deposited and patterned during stage S1226. Tenth, waveguide terminations are etched during stage S1228. Eleventh, the etch mask is removed during stage S1230. Twelfth, a dicing etch mask is deposited and patterned during stage S1232. Thirteenth, the dicing streets are etched during stage S1234. Finally, the etch mask is removed during stage S1236.

The selective III–V resonator growth path proceeds through stages S1206–S1212–S1238–S1240–S1242–S1224–S1226–S1228–S1230–S1232–S1234–S1236. First, stages S1206–S1212 are performed as previously described herein. Second, a thick growth mask is deposited and patterned during stage S1238. Third, selective growth of the epi stack is performed during stage S1240. Fourth, the growth mask is removed during stage S1242. Finally, stages S1224–S1226–S1228–S1230–S1232–S1234–S1236 are performed as previously described herein.

Figure 43:
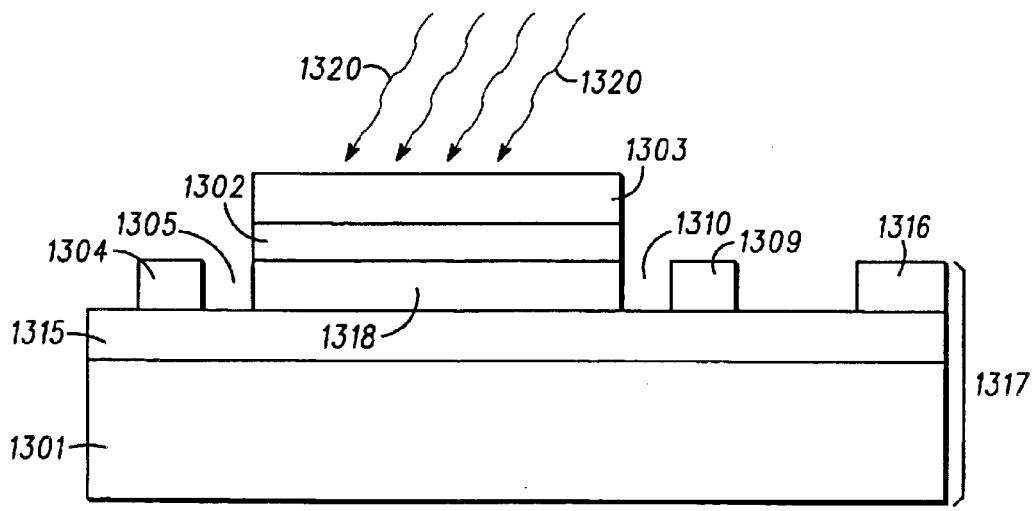
FIG. 43 illustrates a seventh embodiment of a microresonator device in accordance with the present invention.

FIG. 43 illustrates a microresonator device 1300 fabricated in accordance with the fabrication method described in FIGS. 41 and 42, wherein the gain is controlled by optical pumping. Specifically, microresonator device 1300 has a STO layer 1302 deposited upon a wafer of Silicon-on-Insulator 1317, herein after referred to as SOI 1317. SOI 1317 has a layer 1315 of silicon dioxide ($SiO_2$) on top of a Si substrate 1301 and beneath a Si layer 1316, where generally, layers 1315 and 1316 are much thinner than layer 1301. Layers 1315 and 1316, typically, each have a thickness on the order of micrometers or tenths of micrometers. Top Si layer 1316 is etched to form a waveguide 1304, a waveguide 1309, and a base Si layer 1318. A group III–V microresonator 1303 is formed upon the STO layer 1302, which is formed upon the Si base layer 1318 using methods described previously. Light of an appropriate wavelength propagates within waveguide 1304 and couples into layer 1318. As the light resonates within layer 1318, the light will couple up into the III–V layer 1303 and back down into layer 1318 according to the theory of operation of the dual-channel directional coupler. Given a properly designed structure, some of the resonating light will couple from layer 1318 into waveguide 1309. For microresonator device 1300, layer 1303 is optically pumped by a light beam 1320 since the $SiO_2$ layer 1315 is too insulating to conduct current to an electrode on the bottom of the Si substrate 1301.

There is an advantage in forming the resonator 1303 from III–V material. The III–V layer 1303 provides a resonator structure with controllable gain. This feature can be used to modulate the imaginary part of the complex refractive index within the resonator 1303, forming a fourth method to control the optical coupling characteristics of the microresonator device 1300. This type of control is termed "active" (as opposed to passive) since energy is being added to the system. In addition to compensating for losses in the microresonator 1303, the presence of gain also increases the Q of the microresonator 1303. When the Q is low there will be essentially no coupling of light between the waveguides 1304 and 1309 and the resonator stack (layers 1318–1302–1303). FIG. 43 illustrates a microresonator device 1300.

Figure 44:
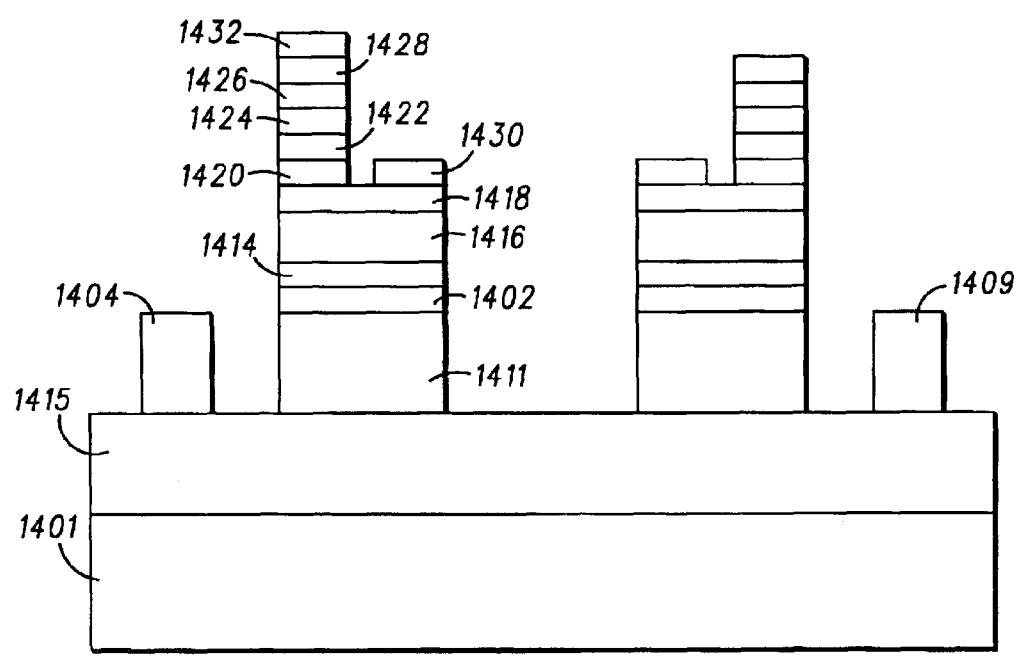
FIG. 44 illustrates an eight embodiment of a microresonator device in accordance with the present invention.

FIG. 44 illustrates a microresonator device 1400 fabricated in accordance with the fabrication method described in FIGS. 41 and 42 where the gain is controlled by electrical pumping. Specifically, microresonator device 1400 employs a waveguide 1404, a ring microresonator having layers 1411–1428, and a waveguide 1409 overlying a silicon substrate 1401 and a layer 1415 of silicon dioxide ($SiO_2$). A STO layer 1402 is formed upon a Si layer 1411 and a GaAs seed layer 1414 is deposited upon STO layer 1402 according to the prior description. An oxidized AlAs layer 1416 is formed upon layer 1414. An n-ohmic contact layer 1418 is formed upon the oxidized AlAs layer 1416. A lower confinement layer 1420 is formed upon the n-ohmic contact layer 1418, followed by an InGaAsN quantum well active layer 1422. An upper confinement layer 1424 is formed upon layer 1422 and is covered by a cap layer 1426. A p-ohmic contact layer 1428 is formed overlying the cap layer 1426. After etching away the layers 1420–1428 from the inner edge of the ring structure, the n-ohmic contact layer 1418 is now partially exposed. Upon the now exposed n-ohmic contact layer 1418, a bottom electrode 1430 is formed upon the inner edge of the ring, to act as the bottom electrode for the InGaAsN quantum well active gain layer 1422. The top electrode 1432 is formed on the outer edge of the ring on top of p-ohmic contact layer 1428. In this fashion, the top and bottom electrodes are laterally offset and are both accessible from the top of the device structure, providing a way to inject current into the III–V layer stack (1418, 1420, 1422, 1424, 1426, 1428). The insulating $SiO_2$ layer 1415 prevents use of an electrode on the bottom of the Si layer 1401. The input and output waveguides 1404 and 1409 are formed from the top layer of the Si in the SOI, as is the Si structure 1411.

The oxidized AlAs layer 1416 is optional, but may be used to tailor the strength of the coupling between the active III–V sections (1418–1428) and the passive Si sections (1411–1414) of the ring resonator. The oxidized AlAs layer 1416 is initially grown as AlAs (or, alternatively, high Al mole fraction AlGaAs), and then laterally oxidized inward from the edges of the mesa after the ring resonator ridge has been defined by etching. The oxidation process significantly changes the refractive index of this material from a relatively high value of about 3 to a relatively low value of around 1.5. The resulting low value allows this layer to effectively be used as an optical spacer layer allowing control of the optical coupling via the layer thickness. This technique of lateral oxidation of high Al mole fraction AlGaAs layers is well known to those of ordinary skill in the art.

Similar to the microresonator devices illustrated in FIGS. 29–40, microresonator devices fabricated in accordance with the flow chart illustrated in FIGS. 41 and 42 (e.g, the microresonator devices illustrated in FIGS. 43 and 44) can include one or more resonators in various shapes, multiple resonators in series and/or parallel, and being implemented in various applications (e.g., a pathogen detector, an inverter, an optical amplifier, and a demultiplexer)

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A microresonator device, comprising:
    a monocrystalline silicon substrate;
    an amorphous oxide material in contact with the monocrystalline substrate;
    a monocrystalline metal oxide selected from the group consisting of alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, gadolinium oxide and mixtures thereof contacting the amorphous oxide material;
    a first electro-optical waveguide overlying the monocrystalline silicon substrate;
    a second electro-optical waveguide overlying the monocrystalline silicon substrate; and
    a first resonator overlying the monocrystalline silicon substrate, said first resonator separated from said first waveguide by a first gap and separated from said second waveguide by a second gap.

2. The microresonator device of claim 1, further comprising:
    a first electrode and a second electrode operable to facilitate a change in an index of refraction of said first electro-optical waveguide by an application of a voltage across said first electrode and said second electrode.

3. The microresonator device of claim 1, further comprising:
    a first electrode and a second electrode operable to facilitate an injection of current into said first resonator to thereby produce an onset of gain.

4. The microresonator device of claim 1, further comprising:
    a pathogen attractor overlying said first resonator.

5. The microresonator device of claim 1, further comprising:
    a second resonator overlying the monocrystalline silicon substrate, said second resonator separated from said first resonator by a third gap and separated from said second waveguide by a fourth gap.

6. The microresonator device of claim 1, further comprising:
    a third waveguide overlying the monocrystalline silicon substrate; and
    a second resonator overlying the monocrystalline silicon substrate, said second resonator being separated from said first waveguide by a third gap and separated from said third waveguide by a fourth gap.

7. A microresonator device, comprising:
    a monocrystalline silicon substrate;
    an amorphous oxide material in contact with the monocrystalline substrate;
    a monocrystalline metal oxide selected from the group consisting of alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, gadolinium oxide and mixtures thereof contacting the amorphous oxide material;
    a first waveguide overlying the monocrystalline silicon substrate;
    a second waveguide overlying the monocrystalline silicon substrate;
    a first resonator overlying the monocrystalline silicon substrate, said first resonator being separated from said first waveguide by a first gap and separated from said second waveguide by a second gap; and
    an electro-optical layer overlying the monocrystalline silicon substrate, said electro-optical layer filling in the first gap and the second gap.

8. The microresonator device of claim 7, further comprising:
a first electrode and a second electrode operable to facilitate a change in an index of refraction of said first waveguide by an application of a voltage across said first electrode and said second electrode.

9. The microresonator device of claim 8, further comprising:
a second resonator overlying the monocrystalline silicon substrate, said second resonator being separated from said first resonator by a third gap and separated from said second waveguide by a fourth gap,
wherein said electro-optical layer fills said third gap and said fourth gap.

10. The microresonator device of claim 8, further comprising:
a third waveguide overlying the monocrystalline silicon substrate; and
a second resonator overlying the monocrystalline silicon substrate, said second resonator being separated from said first waveguide by a third gap and separated from said third waveguide by a fourth gap,
wherein said electro-optical layer fills said third gap and said fourth gap.

11. A microresonator device, comprising:
a monocrystalline silicon substrate;
an amorphous oxide material in contact with the monocrystalline substrate;
a monocrystalline metal oxide selected from the group consisting of alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, gadolinium oxide and mixtures thereof contacting the amorphous oxide material;
a first waveguide overlying the monocrystalline silicon substrate;
a second waveguide overlying the monocrystalline silicon substrate;
a first resonator overlying the monocrystalline silicon substrate, said resonator being separated from said first waveguide by a first gap and separated from said second waveguide by a second gap; and
a first electrode and a second electrode operable to facilitate an injection of current in said first resonator to thereby produce an onset of gain.

12. The microresonator device of claim 11, wherein said microresonator device further includes:
a second resonator overlying the monocrystalline silicon substrate, said second resonator being separated from said first resonator by a third gap and separated from said second waveguide by a fourth gap.

13. The microresonator device of claim 11, wherein said microresonator device further includes:
a third waveguide overlying the monocrystalline silicon substrate; and
a second resonator overlying the monocrystalline silicon substrate, said second resonator being separated from said first waveguide by a third gap from and separated from said third waveguide by a fourth gap.

14. A microresonator device, comprising:
a silicon-on-insulator substrate;
an amorphous oxide material in contact with a monocrystalline top silicon layer of the silicon-on-insulator substrate;
a monocrystalline metal oxide selected from the group consisting of alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, gadolinium oxide and mixtures thereof contacting the amorphous oxide material;
a first waveguide overlying said silicon-on-insulator substrate;
a second waveguide overlying said silicon-on-insulator substrate; and
a resonator including
a GaAs seed layer overlying the monocrystalline perovskite oxide material,
a compound semiconductor material layer overlying said GaAs seed layer to thereby provide a gain medium for said resonator, and
a top electrode and a bottom electrode operable to facilitate an injection of current into said compound semiconductor material layer to thereby produce an onset of gain.

15. The microresonator device of claim 14, wherein said resonator further includes:
an ohmic contact layer formed within at least a portion of said compound semiconductor material layer to provide a position for said bottom electrode.

16. The microresonator device of claim 14, wherein said resonator further includes:
an ohmic contact layer formed within at least a portion of said compound semiconductor material layer to provide a position for said top electrode.

* * * * *